United States Patent
Ozasa et al.

(10) Patent No.: US 7,671,882 B2
(45) Date of Patent: *Mar. 2, 2010

(54) SEMICONDUCTOR LASER MODULATION DRIVING APPARATUS AND IMAGE FORMING APPARATUS

(75) Inventors: Dan Ozasa, Kanagawa (JP); Masaaki Ishida, Kanagawa (JP); Yasuhiro Nihei, Kanagawa (JP); Atsufumi Omori, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 578 days.

This patent is subject to a terminal disclaimer.

(21) Appl. No.: 11/079,381

(22) Filed: Mar. 15, 2005

(65) Prior Publication Data

US 2005/0213623 A1 Sep. 29, 2005

(30) Foreign Application Priority Data

Mar. 19, 2004 (JP) ............................ 2004-081468

(51) Int. Cl.
*B41J 2/435* (2006.01)
*B41J 2/47* (2006.01)

(52) U.S. Cl. ...................................... 347/237; 347/247

(58) Field of Classification Search ................. 347/118, 347/236–237, 239, 246–247, 251–252, 255; 372/26, 38.02, 29.01, 24, 38.07; 365/189.05; 341/127; 326/16, 115, 127, 30, 86; 327/109; 398/186; 330/107; 358/1.9

See application file for complete search history.

(56) References Cited

U.S. PATENT DOCUMENTS

| | | | | |
|---|---|---|---|---|
| 3,882,484 A * | 5/1975 | Brokaw et al. | ............... | 341/127 |
| 4,301,419 A * | 11/1981 | Calomiris | ................... | 330/107 |
| 5,245,668 A * | 9/1993 | Kirchlechner | ............... | 381/102 |
| 5,373,518 A * | 12/1994 | Uchiyama et al. | ......... | 372/38.02 |
| 5,457,407 A * | 10/1995 | Shu et al. | ....................... | 326/30 |
| 5,671,003 A * | 9/1997 | Herczeg et al. | ............. | 347/251 |
| 5,793,406 A * | 8/1998 | Trask et al. | .................. | 347/252 |
| 5,939,896 A * | 8/1999 | Hedberg | ...................... | 326/30 |
| 6,021,071 A * | 2/2000 | Otsuka | ................... | 365/189.05 |
| 6,021,143 A * | 2/2000 | Ransijn et al. | ............ | 372/38.02 |
| 6,130,562 A * | 10/2000 | Bosch et al. | ................. | 327/109 |
| 6,246,705 B1 * | 6/2001 | Kasai | ........................... | 372/24 |
| 6,486,695 B1 * | 11/2002 | Nakagawara | .................. | 326/14 |
| 6,765,695 B2 * | 7/2004 | Chen et al. | .................... | 358/1.9 |
| 6,876,371 B2 * | 4/2005 | Suzuki et al. | ............... | 347/118 |
| 6,941,080 B2 * | 9/2005 | Kasper et al. | ............... | 398/186 |
| 7,167,491 B2 * | 1/2007 | Kim et al. | ................. | 372/29.01 |

(Continued)

FOREIGN PATENT DOCUMENTS

JP 52100952 A * 8/1977

(Continued)

*Primary Examiner*—Hai C Pham
(74) *Attorney, Agent, or Firm*—Oblon, Spivak, McClelland, Maier & Neustadt, L.L.P.

(57) ABSTRACT

A semiconductor laser modulation signal is generated for modulating a semiconductor laser. The semiconductor laser is driven based on the semiconductor laser modulation signal. An output impedance of a semiconductor laser modulation signal generating unit and an input impedance of a semiconductor laser driving unit are corrected. The semiconductor laser modulation signal is transmitted as a low amplitude differential signal, from the semiconductor laser modulation signal generating unit to the semiconductor laser driving unit.

19 Claims, 54 Drawing Sheets

U.S. PATENT DOCUMENTS

| | | | |
|---|---|---|---|
| 7,496,121 B2 * | 2/2009 | Ishida et al. | 372/38.02 |
| 2003/0169791 A1 * | 9/2003 | Chou | 372/38.02 |
| 2004/0114650 A1 * | 6/2004 | Tanaka et al. | 372/38.02 |
| 2004/0183891 A1 * | 9/2004 | Ishida et al. | 347/239 |
| 2005/0089069 A1 * | 4/2005 | Ozasa et al. | 372/26 |

FOREIGN PATENT DOCUMENTS

| | | |
|---|---|---|
| JP | 3283256 | 3/2002 |
| JP | 2004021577 A * | 1/2004 |

* cited by examiner

PRIOR ART

FIG.50
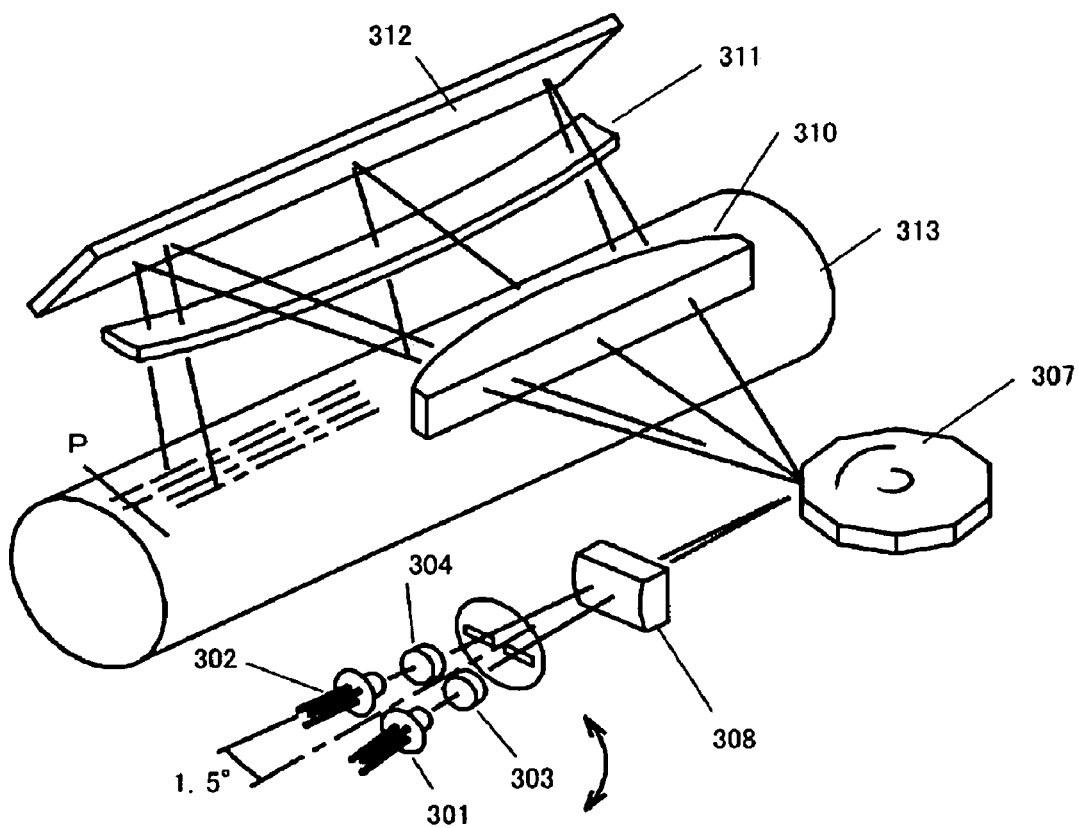
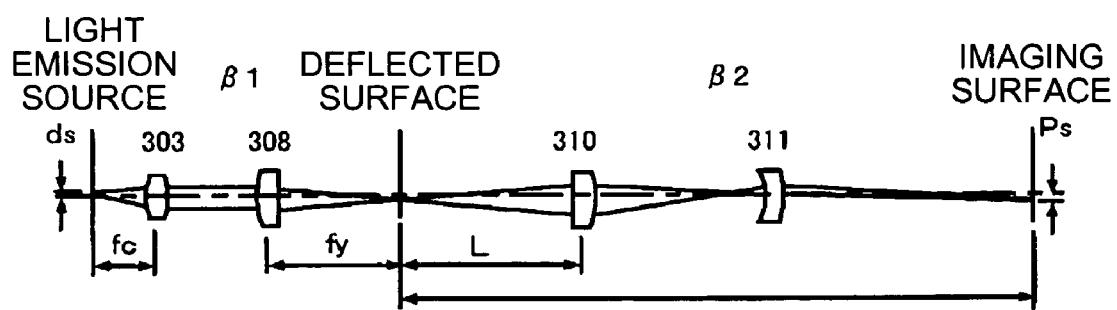

SEMICONDUCTOR LASER MODULATION DRIVING APPARATUS AND IMAGE FORMING APPARATUS

CROSS-REFERENCE TO RELATED APPLICATIONS

The present document incorporates by reference the entire contents of Japanese priority document, 2004-081468 filed in Japan on Mar. 19, 2004.

BACKGROUND OF THE INVENTION

1) Field of the Invention

The present invention relates to a semiconductor laser modulation driving apparatus that drives modulation of an optical output of a semiconductor laser (laser diode (LD)) serving as a light source in an image forming apparatus such as a laser printer, an optical disk apparatus, a digital copying machine, an optical communication apparatus, or the like that forms an image by modulating the optical output of the light source, and an image forming apparatus that includes the semiconductor laser modulation driving apparatus.

2) Description of the Related Art

Some of the well-known methods for modulating an optical output of a semiconductor laser light source are, for example, a power modulating method for modulating a light quantity itself, a pulse width modulating method for modulating a lighting-up time, and a power-pulse width modulating method that is a combination of the power modulating method and the pulse width modulating method. One proposed method of a pulse width modulating method includes generating a chopping wave or a sawtooth wave corresponding to each pulse generation cycle, comparing each wave with an analog video signal using a comparator, and thereby generating a pulse width modulated signal. Another method of a pulse width modulating method includes generating a high frequency clock, generating a delay pulse by digitally dividing the clock, and generating a pulse width modulated signal by an OR operation or an AND operation.

A conventional apparatus for forming an image by thus modulating the optical output of the semiconductor laser light source is shown in FIG. 3. Such conventional apparatus normally includes an image data generation unit 110, an LD modulation signal generation unit 120, and an LD driving unit 170. Based on a gamma characteristic or the like of a photoconductor, the image data generation unit 110 converts data output by a printer, data read by a scanner, or the other data, into image data that can be output by a laser printer or the like. The LD modulation signal generation unit 120 generates an LD modulation signal so that the image data can be subjected to power modulation or pulse width modulation in a semiconductor laser (LD) 190. The LD driving unit 170 drives the LD 190 in response to the LD modulation signal. As shown in FIG. 3, each of the image data generation unit 110, the LD modulation signal generation unit 120, and the LD driving unit 170 is formed on a printed circuit board (PCB), or incorporated into an application specific integrated circuit (ASIC).

If an image signal transfer rate is compared with an LD modulation signal transfer rate, the LD modulation signal transfer rate is faster. This is why it is preferable that in the image forming apparatus, the LD modulation signal generation unit 120 and the LD driving unit 170 are arranged as close as possible. For example, Japanese Patent Application No. 3283256 discloses the image forming apparatus in which, a pulse width modulation circuit, a recording element, and a driving circuit are formed on a singe circuit board. A digital image control circuit is formed on a circuit board different from this single circuit board. In addition, differential digital image signals are transmitted to the pulse width modulation circuit.

However, demand for further accelerating an operating rate of the image forming apparatus is on the rise. To meet this demand, the number of LDs to be driven increases, so that rather than two or four, eight LDs or LD arrays are used to form a monochrome image. Further, because the copying machines or printers are gradually shifting from monochrome to colored ones, a plurality of LD modulation signal generation units and LD driving units are required, accordingly. For example, if image data has eight bits, and an LD modulation signal has one bit per color, and if four colors are driven by two LDs, then the image data has 64 bits, and the LD modulation signal has eight bits in all. In the example of the configuration of the conventional image forming apparatus shown in FIG. 3, it is necessary to transfer 64 signals at a high rate although those signals are not as fast as the LD modulation signal. As a result, the number of data lines increases, a configuration of the transfer unit is greatly complicated, and data is more difficult to be transferred at the high rate. Besides, if differential digital image signals supplied from the image data forming unit such as the digital image control circuit to the LD modulation signal generation unit such as the pulse width modulation circuit are transferred, not only the configuration of the transfer unit but also a configuration of transmission lines are further complicated.

SUMMARY OF THE INVENTION

It is an object of the present invention to at least solve the problems in the conventional technology.

According to an aspect of the present invention, a semiconductor laser modulation driving apparatus includes a semiconductor laser; a semiconductor laser modulation signal generating unit that generates a semiconductor laser modulation signal for modulating the semiconductor laser; a semiconductor laser driving unit that drives the semiconductor laser based on the semiconductor laser modulation signal; and an impedance correction unit that corrects an output impedance of the semiconductor laser modulation signal generating unit and an input impedance of the semiconductor laser driving unit. The semiconductor laser modulation signal generating unit transmits the semiconductor laser modulation signal as a low amplitude differential signal, to the semiconductor laser driving unit.

According to an aspect of the present invention, an image forming apparatus for forming an image on a scan target medium by scanning the scan target medium includes at least one semiconductor laser light source; a deflecting unit that deflects a light flux emitted from the light source; a light guiding unit that guides the light flux deflected, to the scan target medium; and a semiconductor laser modulation driving apparatus. The semiconductor laser modulation driving apparatus includes a semiconductor laser; a semiconductor laser modulation signal generating unit that generates a semiconductor laser modulation signal for modulating the semiconductor laser; a semiconductor laser driving unit that drives the semiconductor laser based on the semiconductor laser modulation signal; and an impedance correction unit that corrects an output impedance of the semiconductor laser modulation signal generating unit and an input impedance of the semiconductor laser driving unit. The semiconductor laser modulation signal generating unit transmits the semiconductor laser modulation signal as a low amplitude differential signal, to the semiconductor laser driving unit.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 50 is an overall block diagram of a multi-beam scanning apparatus, to which a multi-beam scanning images forming apparatus according to the present invention is applied, according to one embodiment of the present invention;

DETAILED DESCRIPTION

Exemplary embodiments of the present invention will be explained in detail below, with reference to the accompanying drawings.

Figure 1:
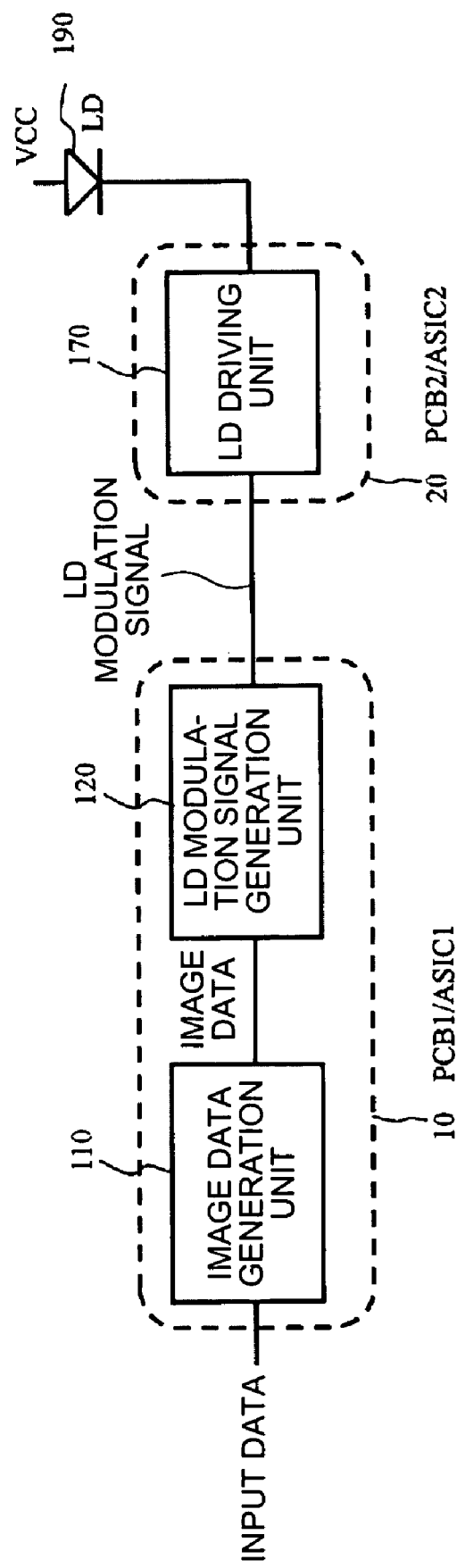
FIG. 1 is a conceptual view of a semiconductor laser modulation driving apparatus according to one embodiment of the present invention.

FIG. 1 is a conceptual view of a semiconductor laser modulation driving apparatus according to an embodiment of the present invention. As shown in FIG. 1, in this embodiment, an image data generation unit 110 and an LD modulation signal generation unit 120 are formed on a single board (PCB1) or incorporated into an ASIC (ASIC1) 10, and an LD driving unit 170 is formed on a different board (PCB2) or incorporated into a different ASIC (ASIC2) 20 and arranged to be proximate to a semiconductor laser (LD) 190.

With the increasing progress in multiple-channel LDs and color LDs, the number of image data signal lines are expected to increase, accordingly. As shown in FIG. 1, the image data generation unit 110 and the LD modulation signal generation unit 120 are formed on the same board, or functions of these units 110 and 120 are incorporated into the same ASIC. It is thereby possible to easily deal with an increase in the number of image data signal lines, and to transmit a plurality of parallel signals at a high rate. Further, by arranging the LD driving unit 170 and the LD 190 or LD array on the same board to be proximate to each other, a higher-rate and stable operation is ensured.

Figure 2:
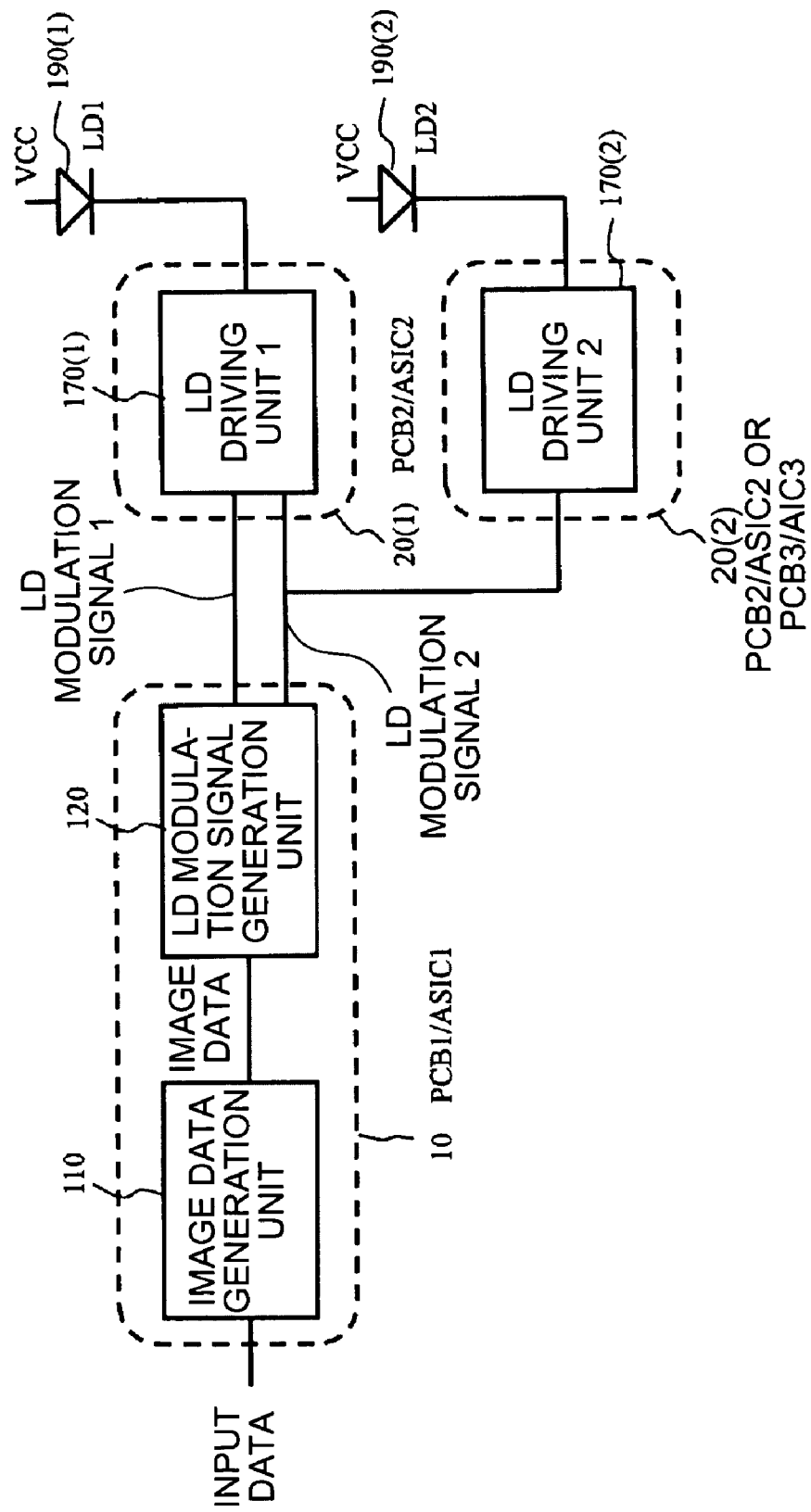
FIG. 2 is an example of a configuration of the semiconductor laser modulation driving apparatus having multiple channels according to the present invention.
Figure 3:
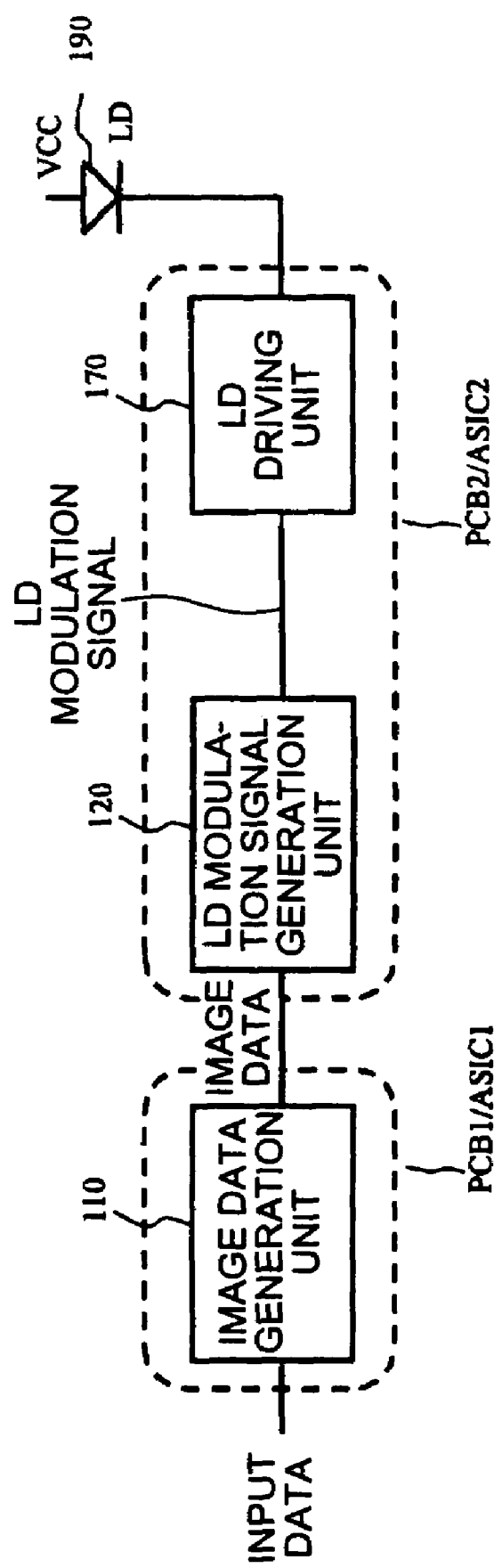
FIG. 3 is an example of a configuration of a conventional semiconductor laser modulation driving apparatus.

FIG. 2 is an example of a configuration of an image forming apparatus having multiple channels. In the example of FIG. 2, an LD driving unit 1 170(1) and an LD driving unit 2 170(2) are arranged to be proximate to an LD1 190(1) and an LD2 190(2), respectively. The LD modulation signal generation unit 120 formed on the same PCB1 or ASIC1 generates modulation signals for LD1 and LD2. In the example of FIG. 2, one LD driving unit is provided per LD. Needless to say, one LD driving unit may be provided for a plurality of LDs. Further, the respective LD driving units may be formed on different ASICs or on the same PCB.

In the future, it is expected that, as the number of LDs 190 increases, the number of LD driving units 170 and that of the LD modulation signal generation unit 120 corresponding to the LD driving unit 170 will increase, and a signal line between each LD modulation signal generation unit 120 and each LD driving unit 170 is made longer, accordingly. It is, therefore, required to transfer an LD modulation signal stably at a high rate. To meet this requirement, in the image forming apparatus according to the present invention, two low amplitude differential LD modulation signals are transmitted between the LD modulation signal generation unit 120 and the LD driving unit 170. As for a power supply, the LD driving unit 170 supplies a power supply voltage necessary to drive the LDs, and the LD modulation signal generation unit 120 can generate a high-rate LD modulation signal. The transmission (transfer) of the LD modulation signal between the LD modulation signal generation unit 120 and the LD driving unit 170 will be explained later in more detail.

Figure 4:
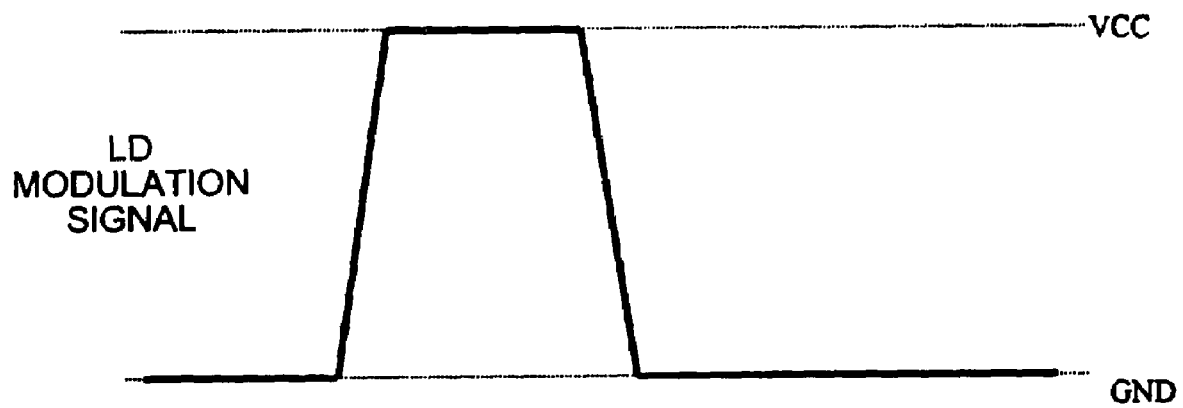
FIG. 4 illustrates a waveform of an LD modulation signal transferred by a conventional technique.
Figure 5:
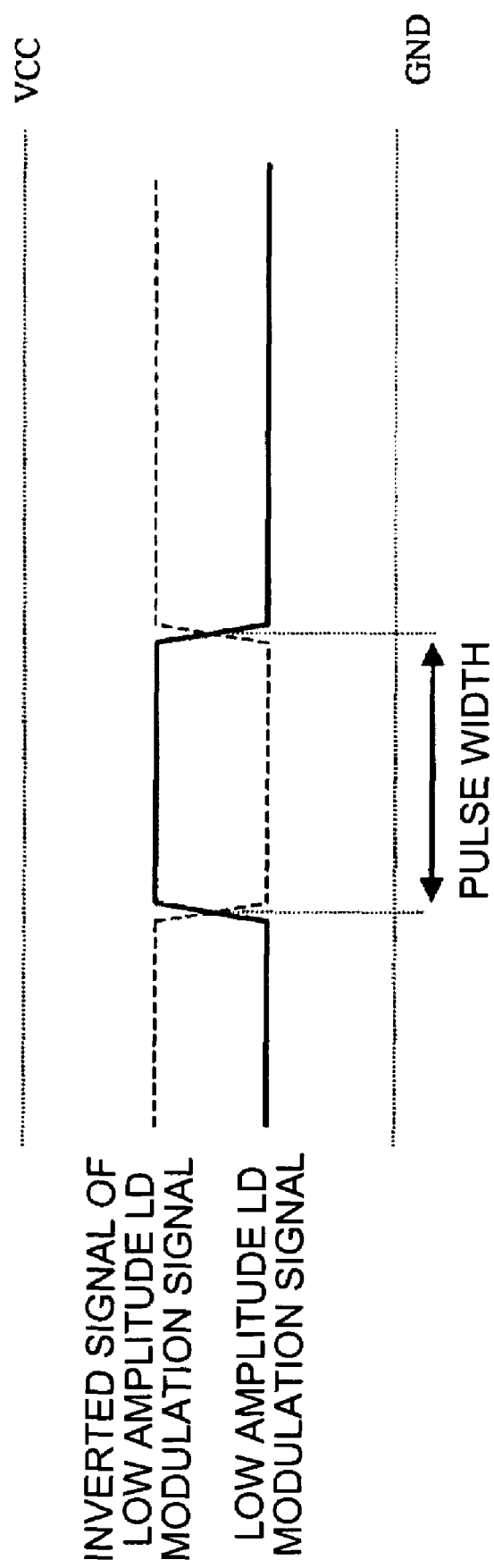
FIG. 5 illustrates waveforms of low amplitude differential LD modulation signals.
Figure 6:
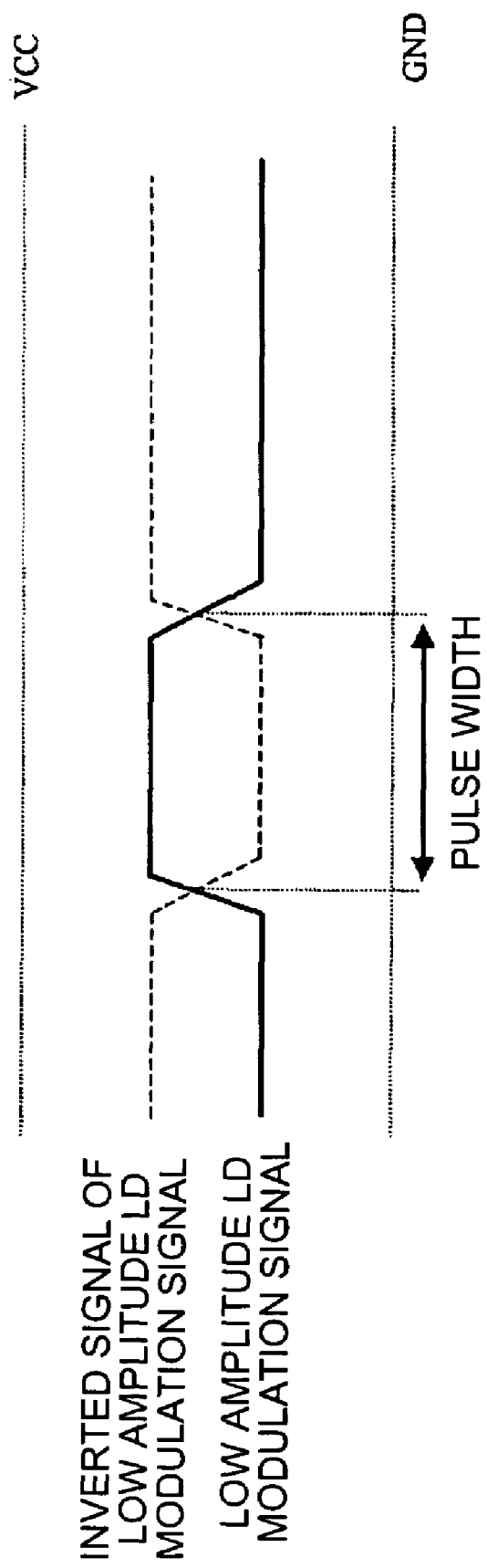
FIG. 6 illustrates waveforms of the low amplitude differential LD modulation signals if transmission lines are longer.
Figure 7:
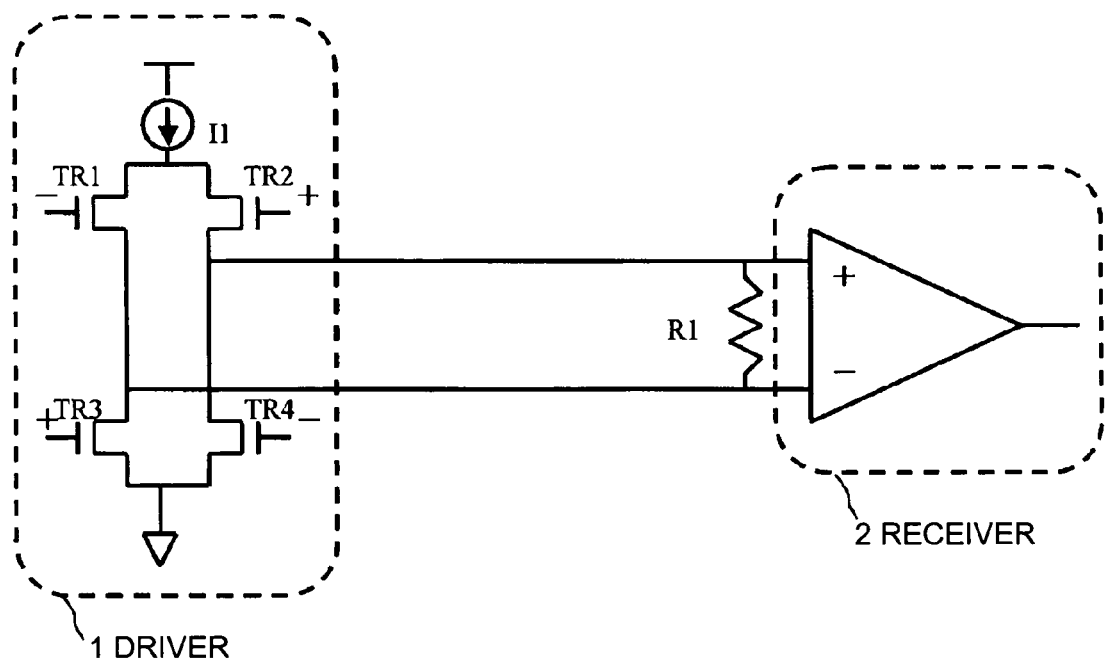
FIG. 7 is an example of a configuration for transferring the low amplitude differential LD modulation signals by LVDS method.

FIG. 4 is a waveform in an instance of digitally transferring the LD modulation signal according to a conventional technique. If a full-swing signal is transmitted by a single transfer, the swing is high, and therefore, it is difficult to accurately transfer a pulse width and the like. On the contrary, as show in FIG. 5, if low amplitude differential signals are transferred, it is possible to accelerate an operating rate, improve an electromagnetic immunity (EMI) characteristic, improve a noise resistance characteristic, and improve an accuracy of the LD modulation signals, for the following reasons. A changing energy is low, each signal is strong against a disturbance because of the differential signals, and an accurate pulse width can be transferred. FIG. 6 is one example of such LD modulation signals. For example, even if a waveform rising time and a waveform falling time are longer or the rising time and the falling time are changed because of a longer transmission line, a pulse can be accurately transferred without a change in pulse width, because the differential signals are transferred. The signals are, therefore, suited for signal transmission accompanied by pulse width modulation. A typical example of such a transfer method is a method based on low voltage differential signaling (LVDS). FIG. 7 is an example of a configuration of the LVDS method. As shown in FIG. 7, in the LVDS method, transistors TR2 and TR3 and transistors TR1 and TR4 included in a CMOS are alternately driven to apply or retract a current to or from a transmission line, the current being determined by a current source 11 of a driver 1. Thus, two differential signals are transmitted at a voltage between terminals of a resistor R1 of a receiver 2. Needless to say, it is not necessary to use the LVDS method if differential signals having low amplitude can be transmitted.

Figure 8:
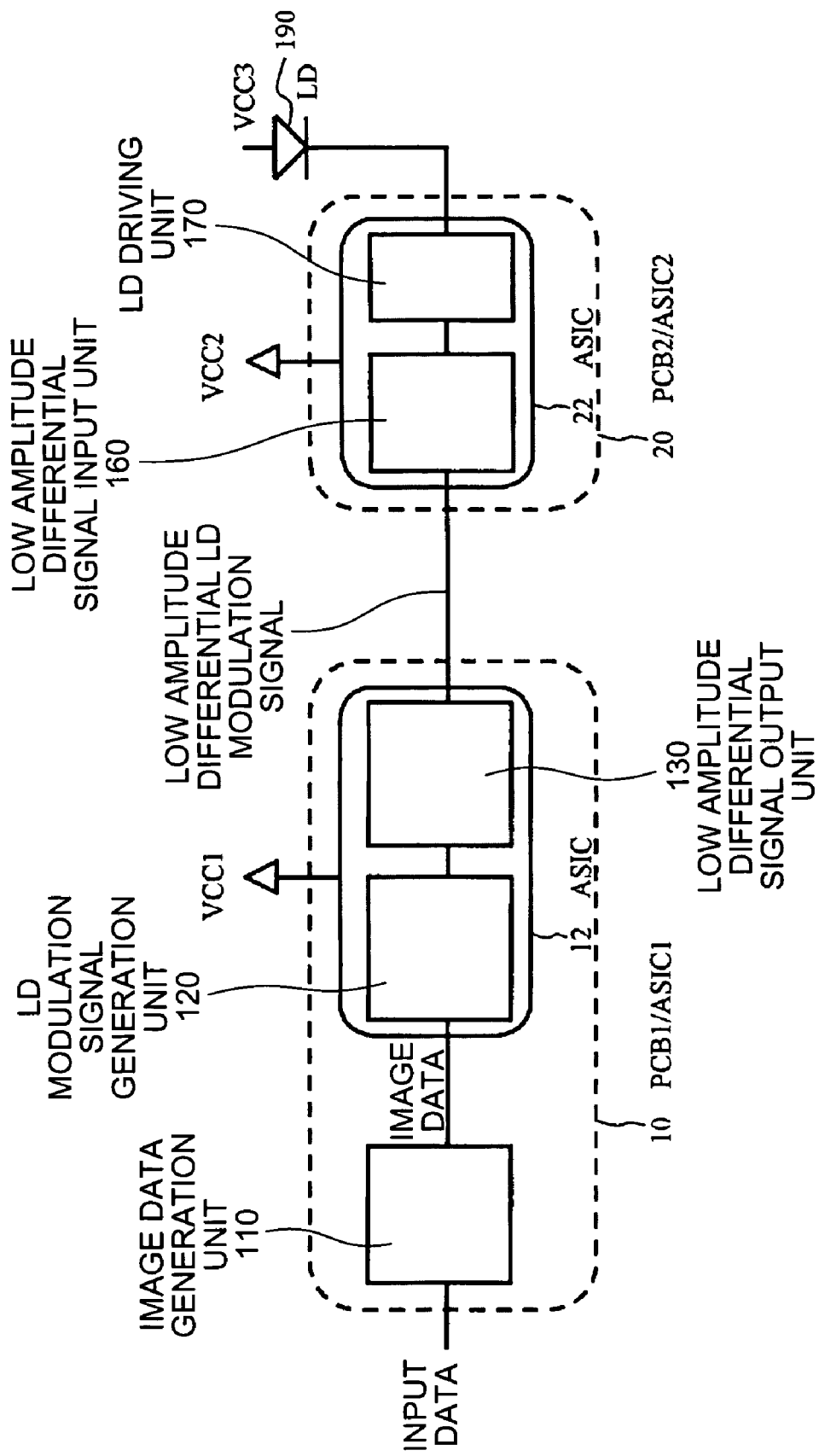
FIG. 8 is a block diagram of a semiconductor laser modulation driving apparatus according to another embodiment of the present invention.
Figure 9:
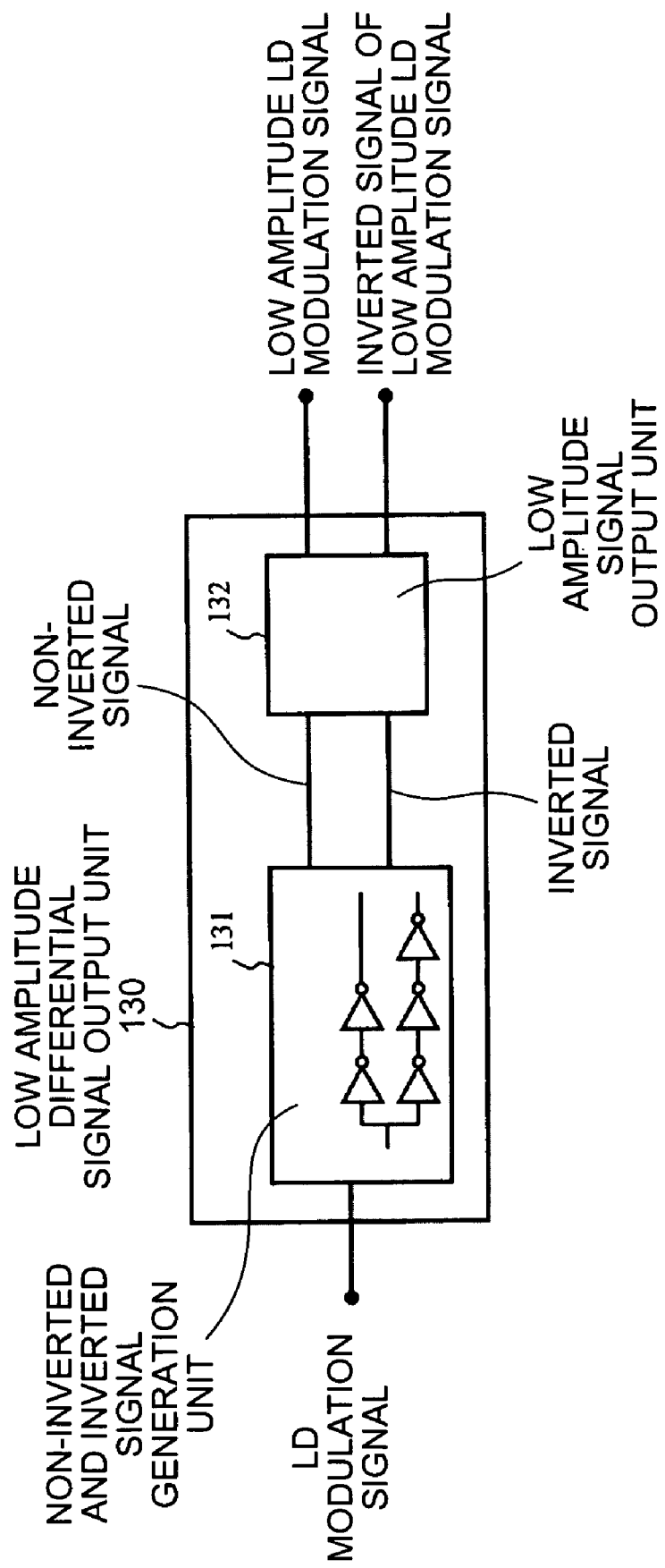
FIG. 9 is a block diagram of a low amplitude differential signal output unit shown in FIG. 8.

FIG. 8 is a block diagram of a semiconductor laser modulation driving apparatus according to an embodiment of the present invention. As shown in FIG. 8, in the semiconductor laser modulation driving apparatus, a low amplitude differential signal output unit 130 that serves as a driver unit for realizing transmission of low amplitude differential LD modulation signals, is provided on an output side of the LD modulation signal generation unit 120, and a low amplitude differential signal input unit 160 that serves as a receiver unit is provided on an input side of the LD driving unit 170. As shown in FIG. 9, the low amplitude differential signal output unit 130 includes a non-inverted and inverted signal generation unit 131, and a low amplitude signal output unit 132. The non-inverted and inverted signal generation unit 131 inputs the LD modulation signal from the LD modulation signal generation unit 120. In addition, the non-inverted and inverted signal generation unit 131 outputs a non-inverted signal (non-inverted LD modulation signal) equal in phase to the LD modulation signal, and an inverted signal (inverted LD modulation signal) different in phase from the non-inverted signal by 180 degrees. The low amplitude signal output unit 132 inputs both or one of the non-inverted signal and the inverted signal. In addition, the low amplitude signal output unit 132 outputs a low amplitude non-inverted signal (low amplitude LD modulation signal), and a low amplitude inverted signal (an inverted signal of the low amplitude LD modulation signal) that is different in phase from the low amplitude non-inverted signal by 180 degrees.

In the embodiment shown in FIG. 8, a power supply voltage of an ASIC unit 12 that includes the low amplitude differential signal output unit 130 and that relates to the LD modulation signal generation unit 120, is VCC1. In addition, a power supply voltage of an ASIC unit 22 that includes the low amplitude differential signal input unit 160 and that relates to the LD driving unit 170 is VCC2, and a power supply voltage of the LD 190 is VCC3. By allowing the ASIC units 12 and 22 and the LD 190 to use different power supply voltages, the respective blocks can be set in more suitable states. For example, the power supply voltage VCC1 is mainly used by a digital unit that generates the LD modulation signal required to be transmitted at a higher rate. Therefore, devices smaller in size are selected as devices incorporated in the ASIC 12. The power supply voltage VCC1 may be set at a low voltage (e.g., 1.2 volts for 0.13 micrometer process, or 1.8 volts for 0.18 micrometer process). Because the power supply voltage VCC2 is a power supply of the LD driving unit 170 as well as the low amplitude differential signal input unit 160, it suffices that the VCC2 is a sum of a voltage drop of the LD 190 and a potential necessary for an LD driving transistor. Generally, if the voltage drop of the LD 190 is about 2.5 volts and the potential necessary for the LD driving transistor is at least about 1 volt, the power supply voltage VCC2 may be at least 3.5 volts. The power supply voltage VCC3 as a power supply of the LD 190 may be replaced by the VCC2. However, an ASIC has a restriction to a setting of a power supply voltage depending on devices, and the power supply voltage of the ASIC cannot be set at an arbitrary value. Therefore, if a power consumption of the ASIC is to be further reduced, it is preferable to set, for example, the VCC2 at 5 volts and the VCC3 at 3.5 volts. It is thereby possible to further reduce the power consumption of the ASIC.

Figure 10:
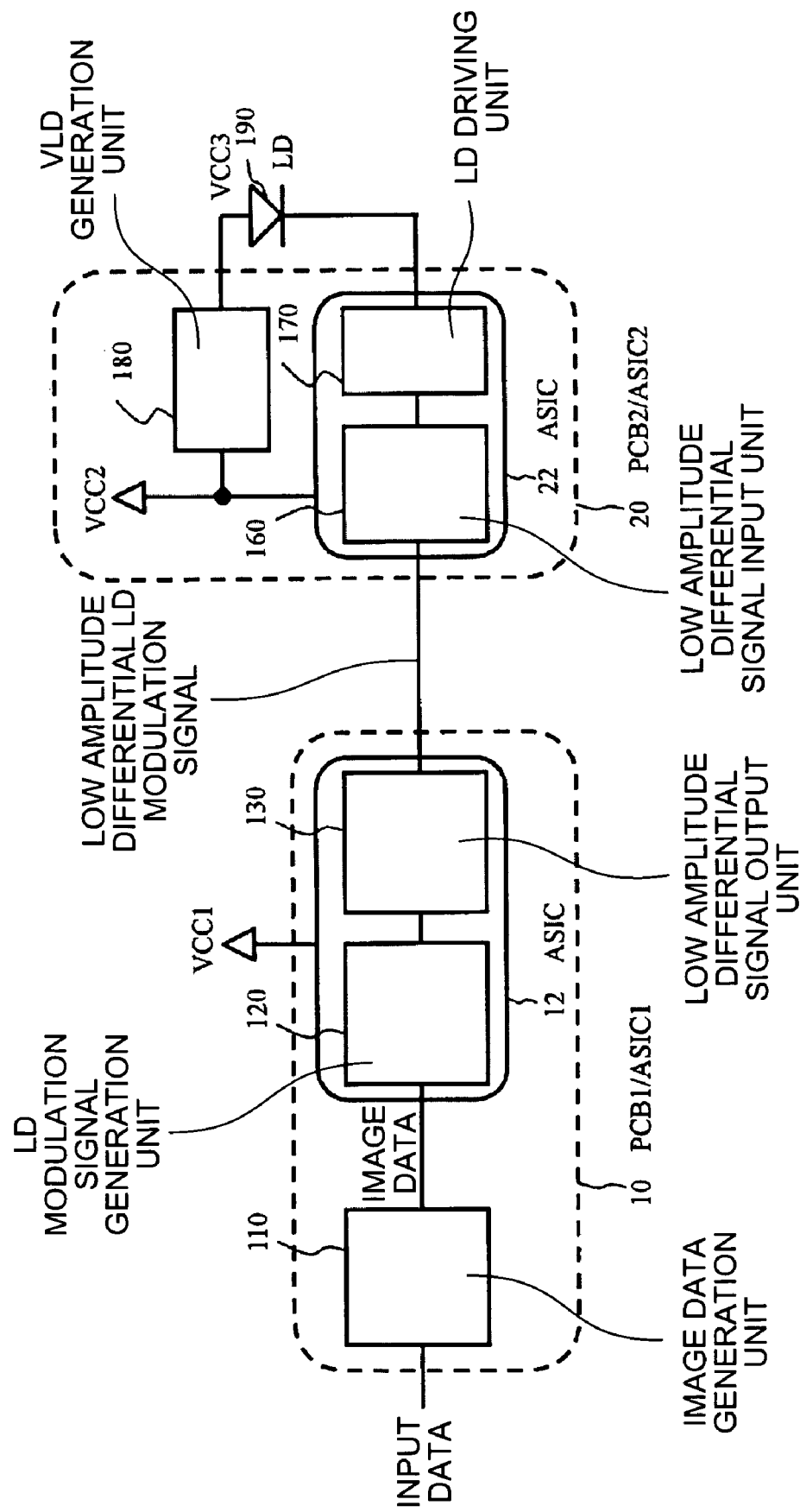
FIG. 10 is a block diagram of a semiconductor laser modulation driving apparatus according to another embodiment of the present invention.
Figure 11:
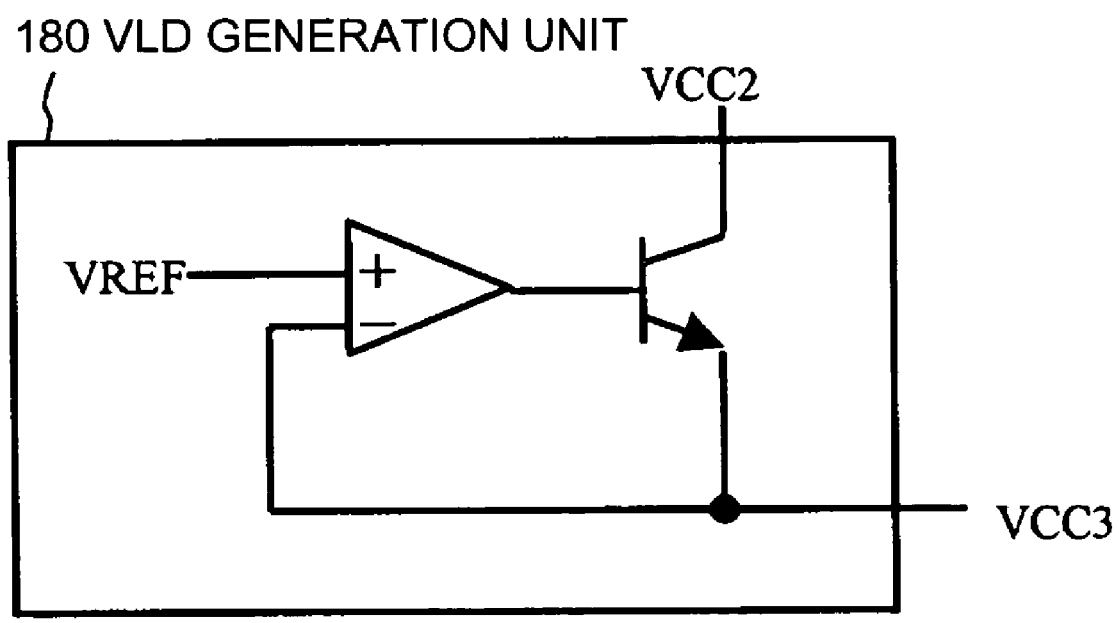
FIG. 11 is a specific example of a configuration of a VLD generation unit shown in FIG. 10.

FIG. 10 is a block diagram that depicts an embodiment of a configuration of the semiconductor laser modulation driving apparatus if the VCC2 and the VCC3 are changed. In FIG. 10, the power supply voltage VCC3 (<VCC2) of the LD 190 is generated from the power supply voltage VCC2 of the LD driving unit 170 as well as the low amplitude differential signal input unit 160. FIG. 11 is a block diagram that depicts a specific example of a configuration of a VLD generation unit 180. If the VCC3 is set at 3.5 volts and the VCC2 is set at 5 volts, for example, a voltage of 3.5 volts is input to the VCC3 by inputting a voltage of 3.5 volts to a reference voltage input VREF shown in FIG. 11. In the VLD generation unit 180, if this VREF can be freely set from outside, the VREF can be set at an optimum voltage to ensure a good power consumption and a good operation of the LD driving unit 170 according to the LD 190, no matter what type of an LD is connected. Thus, the semiconductor laser modulation driving apparatus that attains both a good LD driving characteristic and a low power consumption can be realized. This VLD generation unit 180 may be included in the ASIC 22, or provided outside of the ASIC 22 as shown in FIG. 10.

With reference to FIGS. 8 and 10, the image data generation unit 110 inputs the data output from the printer, the data read by the scanner, or the like, and generates image data according to a gamma characteristic or the like of a photoconductor based on a pixel clock so as to be able to output the image data from the laser printer. The image data has, for example, eight bits per pixel or per color component.

The LD modulation signal generation unit 120 generates a bit serial LD modulation signal from the image data based on the pixel clock and a high frequency clock. A pulse modulation signal generation circuit suitable for a high-rate operation of this LD modulation signal generation unit 120 is disclosed in, for example, Japanese Patent Application Laid-Open No. 2003-103831. However, the LD modulation signal generation unit 120 is not limited to the circuit disclosed therein, but may be a circuit having a conventional configuration.

The LD modulation signal generated by the LD modulation signal generation unit 120 is converted by the low amplitude differential signal output unit 130 into low amplitude differential LD modulation signals that have low amplitude and are differential signals, and transmitted or transferred between the ASICs or PCBs, i.e., transmitted or transferred to the low amplitude differential signal input unit 160 on the LD driving unit 170 side.

To generate the low amplitude differential signals, various means are considered. These include the LVDS shown in FIG. 7 explained above, current mode logic (CML), and emitter coupled logic (ECL). However, the other means may be used. Further, various means are considered for allowing the LD driving unit 170, serving as an input side, to receive the low amplitude differential signals. Normally, the same means as that used by an output side, i.e., the LD modulation signal generation unit 120, is used for the input side. However, when the output side and the input side differ in power supply voltage, high-rate signal transmission can be realized even if the means common to the output side and the input side is not used.

Various examples of a low amplitude differential signal generation logic circuit (examples of the low amplitude signal output unit 132 shown in FIG. 9) will now be explained. In the low amplitude signal output unit 132 of the following examples, a low output swing is generated by one inverter. Alternatively, the low output swing may be generated by a plurality of inverters, or a buffer.

Figure 12:
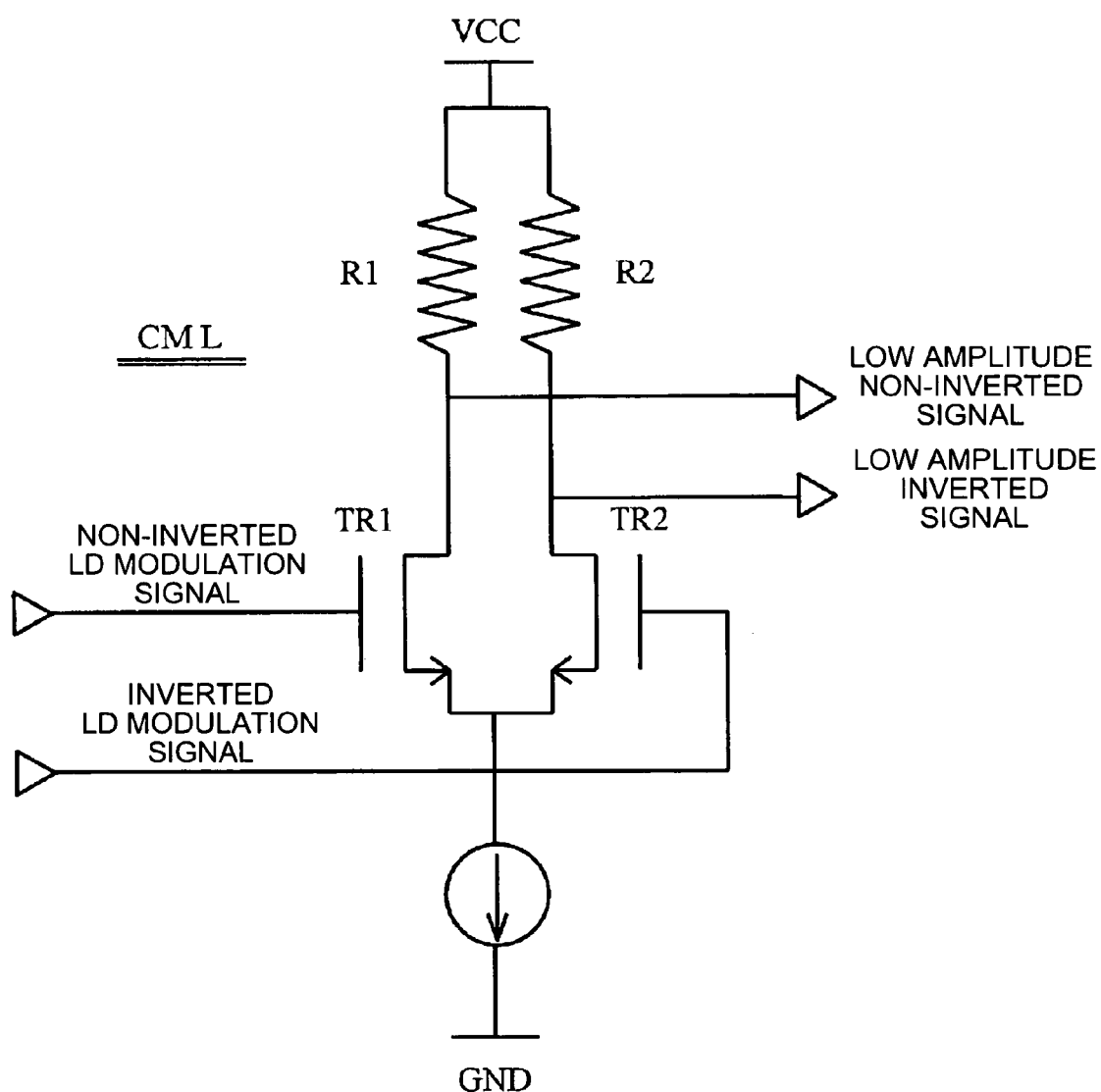
FIG. 12 is a specific example of a configuration of a low amplitude differential signal generating method.
Figure 13:
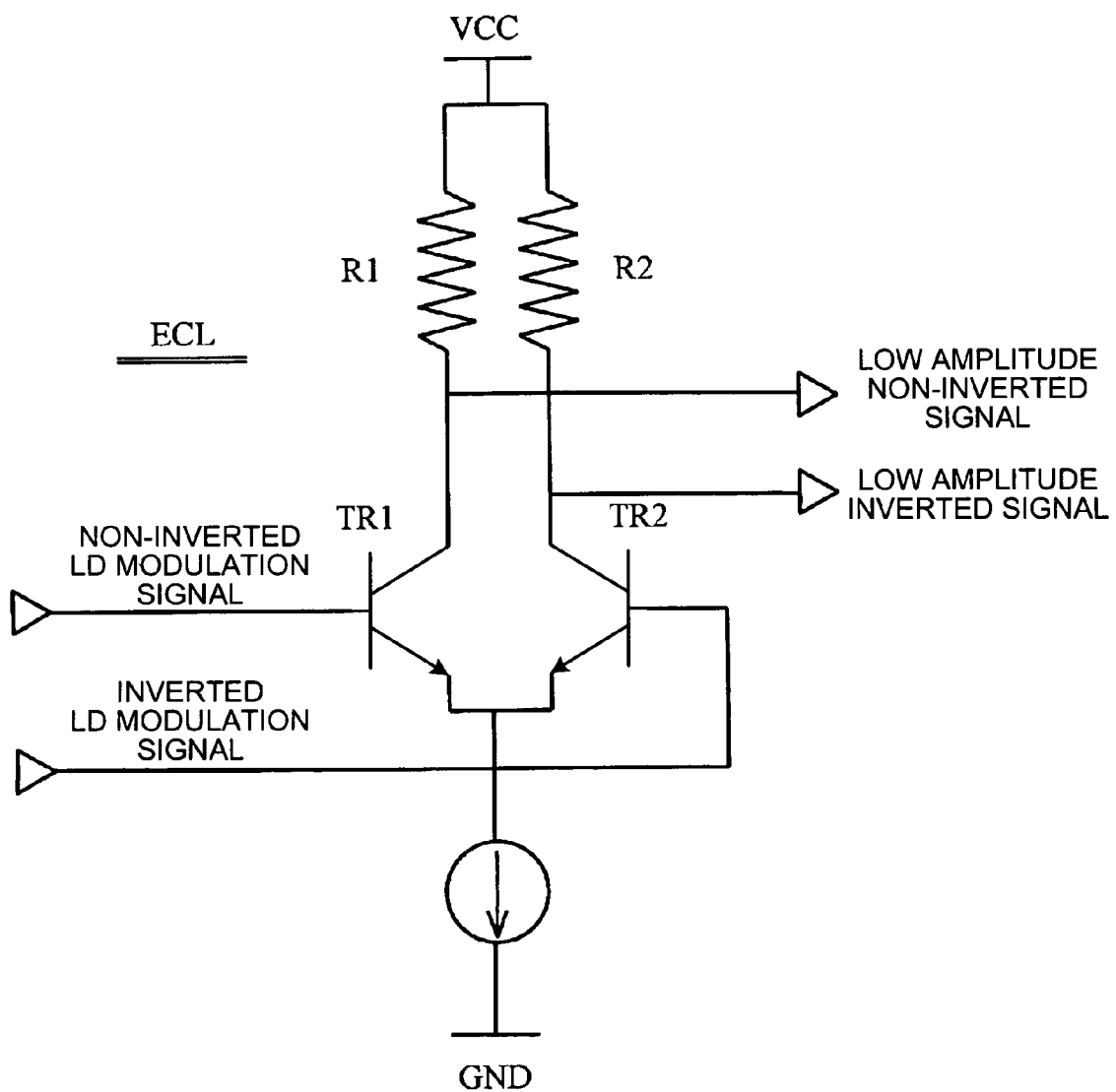
FIG. 13 is another specific example of a configuration of the low amplitude differential signal generating method.

FIG. 12 is an example of a configuration of the low amplitude signal output unit 132 based on the CML. In FIG. 12, differential signals, i.e., the non-inverted modulated signal and the inverted modulated signal are input to gates of transistors TR1 and TR2 of a CML circuit, respectively, and resistors R1 and R2 serve as loads of the CML circuit. Thus, an output swing of the CML circuit can be set lower than the VCC. Further, by adjusting resistances of the resistors R1 and R2, the output swing can be adjusted. FIG. 13 is an example of a configuration of the low amplitude signal output unit 132 based on the ECL. An ECL circuit shown in FIG. 13 is basically equal to the CML circuit show in FIG. 12, except that transistors TR1 and TR2 are replaced by bipolar transistors and differential signals are input to bases of the respective bipolar transistors, respectively.

Figure 14:
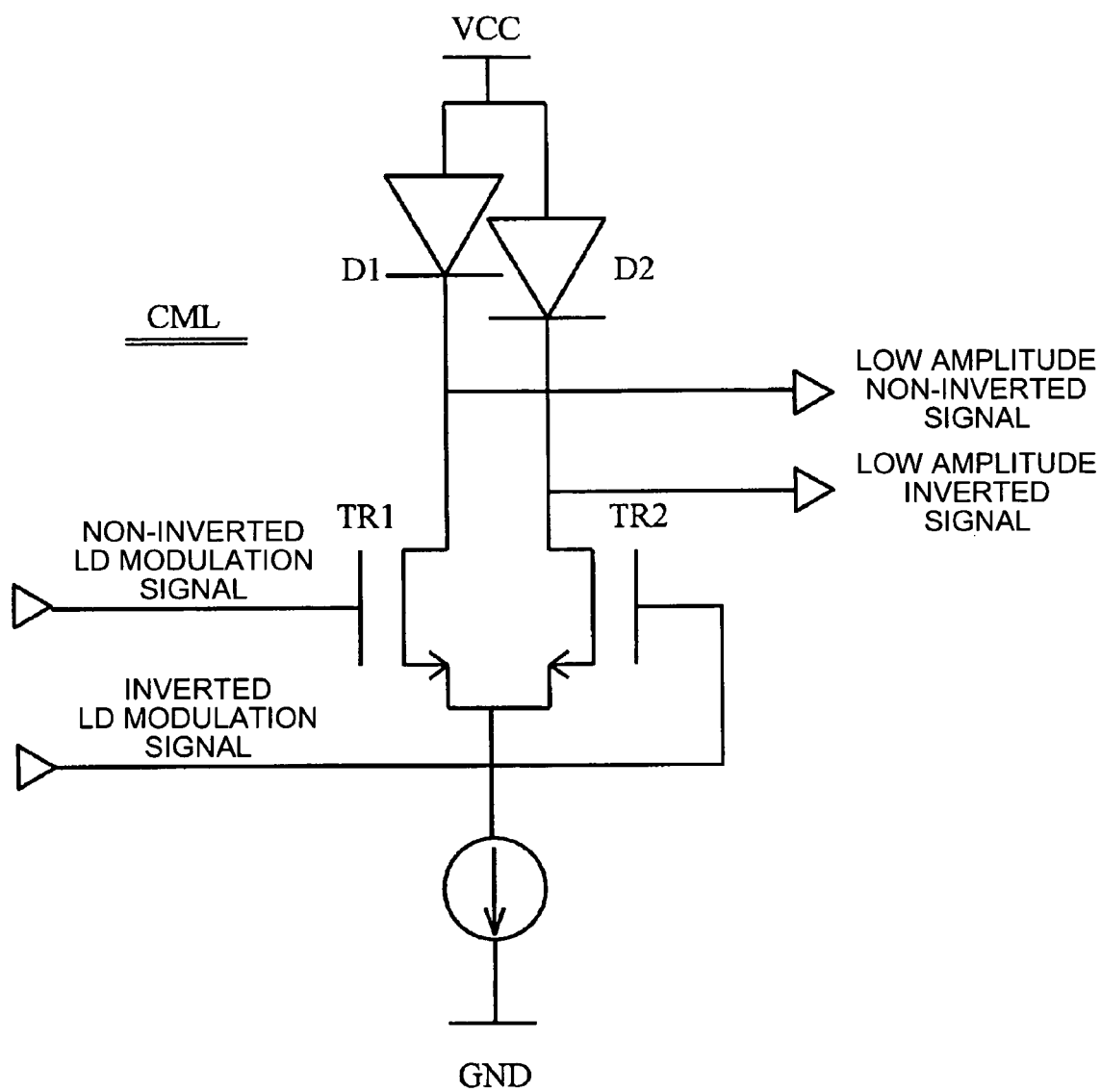
FIG. 14 is another specific example of a configuration of the low amplitude differential signal generating method.

FIG. 14 is an example of a configuration of the low amplitude signal output unit 132 based on the CML. In FIG. 14, the differential signals, i.e., the non-inverted LD modulation signal and the inverted LD modulation signal are input to the transistors TR1 and TR2 of the CML circuit, respectively, and diodes D1 and D2 serve as loads on the CML circuit. Thus, the output swing of the CML circuit can be set lower than the VCC by as much as voltage drops of the diodes D1 and D2. Further, by adjusting sizes of the diodes D1 and D2, the output swing can be adjusted. Similar to FIG. 13, the low amplitude signal output unit 132 based on the CML shown in FIG. 14 can be changed to that based on the ECL by replacing TR1 and TR2 with bipolar transistors.

Figure 15:
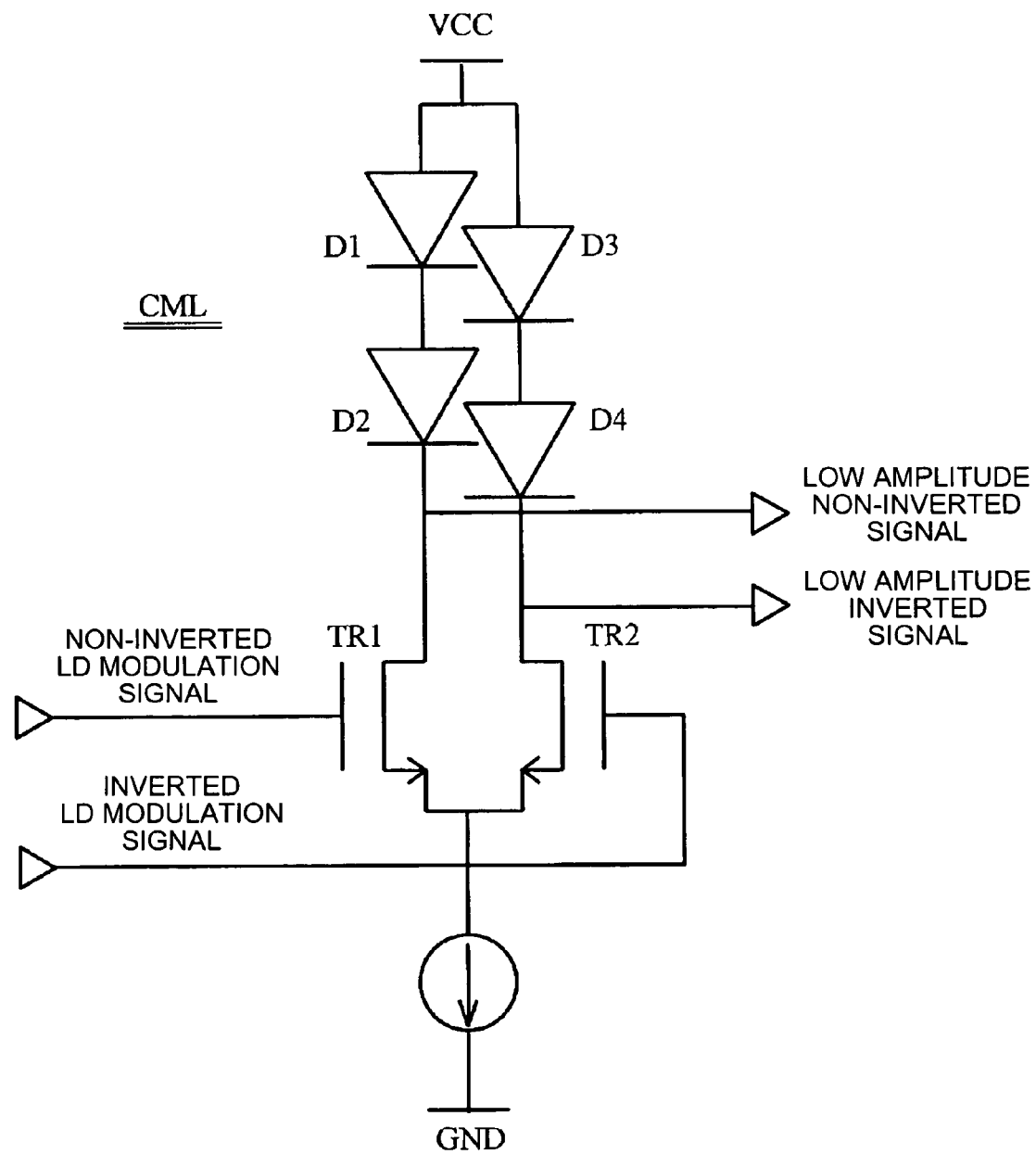
FIG. 15 is another specific example of a configuration of the low amplitude differential signal generating method.

FIG. 15 is an example of a configuration of the low amplitude signal output unit 132 based on the CML. As compared with that shown in FIG. 14, the low amplitude signal output unit 132 in FIG. 15 includes a pair of diodes D1 and D2 and a pair of diodes D3 and D4, respectively, instead of the diodes D1 and D2 shown in FIG. 14. Thus, the output swing of the CML circuit can be set lower than the VCC by as much as voltage drops of the two pairs of diodes D1 to D4. Further, by adjusting sizes of the diodes D1 to D4, the output swing can be adjusted. The constitution of the ECL can be the same as described above.

Figure 16:
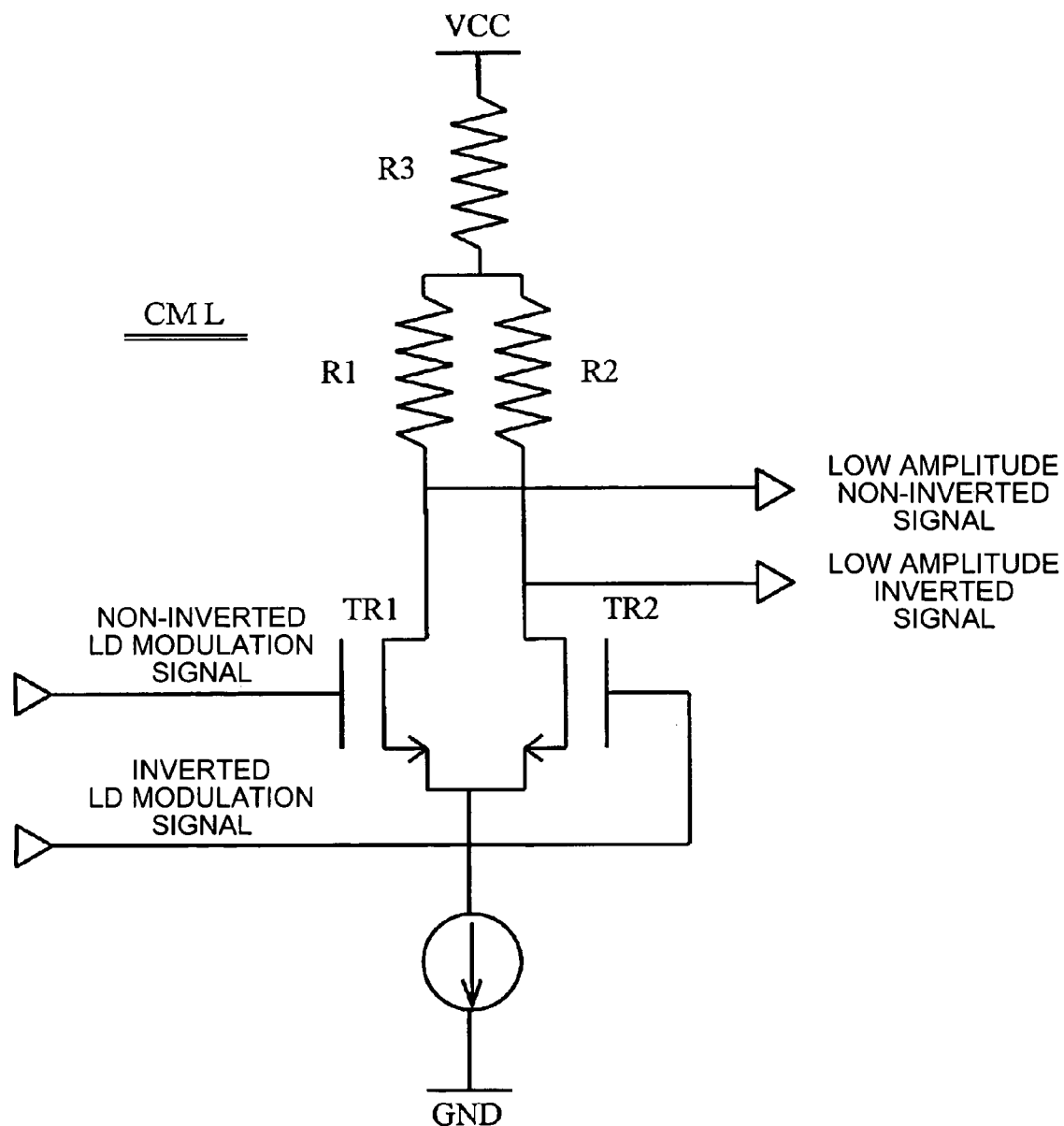
FIG. 16 is another specific example of a configuration of the low amplitude differential signal generating method.

FIG. 16 is an example of a configuration of the low amplitude signal output unit 132 based on the CML. As compared with that shown in FIG. 12, the low amplitude signal output unit 132 of FIG. 16 includes another resistor R3 additionally provided between the VCC and the resistors R1 and R2. Thus, a reference potential can be set lower than the VCC. Further, by adjusting resistances of the resistors R1, R2, and R3, the output swing can be adjusted. The constitution of the ECL can be the same as described above.

Figure 17:
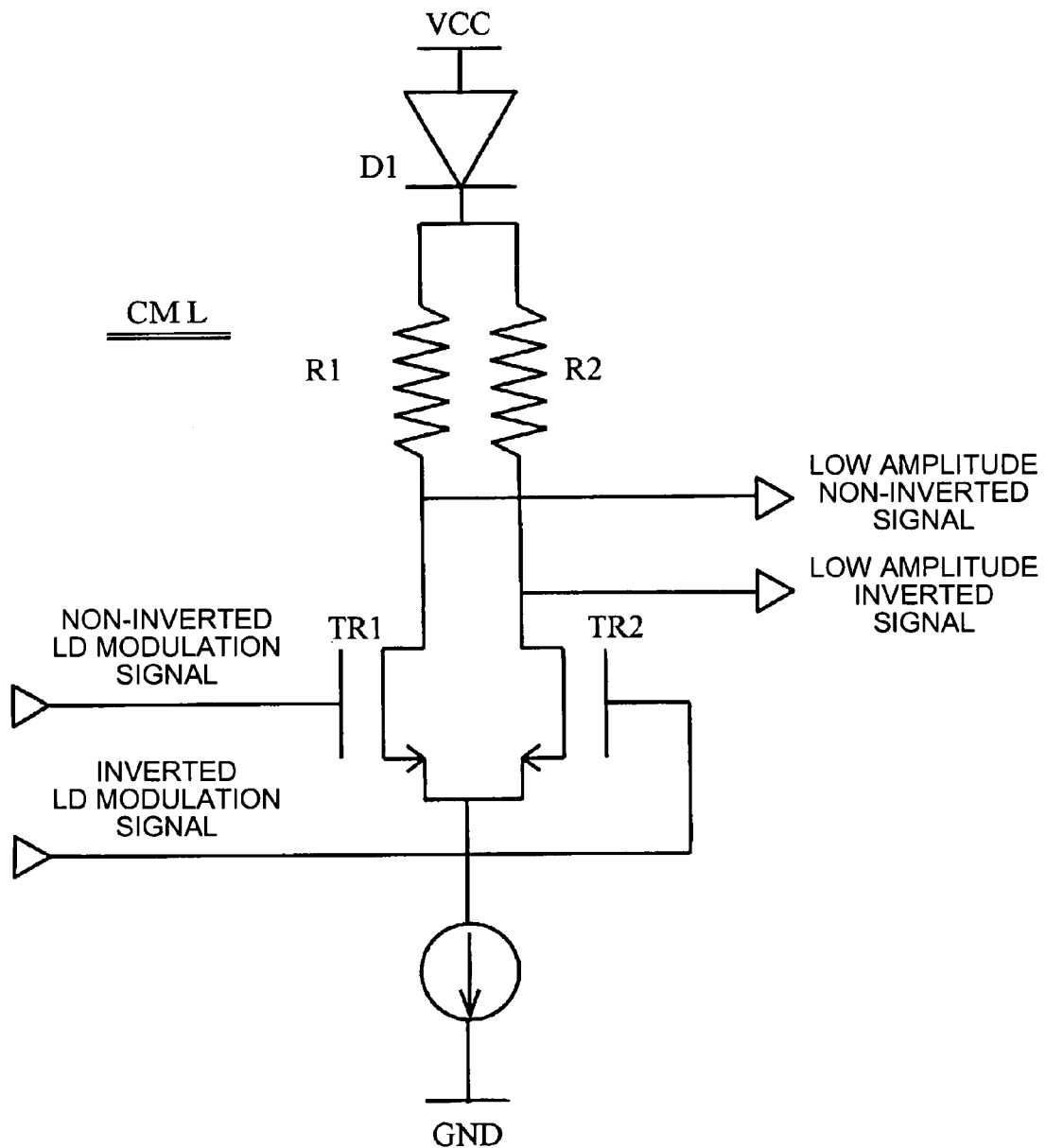
FIG. 17 is another specific example of a configuration of the low amplitude differential signal generating method.

FIG. 17 is an example of a configuration of the low amplitude signal output unit 132 based on the CML. As compared with that shown in FIG. 12, the low amplitude signal output unit 132 of FIG. 17 includes the diode D1 additionally provided between the VCC and the resistors R1 and R2. Thus, the reference potential can be set lower than the VCC by as much as the voltage drop of the diode D1, and the output swing of the CML circuit can be set low. Further, by adjusting the size of the diode D1, the output swing can be adjusted. The constitution of the ECL can be the same as described above.

Figure 18:
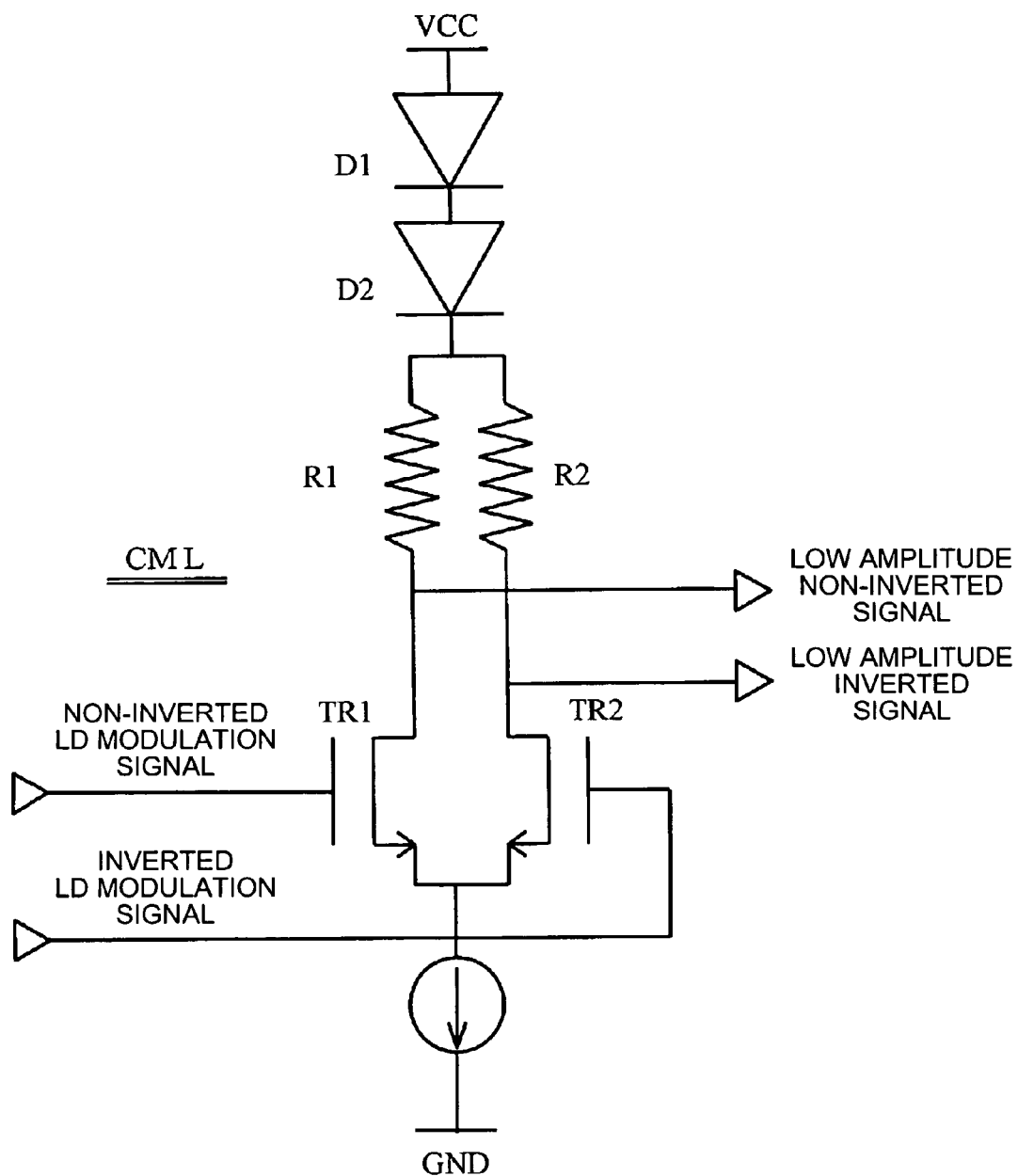
FIG. 18 is another specific example of a configuration of the low amplitude differential signal generating method.

FIG. 18 is an example of a configuration of the low amplitude signal output unit 132 based on the CML. As compared with that shown in FIG. 17, the low amplitude signal output unit 132 in FIG. 18 includes the two diodes D1 and D2 instead of the diode D1 shown in FIG. 17. Thus, the reference potential can be set lower than the VCC by as much as the voltage drops of the diodes D1 and D2, and the output swing of the CML circuit can be set low. Further, by adjusting the sizes of the diodes D1 and D2, the output swing can be adjusted. The constitution of the ECL can be the same as described above.

Figure 19:
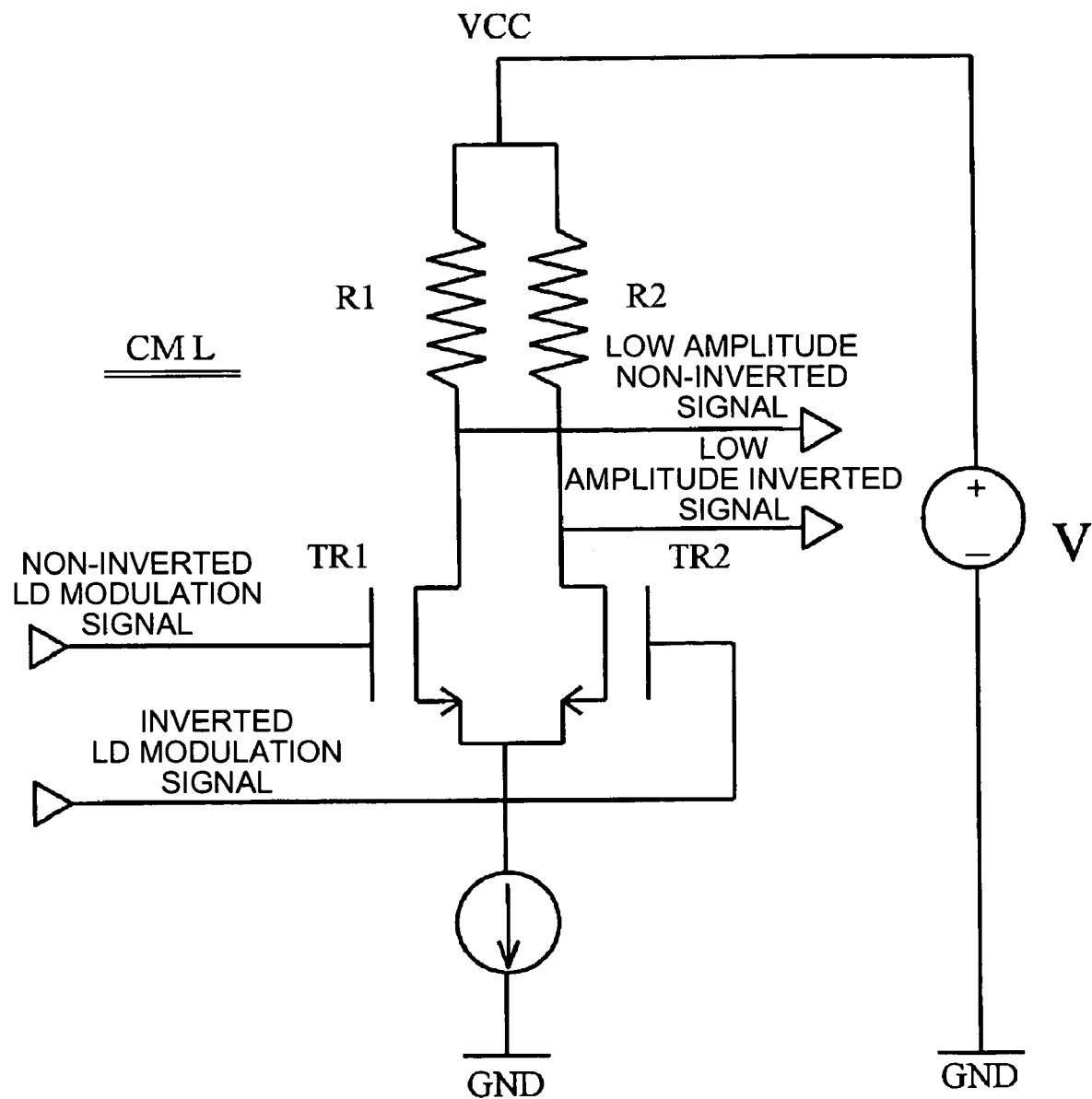
FIG. 19 is another specific example of a configuration of the low amplitude differential signal generating method.

FIG. 19 is an example of a configuration of the low amplitude signal output unit 132 based on the CML. As compared with that shown in FIG. 12, the low amplitude signal output unit 132 in FIG. 19 includes a voltage source V instead of the VCC shown in FIG. 12. Thus, a desired reference potential can be easily obtained, and the output swing of the CML circuit can be set at a desired magnitude. The constitution of the ECL can be the same as described above.

Figure 20:
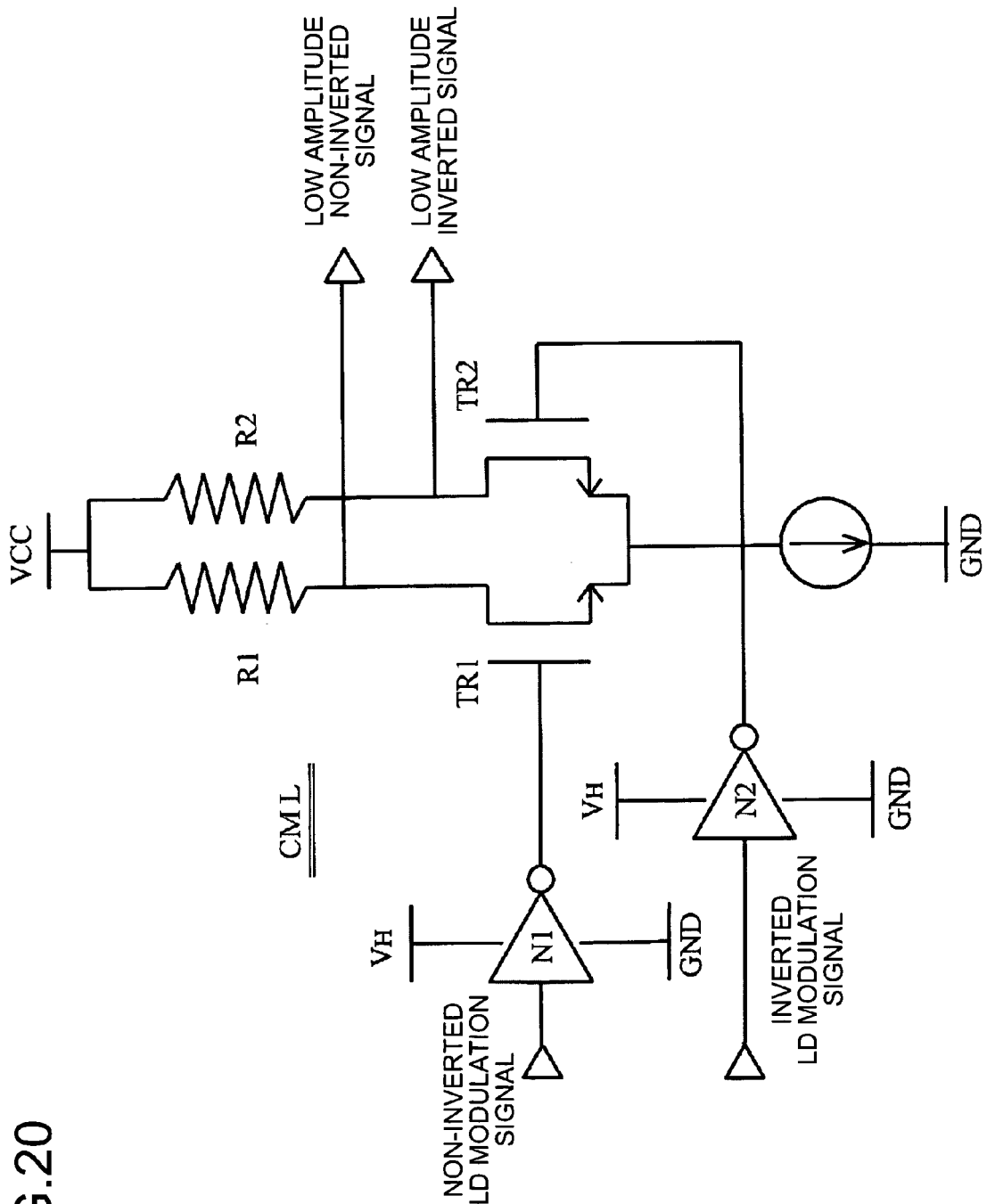
FIG. 20 is another specific example of a configuration of the low amplitude differential signal generating method.

FIG. 20 is an example of a configuration of the low amplitude signal output unit 132 based on the CML. As compared with that shown in FIG. 12, the low amplitude signal output unit 132 in FIG. 20 is different in that a swing of an input signal of the CML circuit is set low, and power supply voltages of inverters N1 and N2 are set at a potential VH, VH being lower than the VCC. Thus, the swing of the input signal of the CML circuit can be set at the potential VH lower than the VCC. In addition, a fluctuation in the current source due to switching can be suppressed, and a switching rate can be accelerated. The constitution of the ECL can be the same as described above.

Figure 21:
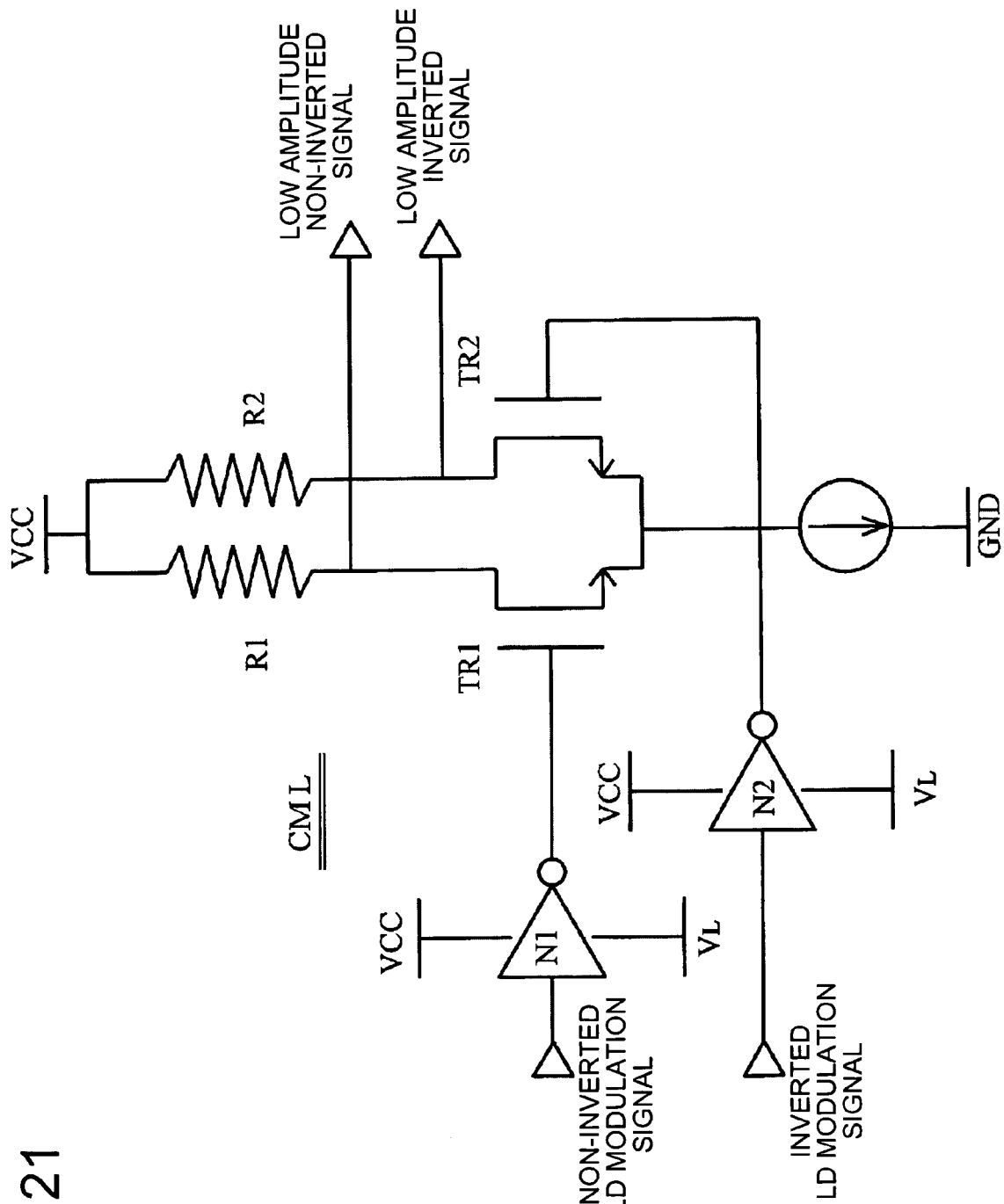
FIG. 21 is another specific example of a configuration of the low amplitude differential signal generating method.

FIG. 21 is an example of a configuration of the low amplitude signal output unit 132 based on the CML. In FIG. 21, similar to FIG. 20, the low amplitude signal output unit 132 is such that the swing of the input signal of the CML circuit is set low. However, differently from FIG. 20, a ground voltage of the inverters N1 and N2 is set at a potential VL higher than the ground GND. Thus, the swing of the input signal of the CML circuit can be set at VCC-VL, which is lower than the VCC. Moreover, a fluctuation in the current source due to switching can be suppressed, and a switching rate can be accelerated. The constitution of the ECL can be the same as described above.

Figure 22:
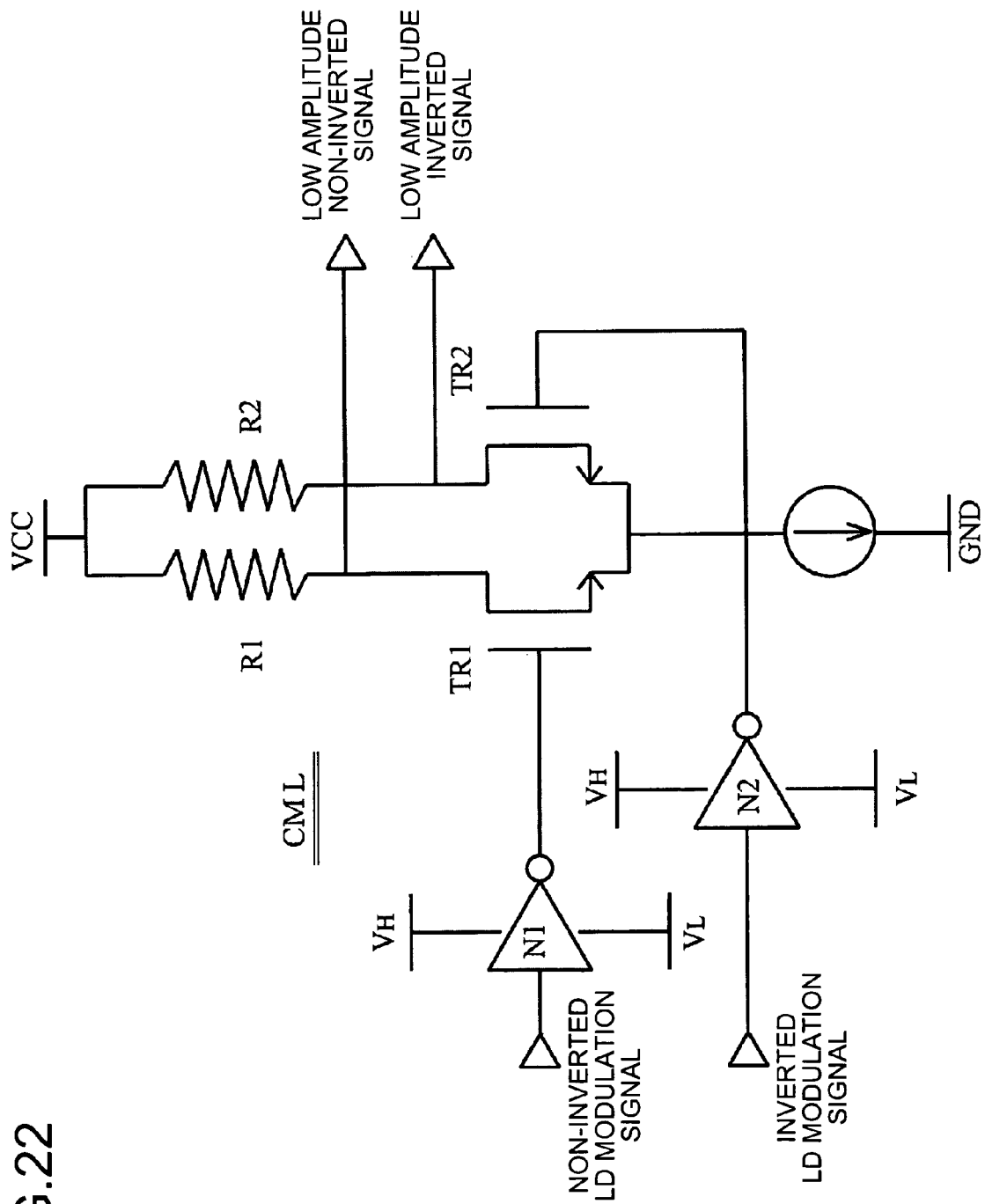
FIG. 22 is another specific example of a configuration of the low amplitude differential signal generating method.

FIG. 22 is an example of a configuration of the low amplitude signal output unit 132 based on the CML. In FIG. 22, similar to FIGS. 20 and 21, the low amplitude signal output unit 132 is such that the swing of the input signal of the CML circuit is set low. However, differently from FIGS. 20 and 21, a power supply voltage of the inverters N1 and N2 is set at the potential VH lower than the VCC, and a ground voltage of the inverters N1 and N2 is set at the potential VL higher than the ground GND. Thus, the swing of the input signal of the CML circuit can be set at VH-VL, which is lower than the VCC. Moreover, a fluctuation in the current source due to switching can be suppressed, and a switching rate can be accelerated. The constitution of the ECL can be the same as described above.

Figure 23A:
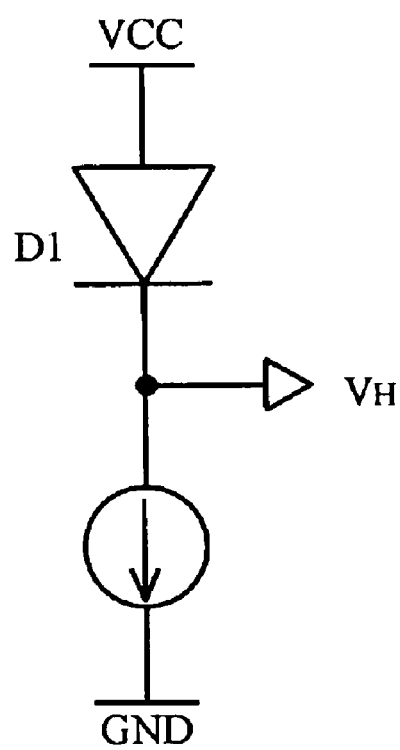
FIGS. 23A and 23B are specific examples of a configuration of a high potential generating method.
Figure 23B:
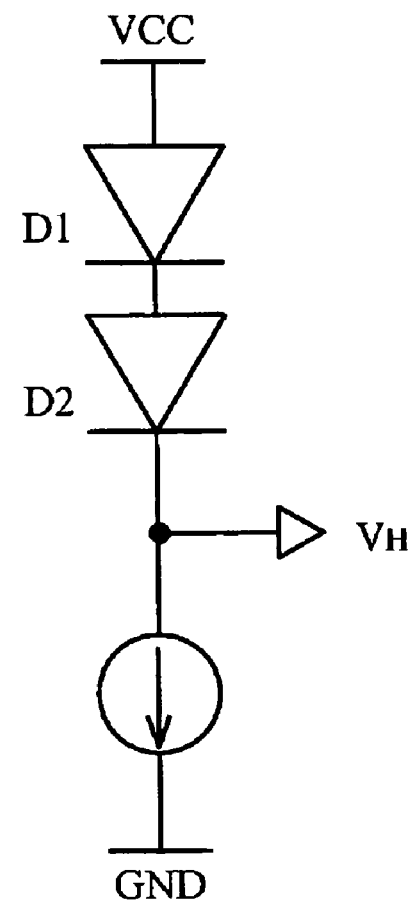

FIGS. 23A and 23B are examples of a circuit that generates the high potential VH shown in FIGS. 20 and 22. In the circuit of FIG. 23A, an anode of the diode D1 is connected to the power supply voltage VCC, and a cathode thereof is connected to the current source. Thus, a potential lower than the VCC by as much as the voltage drop of the diode D1 can be stably retracted as the potential VH. Further, by adjusting the size of the diode D1 and a current of the current source, a desired potential VH can be attained. In FIG. 23B, the circuit includes the two diodes D1 and D2. Thus, the potential lower than the VCC by as much as the voltage drops of the diodes D1 and D2 can be stably retracted as the potential VH, and the circuit can generate the VH lower than the VH generated by the circuit including the single diode D1. Further, by adjusting the sizes of the diodes D1 and D2 and the current of the current source, a desired VH can be attained.

Figure 24A:
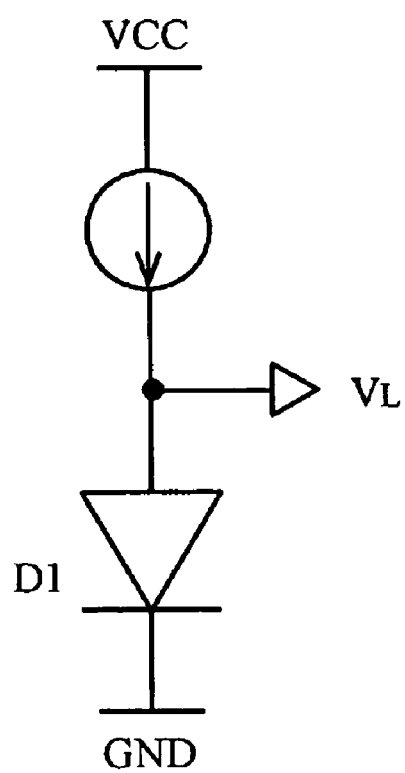
FIGS. 24A and 24B are specific examples of a configuration of a low potential generating method.
Figure 24B:
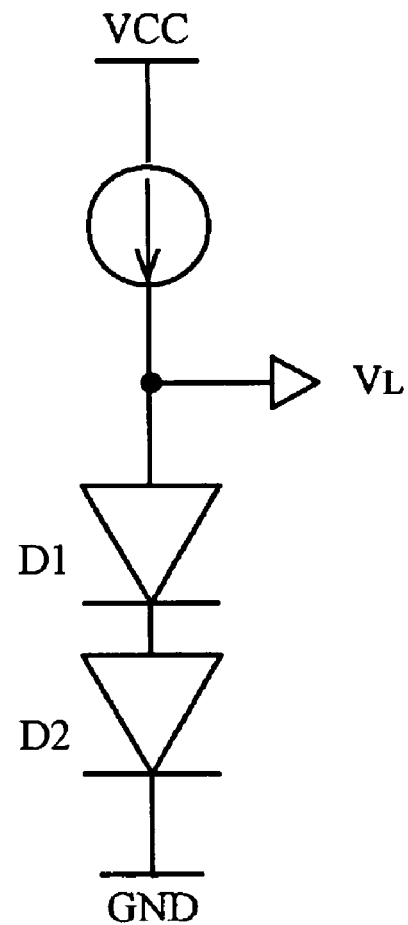

FIGS. 24A and 24B are examples of a circuit that generates the low potential VL shown in FIGS. 21 and 22. In the circuit of FIG. 24A, the cathode of the diode D1 is connected to the ground GND, and the anode thereof is connected to the current source. Thus, a potential higher than the GND by as much as the voltage drop of the diode D1 can be stably retracted as the potential VL. Further, by adjusting the size of the diode D1 and the current of the current source, a desired potential VL can be attained. In FIG. 24B, the circuit includes the two diodes D1 and D2. Thus, the potential higher than the GND by as much as the voltage drops of the diodes D1 and D2 can be stably retracted as the potential VL, and the circuit can generate the VL higher than the VL generated by the circuit including the single diode D1. Further, by adjusting the sizes of the diodes D1 and D2 and the current of the current source, a desired VL can be attained.

Figure 25:
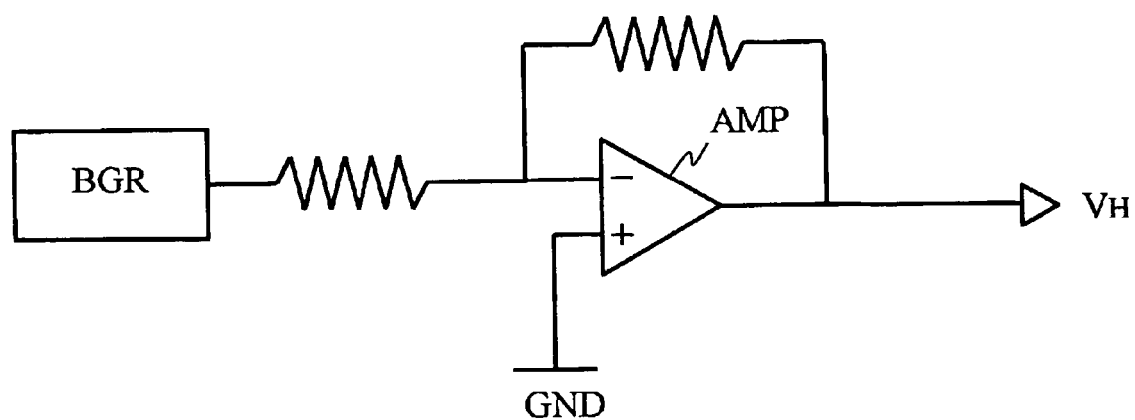
FIG. 25 is another specific example of a configuration of the high potential generating method.

FIG. 25 is another example of a circuit that generates the high potential VH. In the circuit of FIG. 25, an output of a bandgap reference (BGR) is input to an operational amplifier AMP. Thus, the desired high potential VH can be stably attained.

Figure 26:
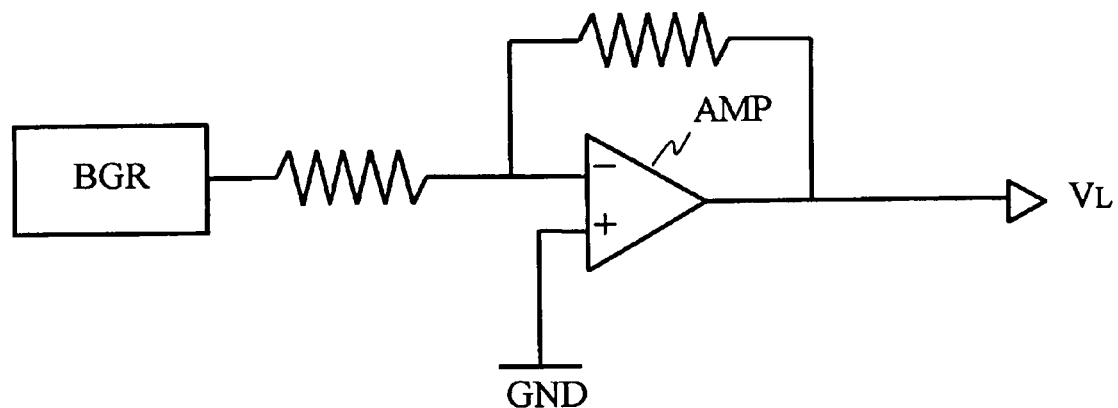
FIG. 26 is another specific example of a configuration of the low potential generating method.

FIG. 26 is another example of a circuit that generates the low potential VL. In the circuit of FIG. 26, similar to that of FIG. 25, an output of the BGR is input to the operational amplifier AMP. Thus, the desired low potential VL can be stably attained.

Figure 27:
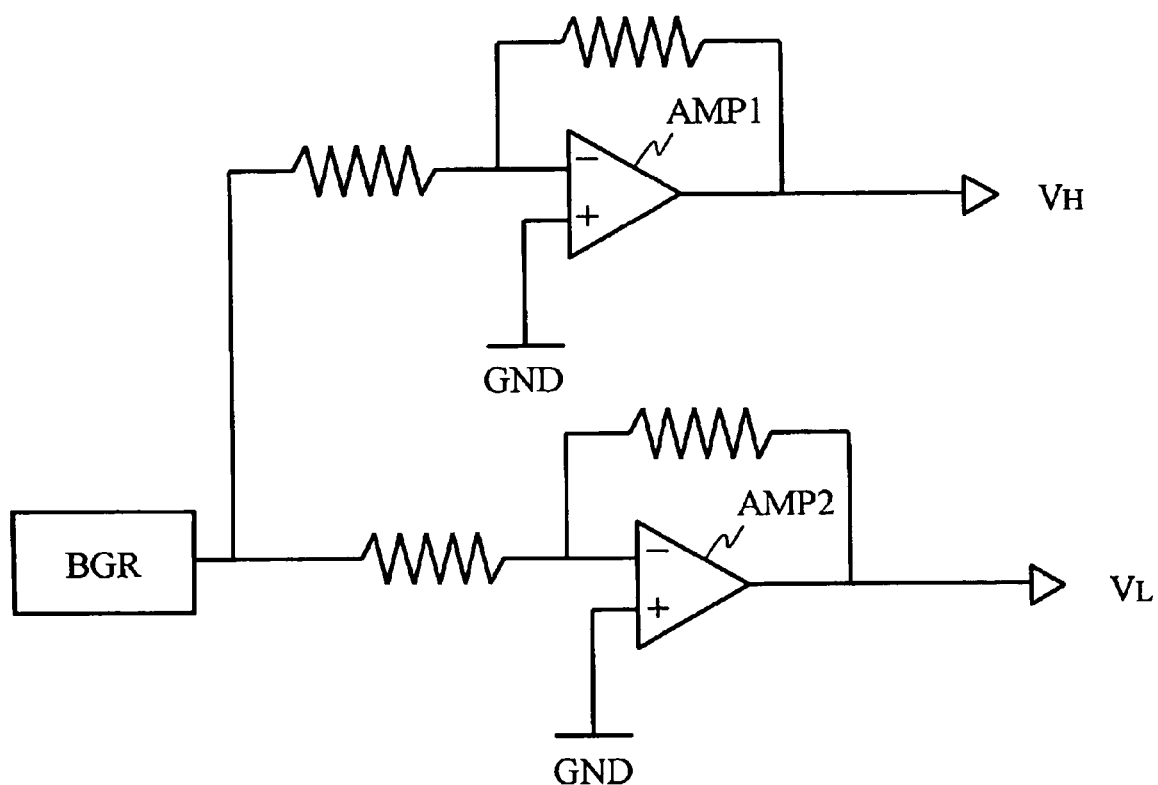
FIG. 27 is a specific example of a configuration of a high potential and low potential generating method.

FIG. 27 is an example of generating the high potential VH and the low potential VL by a single circuit. In the circuit of FIG. 27, the output of the BGR is input to operational amplifiers AMP1 and AMP2 for the high potential VH and the lower potential VL, respectively. Thus, the desired high potential VH and the desired low potential VL can be attained.

Figure 28:
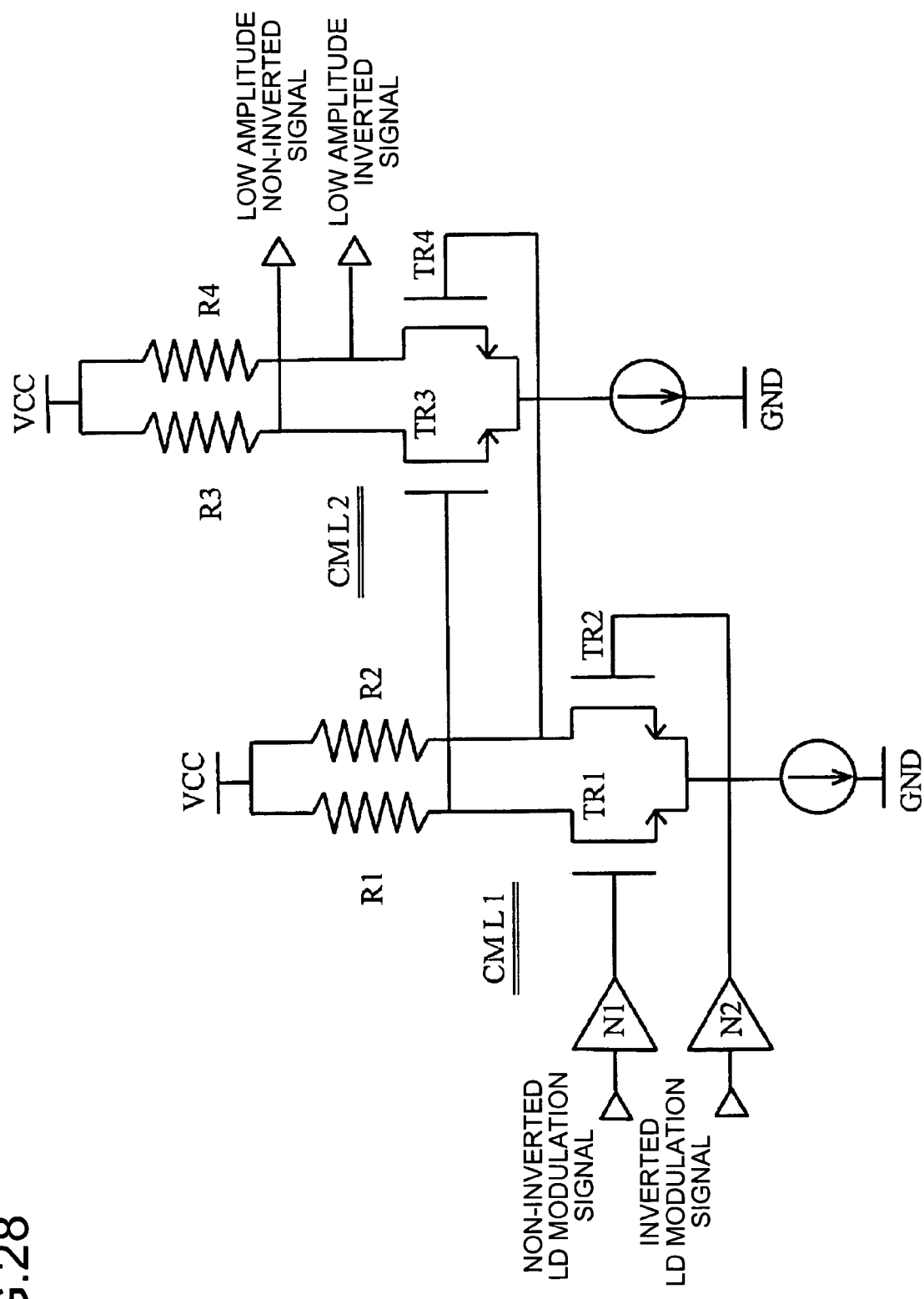
FIG. 28 is still another specific example of a configuration of the low amplitude differential signal generating method.

FIG. 28 is an example of the configuration of the low amplitude signal output unit 132 by connecting two CML circuits. In FIG. 28, the differential signals, i.e., the non-inverted LD modulation signal and the inverted LD modulation signal are input to a first CML circuit CML1, and differential signals of an output of the CML1 are input to a second CML circuit CML2. Thus, the swing of an input signal of the second CML circuit CML2 can be set low, and a fluctuation in current source due to the switching of an input of the second CML circuit CML2 can be suppressed. Likewise, the low amplitude signal output unit 132 may include three or more CML circuits. Moreover, by replacing transistors TR1 to TR4 by bipolar transistors, the low amplitude signal output unit 132 based on the ECL can be constituted.

Figure 29:
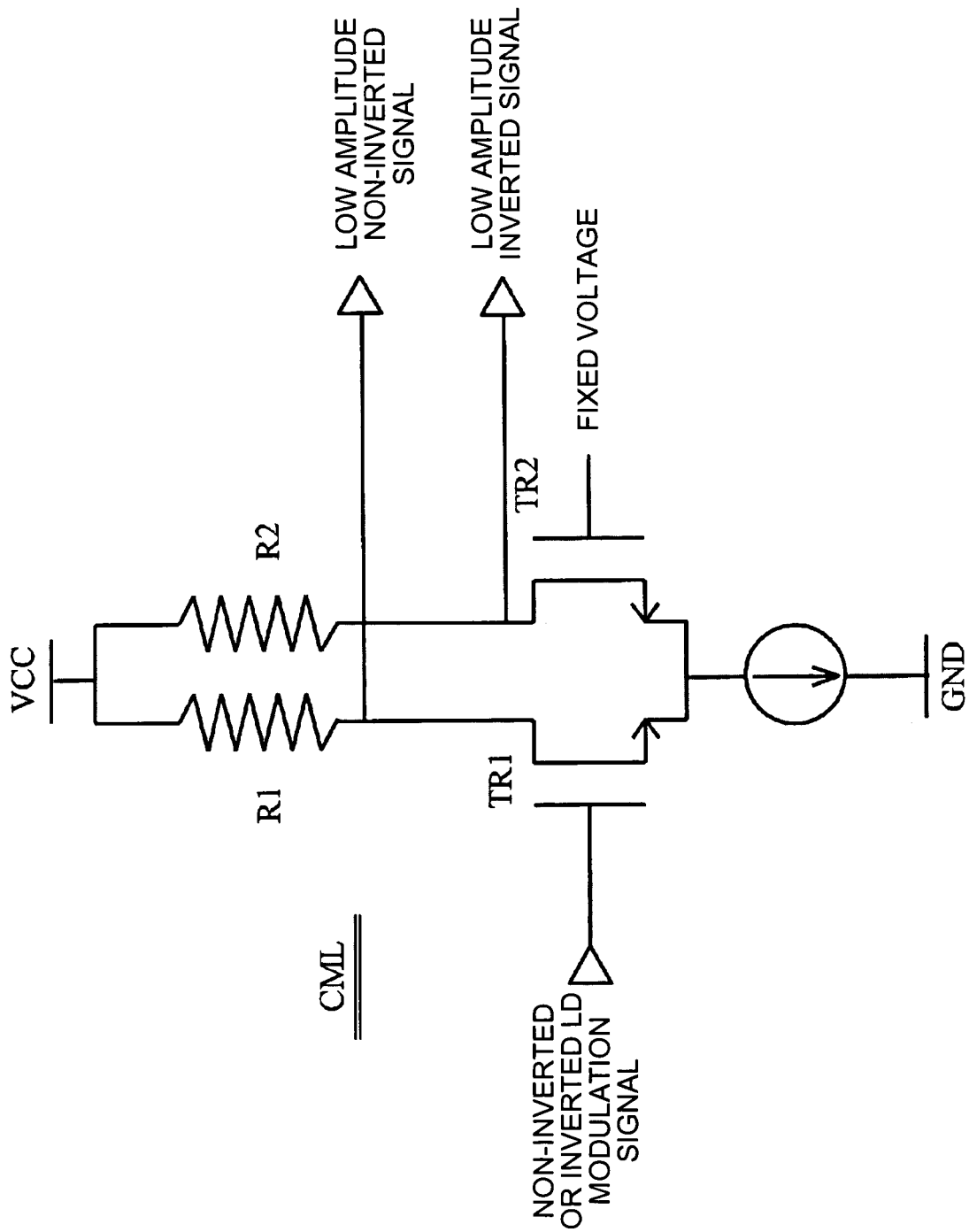
FIG. 29 is still another specific example of a configuration of the low amplitude differential signal, generating method.

FIG. 29 is an example of the configuration of the low amplitude signal output unit 132 based on the CML. In the low amplitude signal output unit 132 of FIG. 29, an input of one transistor TR2 of the CML is a fixed voltage, and a non-inverted LD modulation signal or an inverted LD modulation signal of a switching signal is input to the other transistor TR1. Thus, like in the preceding examples, low swing differential signals can be output. Further, by adjusting resistance of the load resistors R1 and R2, a swing of an output voltage can be adjusted. The constitution of the ECL can be the same as described above.

Figure 30:
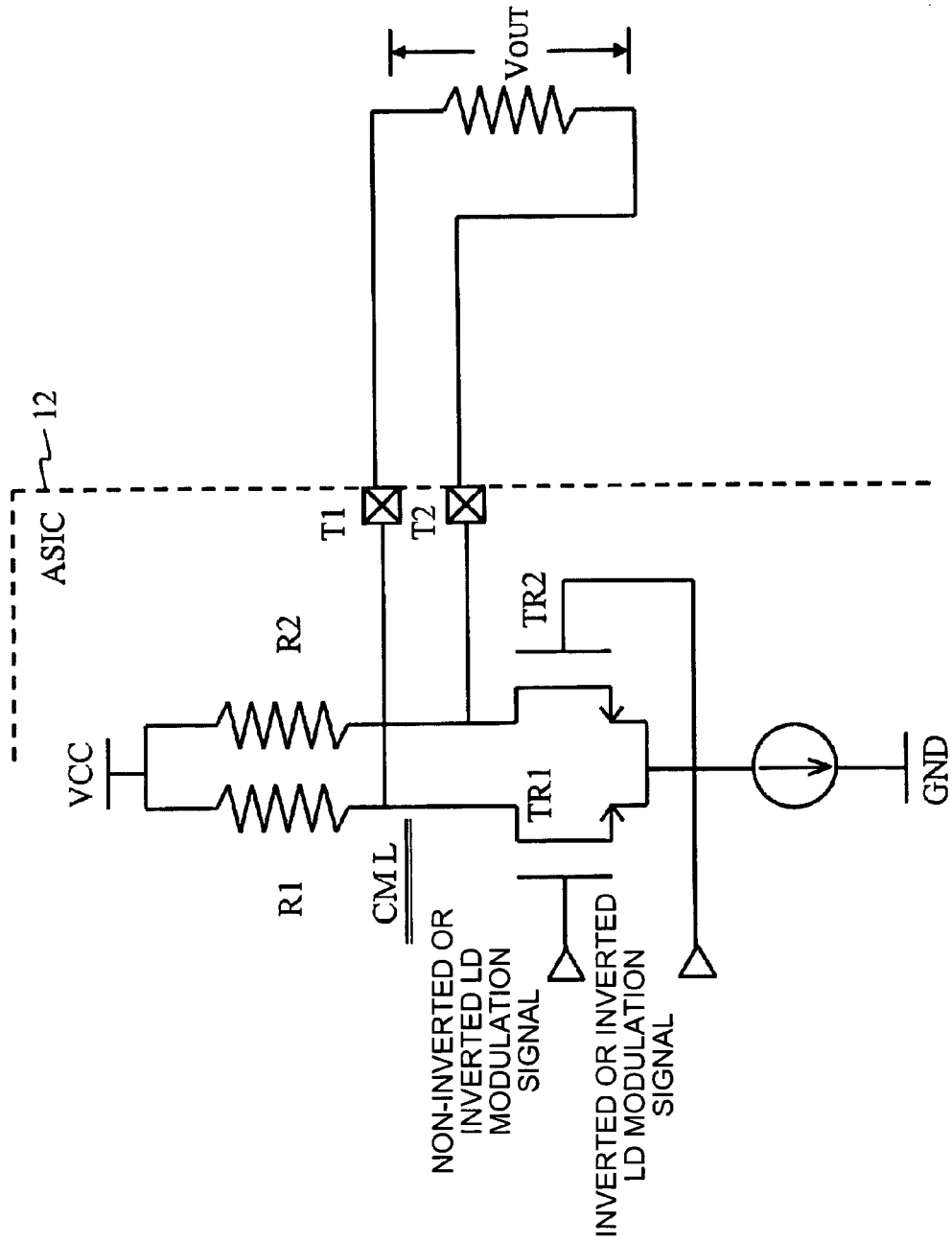
FIG. 30 is an example of a configuration of the low amplitude differential signal generating method, if low amplitude differential signal outputs are terminated by a resistor.

FIG. 30 is an example of the configuration of the low amplitude signal output unit 132 based on the CML. In FIG. 30, differential outputs (low amplitude non-inverted and inverted signals) of the CML circuit are terminated by a resistor. In FIG. 30, reference signs T1 and T2 denote output pins. Thus, the signal receiving side (low amplitude differential signal input unit 160) can retract the differential signals. The constitution of the ECL can be the same as described above.

Figure 31:
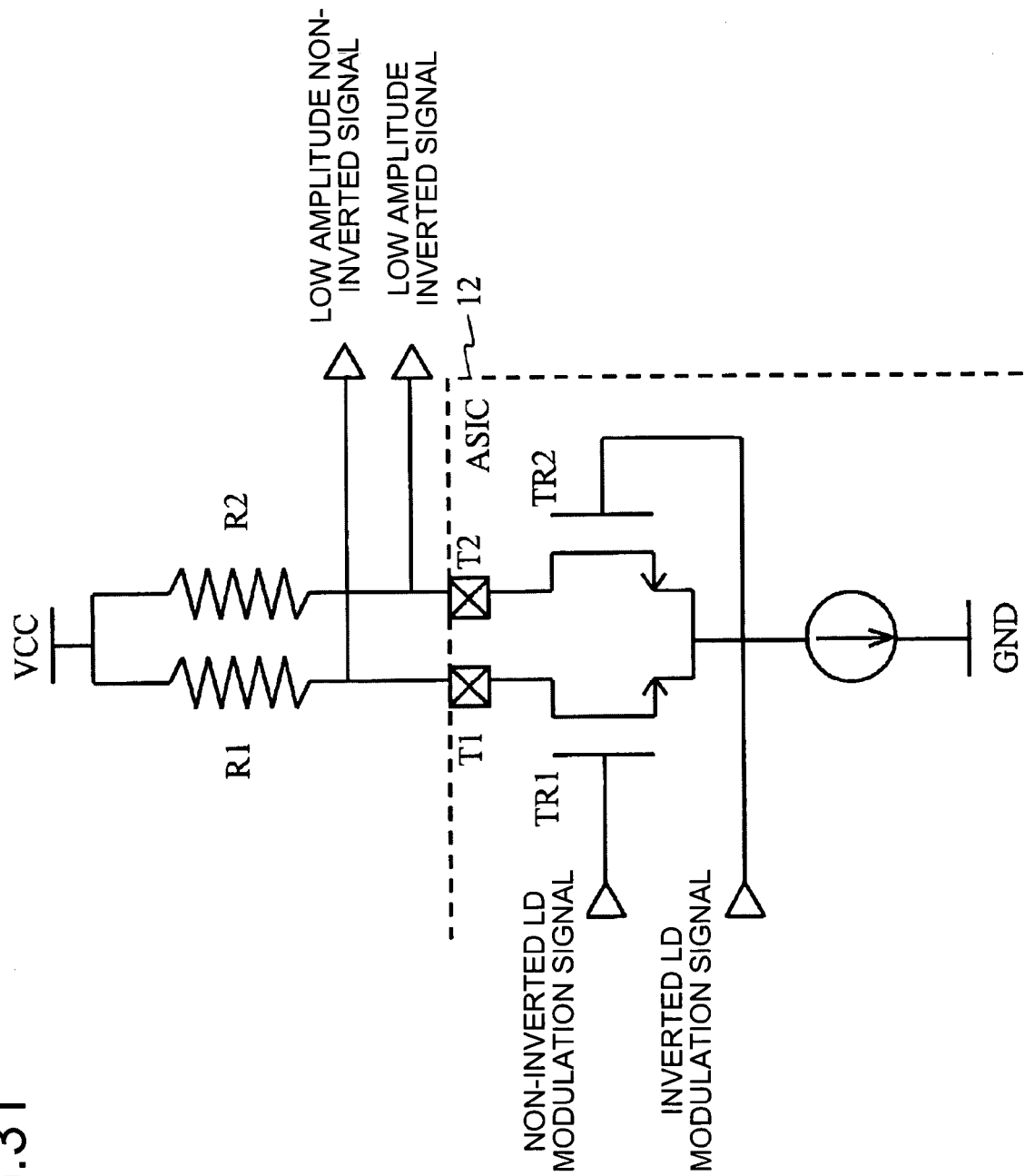
FIG. 31 is still another specific example of a configuration of the low amplitude differential signal generating method.

FIG. 31 is an example of the configuration of the low amplitude signal output unit 132 based on the CML. In FIG. 31, the low amplitude signal output unit 132 includes, as compared with that shown in FIG. 12, the load resistors R1 and R2 of the CML circuit as external components, provided outside of the ASIC. In FIG. 31, reference signs T1 and T2 denote the output pins. Thus, the external components smaller in irregularity can be employed as the load resistors R1 and R2 (while internal components included in the ASIC have larger irregularities than those of the external components), and an accurate output swing can be attained. The constitution of the ECL can be the same as described above.

Figure 32:
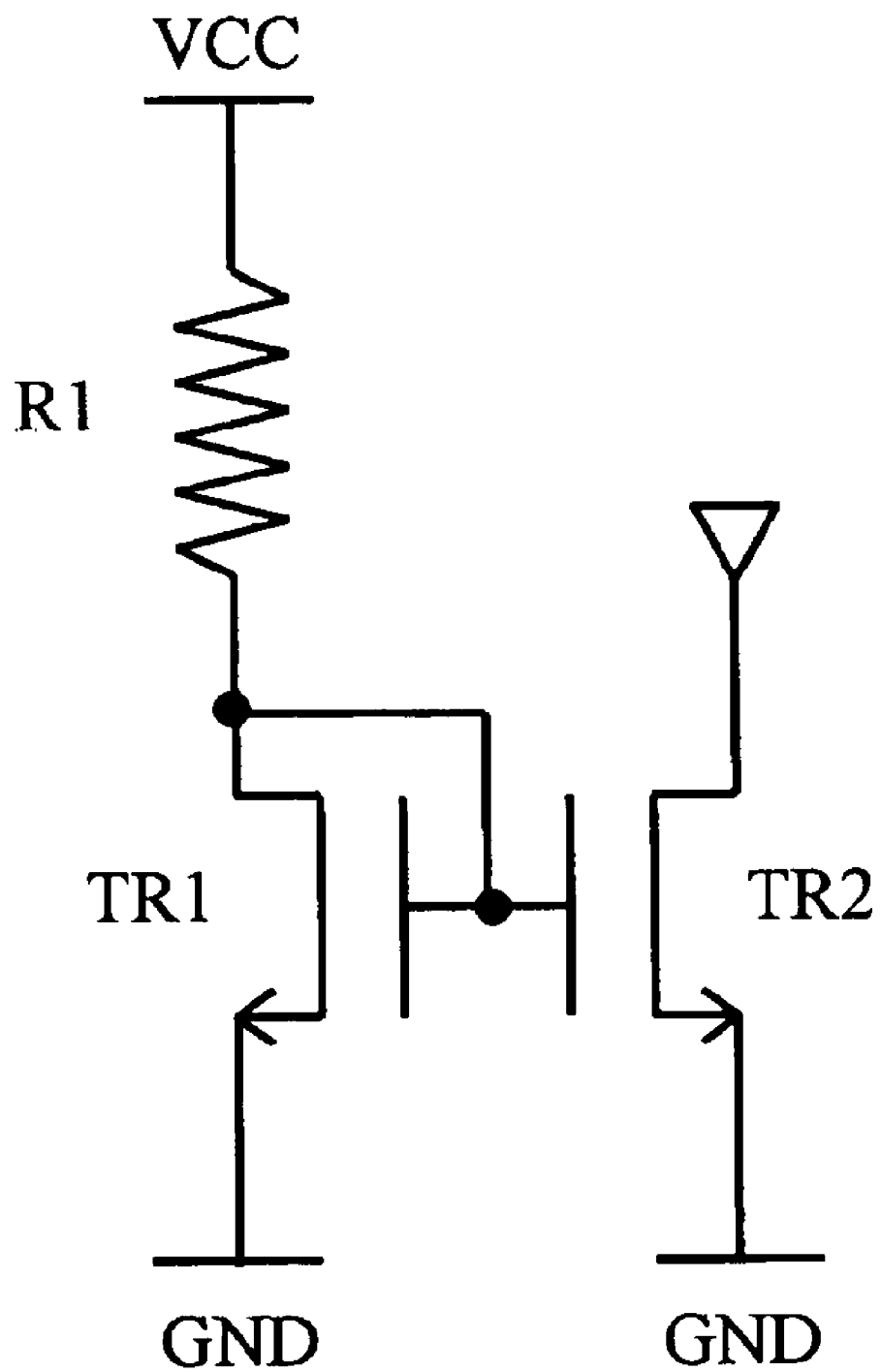
FIG. 32 is a specific example of a configuration of a current source.

FIG. 32 is an example of a configuration of the current source of the CML circuit. In the current source of FIG. 32, the current is set according to the power supply voltage VCC and the resistor R1, and the transistors TR1 and TR2 are folded by a current-mirror circuit. Thus, if the resistors provided in the CML circuit serve as the loads of the CML circuit, a fluctuation in output swing due to irregular resistance can be suppressed.

FIGS. 33 to 36 are examples of configurations of the low amplitude differential signal input unit 160 on the LD driving unit 170 side and the LD driving unit 170. The low amplitude differential signal input unit 160 is basically equal in configuration to the output stage, i.e., the low amplitude signal output unit 132 of the low amplitude differential signal output unit 130 on the LD modulation signal generation unit 120 side, except for a power supply voltage. In the low amplitude differential signal input unit 160, the differential signals (low amplitude non-inverted and inverted signals) are input to the gates of the transistors TR1 and TR2, respectively, and the differential signals are output from the unit 160. If the transistors TR1 and TR2 are CMOS transistors, the low amplitude differential signal input unit 160 is based on the LVDS. If the transistors TR1 and TR2 are bipolar transistors, the low amplitude differential signal input unit 160 is based on the ECL.

Figure 33:
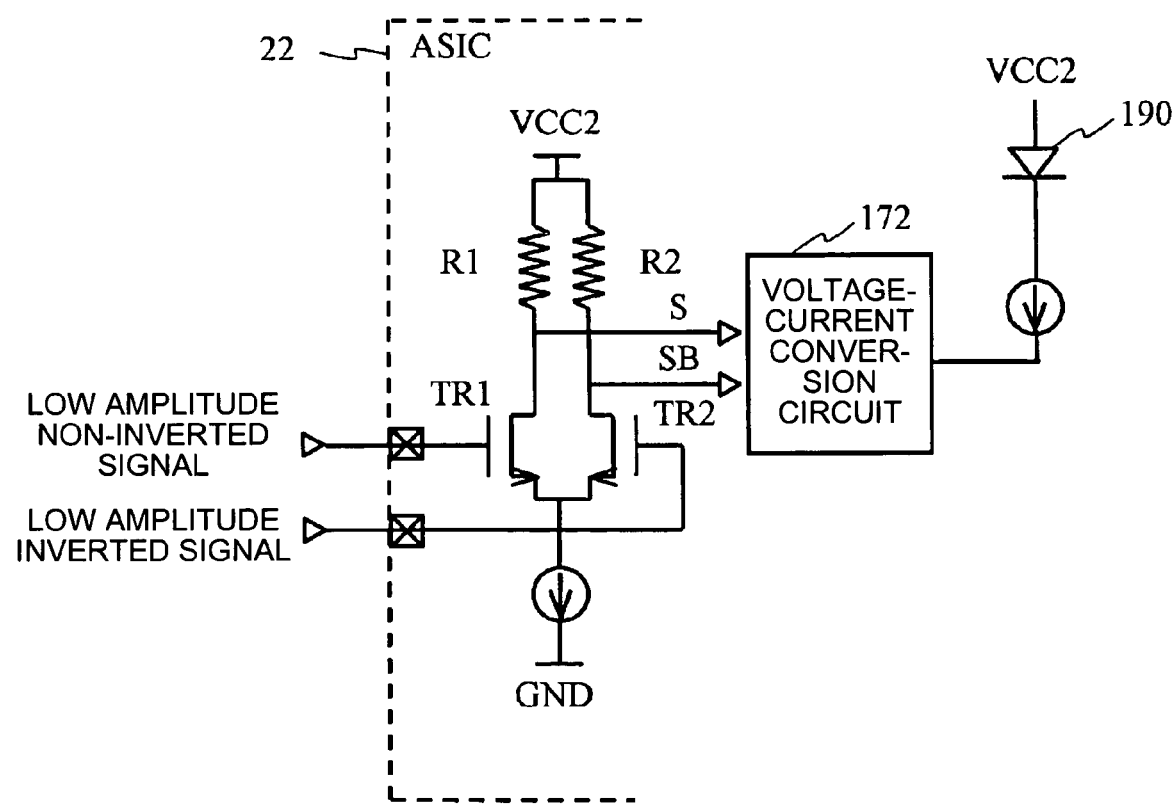
FIG. 33 is a specific example of a configuration of a low amplitude differential signal input unit and a configuration of an LD driving unit.
Figure 34:
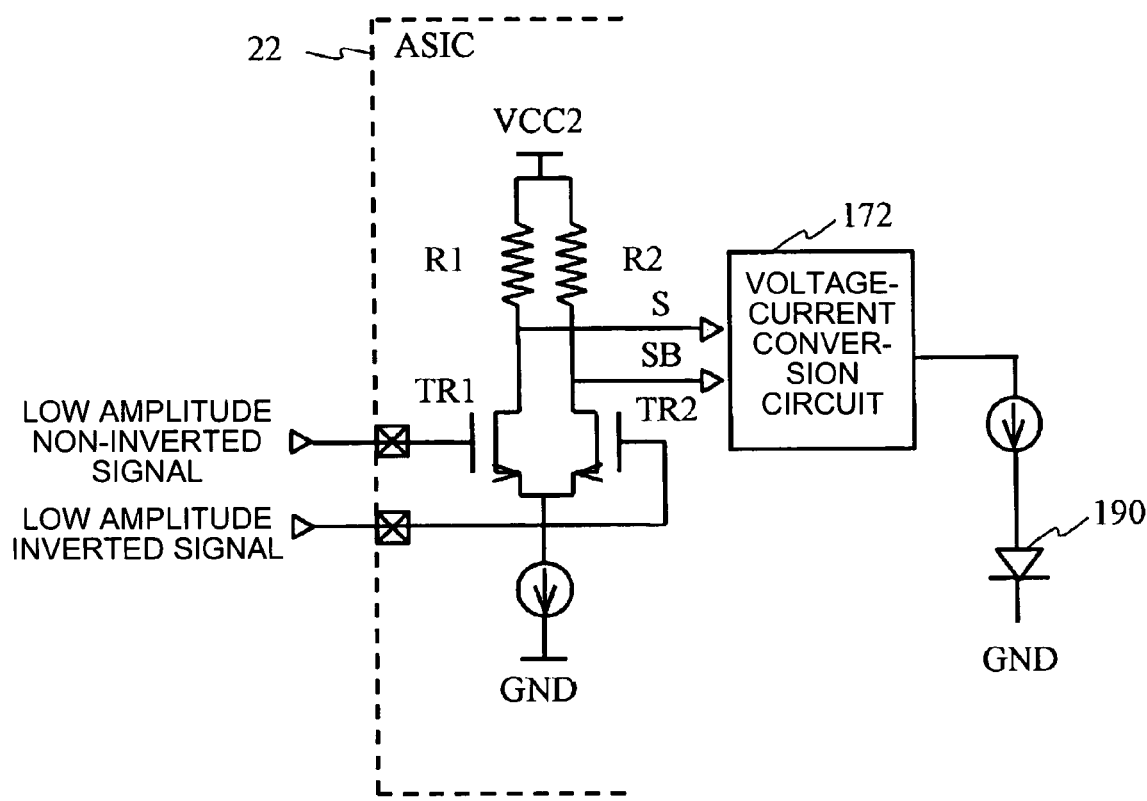
FIG. 34 is another specific example of a configuration of the low amplitude differential signal input unit and a configuration of the LD driving unit.

FIGS. 33 and 34 are the examples in which a voltage-current conversion circuit 172 is employed in a driving unit for the semiconductor laser (LD) 190, one of or both of differential signal outputs S and SB are combined to convert a voltage into a current, and the LD 190 is driven by the current. FIG. 33 is the example in which the LD 190 is an anode common type LD, and FIG. 34 is the example in which the LD 190 is a cathode common type LD.

Figure 35:
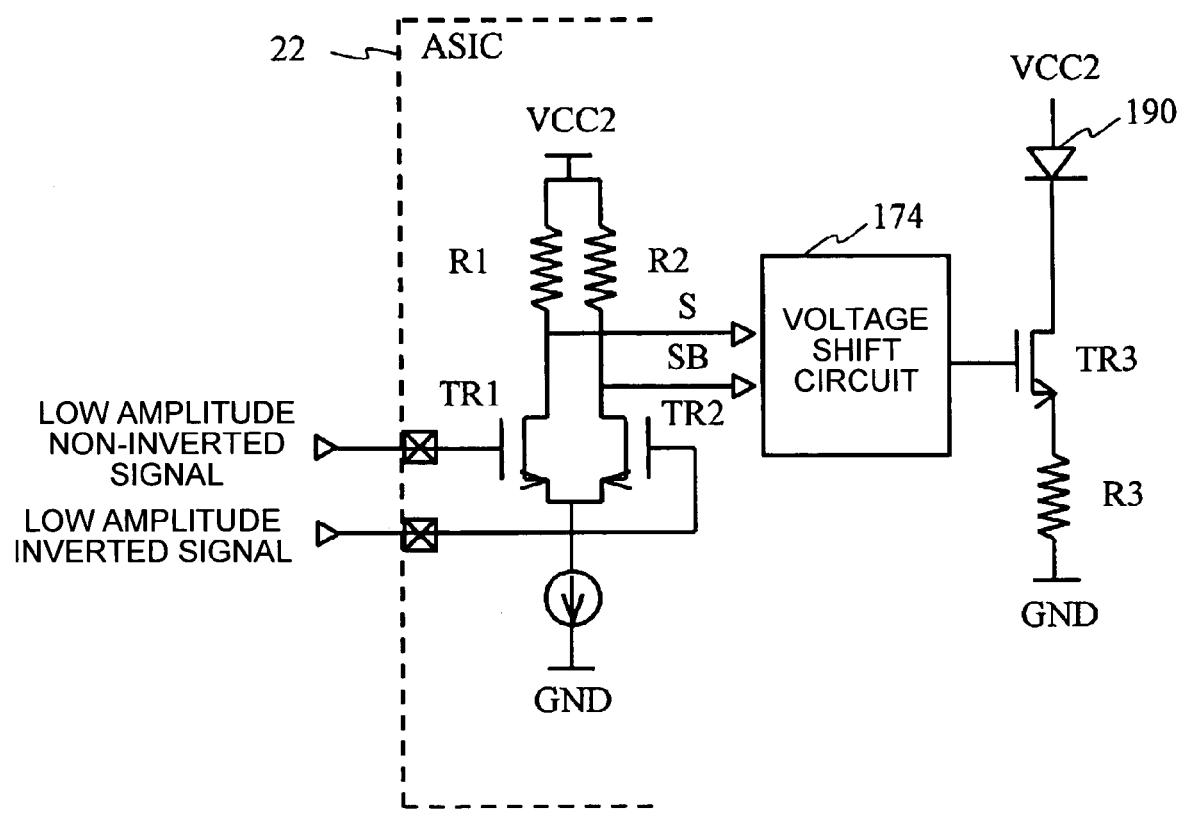
FIG. 35 is another specific example of a configuration of the low amplitude differential signal input unit and the configuration of the LD driving unit.
Figure 36:
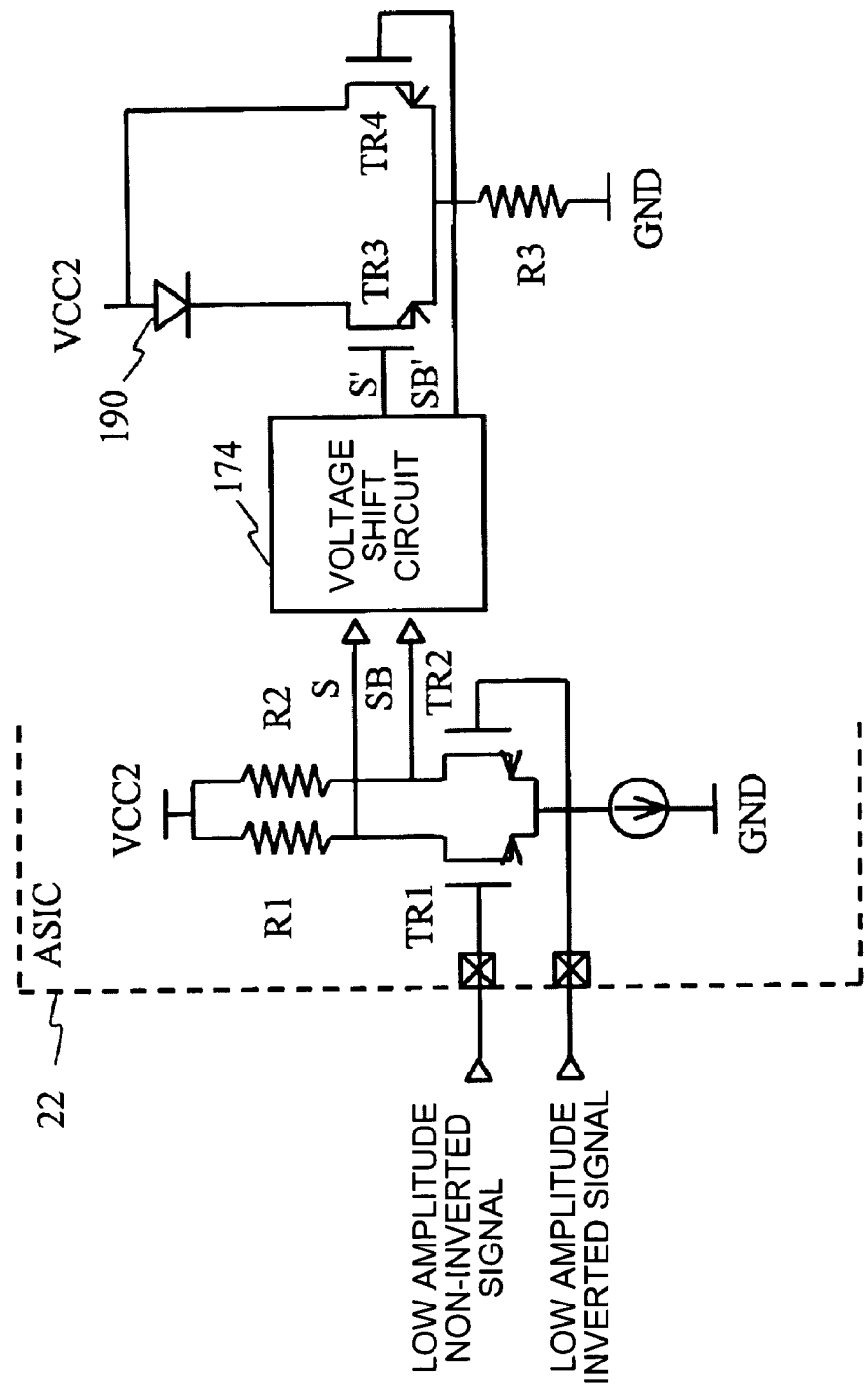
FIG. 36 is another specific example of a configuration of the low amplitude differential signal input unit and the configuration of the LD driving unit.

FIGS. 35 and 36 are the examples in which a voltage shift circuit 174 is employed, and the LD 190 is driven by the voltage. In the example of FIG. 35, a level of one of the differential signal outputs S and SB is shifted by the voltage shift circuit 174, the transistor TR3 is driven by an output of the voltage shift circuit 174, and the LD 190 is thereby driven by the voltage. In the example of FIG. 36, levels of both the differential signal outputs S and SB are shifted by the voltage shift circuit 174, the transistors TR3 and TR4 are driven by outputs S' and SB' of the voltage shift circuit 174, and the LD 190 is driven by the voltage difference. With the configuration shown in FIG. 36, the switching rate can be accelerated.

In the examples of FIGS. 33 to 36, the voltage of the low amplitude differential signal input unit 160 and the voltage of the LD driving unit 170 both, is the voltage VCC2. Needless to say, as shown in FIG. 10, these voltages may be different from each other.

Next, an interface between the low amplitude differential signal output unit 130 on the LD modulation signal generation unit 120 side and the low amplitude differential signal input unit 160 on the LD driving unit 170 side will be explained.

Figure 37:
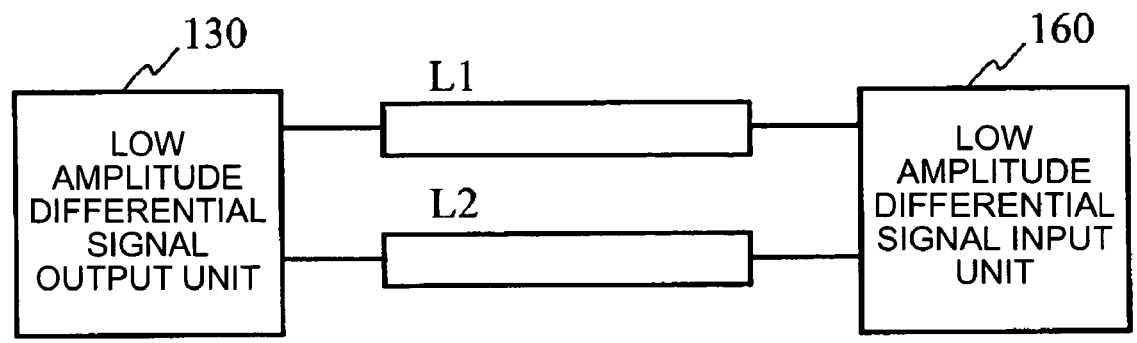
FIG. 37 is a conceptual view of an interface between the low amplitude differential signal output unit and the low amplitude differential signal input unit.
Figure 38:
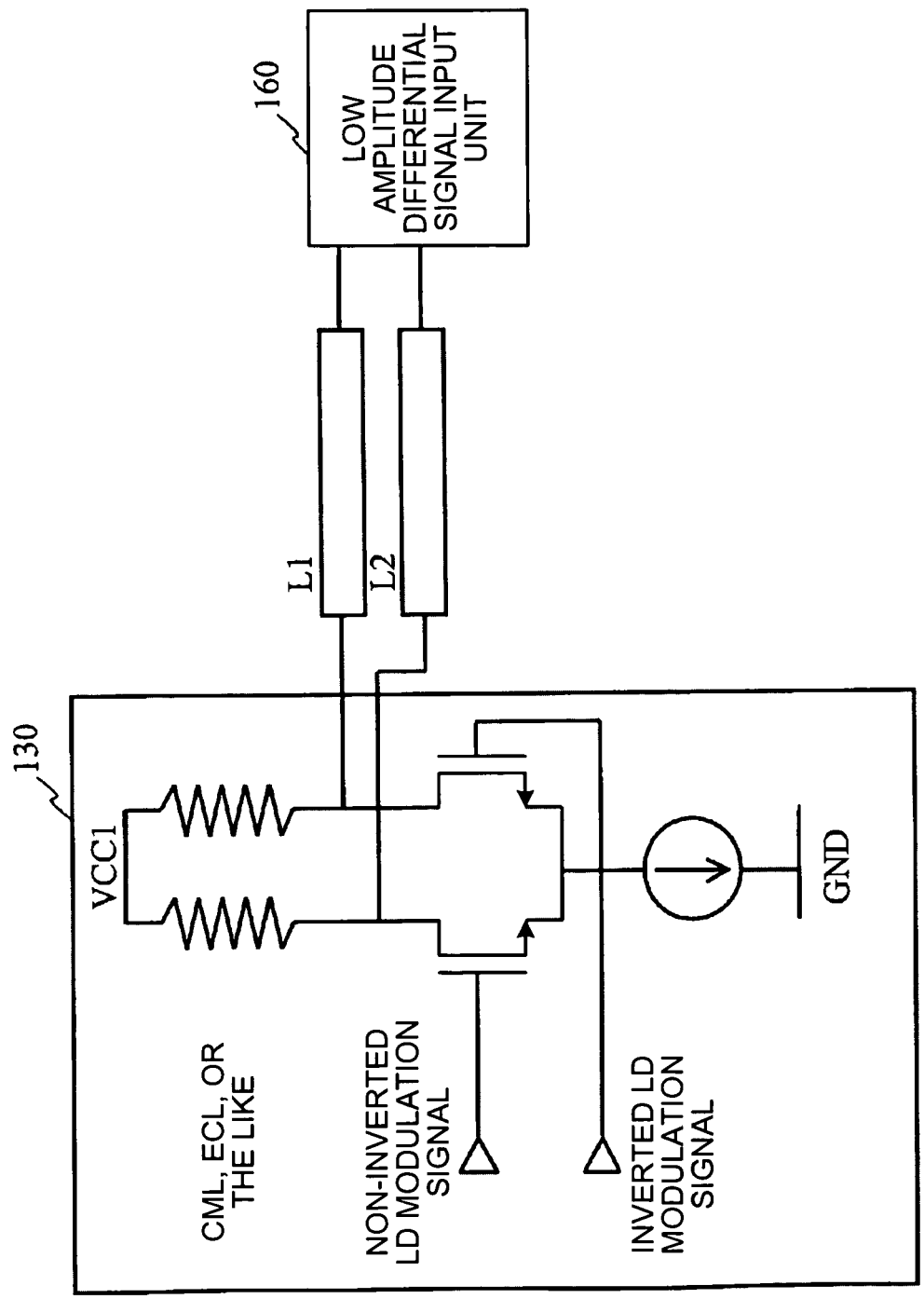
FIG. 38 is an example of a configuration of the interface between the low amplitude differential signal output unit and the low amplitude differential signal input unit.

FIG. 37 is a conceptual view of an interface between the low amplitude differential signal output unit 130 that serves as an output unit of the LD modulation signal generation unit 120, and the low amplitude differential signal input unit 160 that serves as an input unit of the LD driving unit 170. FIG. 37 illustrates that both the units 130 and 160 are connected to each other by transmission lines L1 and L2. FIG. 38 is an example of the configuration of the interface in which an output stage (the low amplitude signal output unit 132 shown in FIG. 9) of the low amplitude differential signal output unit 130 is constituted by the CML or ECL circuit. By constituting the output stage of the low amplitude differential signal output unit 130 by the CML or ECL circuit, the signals can be transmitted at a higher rate. Needless to say, the output stage of the low amplitude differential signal output unit 130 may be formed by the LVDS circuit.

Figure 39:
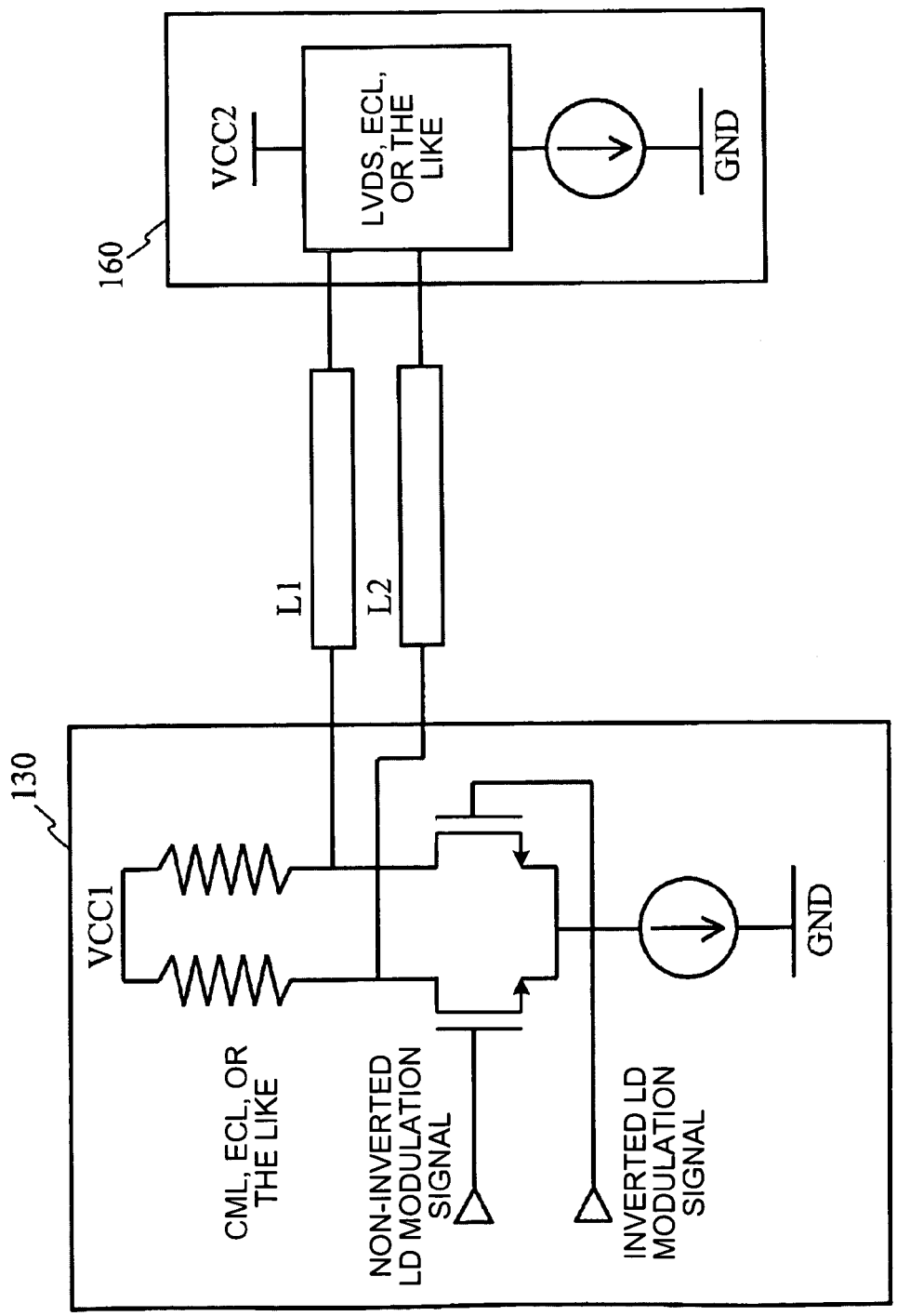
FIG. 39 is another example of a configuration of the interface between the low amplitude differential signal output unit and the low amplitude differential signal input unit.

FIG. 39 is another example of a configuration of the interface in which the output stage of the low amplitude differential signal output unit 130 is constituted by the CML or ECL circuit, the power supply voltage of the low amplitude differential signal output unit 130 is VCC1, the low amplitude differential signal input unit 160 on the LD driving unit 170 side is constituted by a different logic (e.g., the LDVS or the ECL circuit) from that of the output stage of the low amplitude differential signal output unit 130, and the power supply voltage of the low amplitude differential signal input unit 160 is VCC2. By setting the VCC1 and the VCC2 at, for example, 1.8 volts and 5 volts, respectively, the low amplitude differential signal output unit 130 can be accelerated and integrated at high density, together with the LD modulation signal generation unit 120, and a sufficient voltage to drive the semiconductor laser (LD) can be supplied to the LD driving unit 170.

Figure 40:
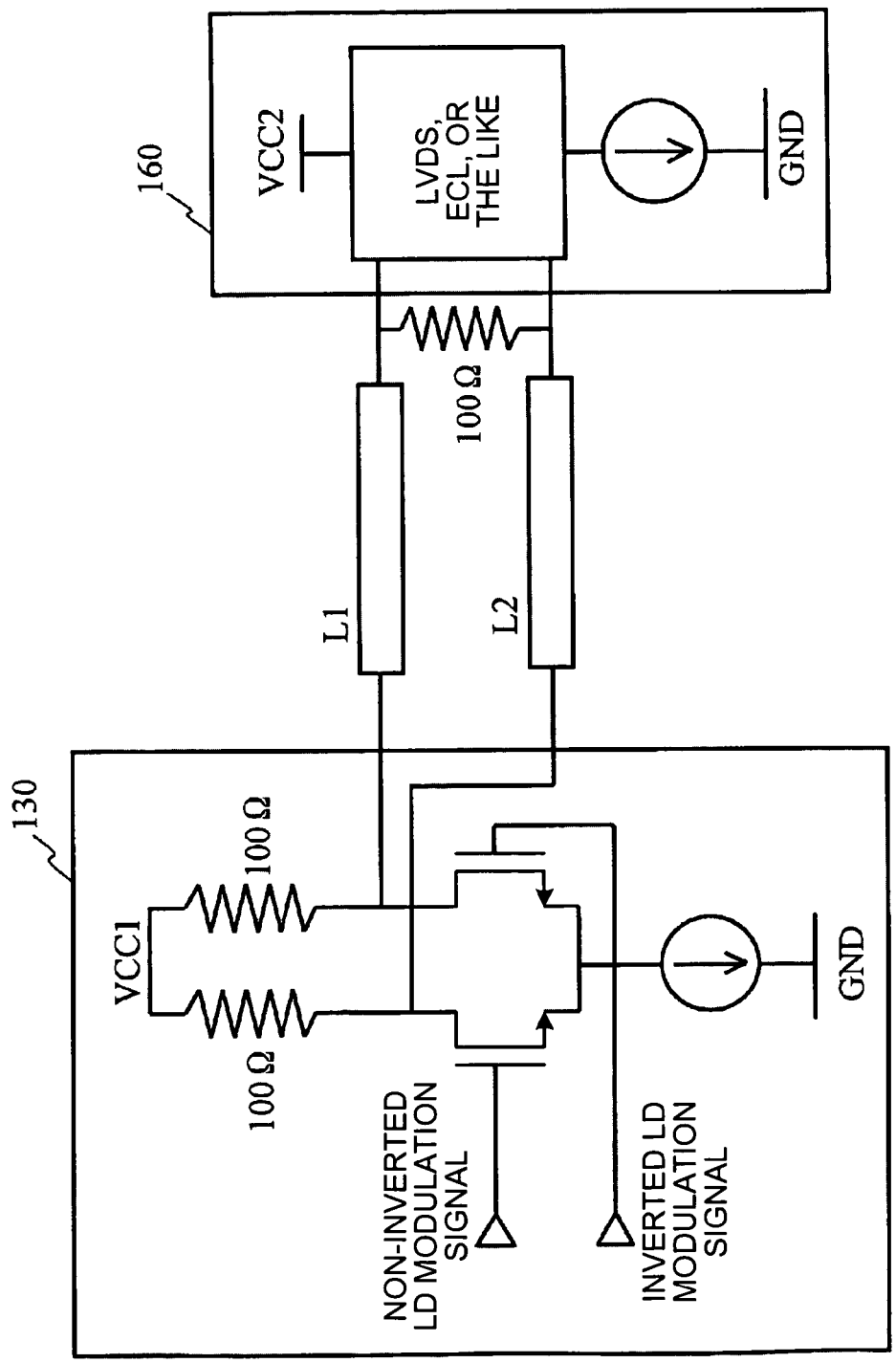
FIG. 40 is another example of a configuration of the interface between the low amplitude differential signal output unit and the low amplitude differential signal input unit.

FIG. 40 is an example in which an impedance matching is done between the transmission line and the resistors in the configuration shown in FIG. 39. If an impedance of the transmission lines L1 and L2 is, for example, 100 ohms, an impedance of every resistor is set at 100 ohms. By so setting, signals can be transmitted accurately with less noise. It is, however, necessary to separately provide a resistor outside of the units 130 and 160.

Next, an example of a configuration of an impedance correction unit according to the present invention will be explained. In this example, the impedance correction unit is terminated by the ground. Alternatively, the impedance correction unit can be terminated by the power supply voltage, or the input and output terminal.

Figure 41:
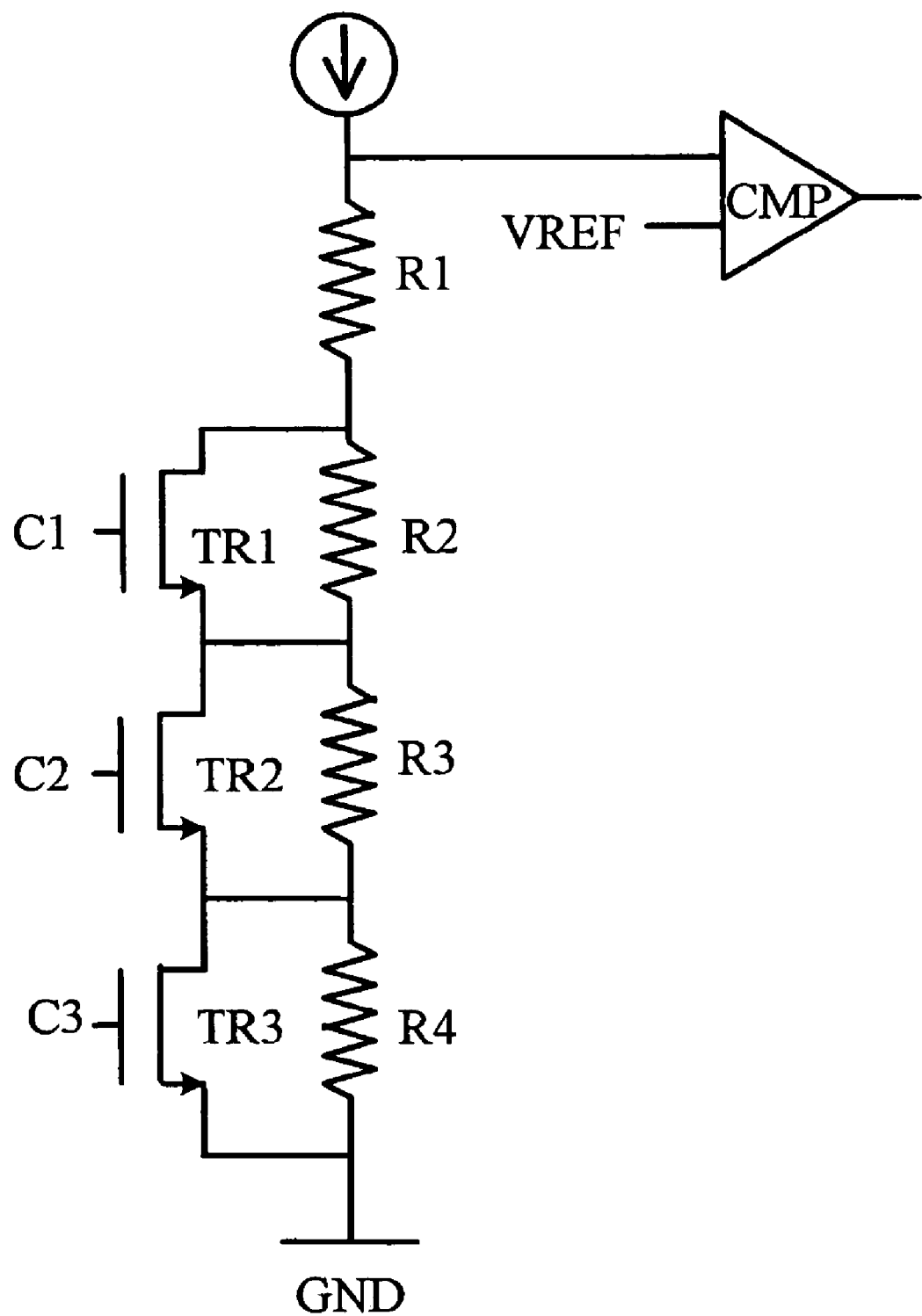
FIG. 41 is an example of a configuration of an impedance correction unit according to the present invention.

FIG. 41 is an example of a configuration of the impedance correction unit that includes resistors R1 to R4 connected in series and the transistors TR1 to TR3 connected to the resistors R2 to R4, respectively in parallel as switches. In FIG. 41, by applying a constant current from above and comparing an output voltage at that time with the reference voltage VREF, the impedances are corrected. The transistors TR1 to TR3 are turned on and short-circuited when control signals C1, C2, and C3 of the transistors TR1 to TR3 are high, respectively. By changing the control signals C1, C2, and C3 so that the impedances are sequentially lower or higher, and setting values of the control signals C1, C2, and C3 when an output of a comparator CMP is changed in a register or the like, the impedances can be corrected to desired values, respectively.

According to the configuration shown in FIG. 41, it is unnecessary to provide the external resistor shown in FIG. 40, and the impedance matching can be accurately realized if the resistors have large irregularities and are included in the integrated circuit. In addition, by setting the resistances of the resistors R1, R2, R3, and R4 at appropriate values, the impedances can be adjusted more finely.

Figure 42:
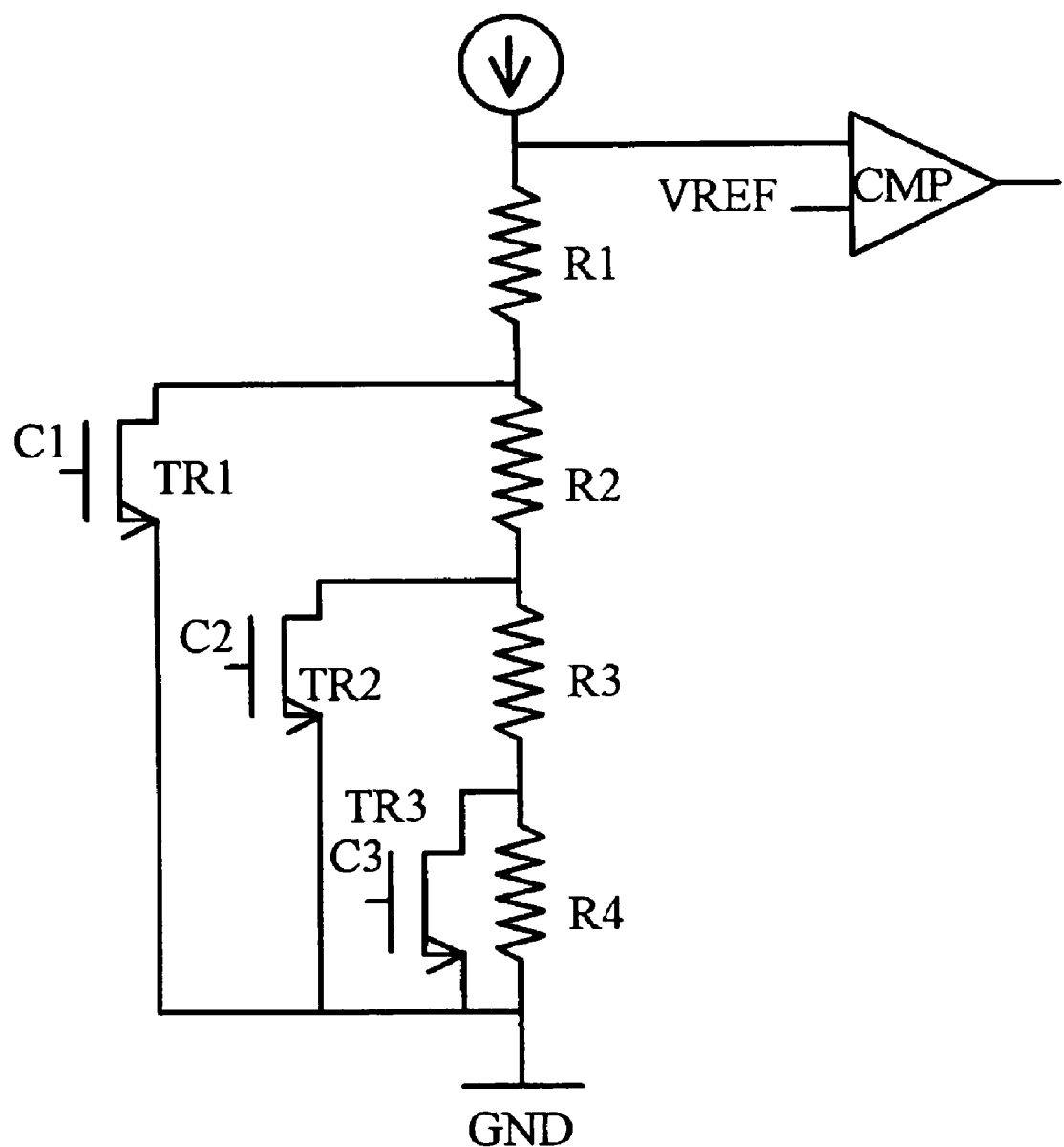
FIG. 42 is another example of a configuration of the impedance correction unit according to the present invention.

FIG. 42 is an example of a configuration of the impedance correction unit in which sources of the transistors TR1 to TR3 serving as switches are connected to the ground. Similarly to the example of FIG. 41, by sequentially changing the control signals C1, C2, and C3 and setting the values of the control signals C1, C2, and C3 when the output of the comparator CMP is changed in the register or the like, the impedances can be corrected to the desired values. According to this configuration, by short-circuiting one transistor, parasitic capacity of each transistor can be reduced.

In the example of FIG. 42, one side of each switch is connected in common to the ground. If the power supply and the ground are considered to be arranged the other way round, that is, if one side of each switch is connected to the power supply, the same advantage can be attained. Further, even if the impedance matching correction unit is formed such that the one side of each switch is connected in common to the input and output terminal, it suffices to turn on only one switch, and therefore, the same advantage can be attained.

Figure 43:
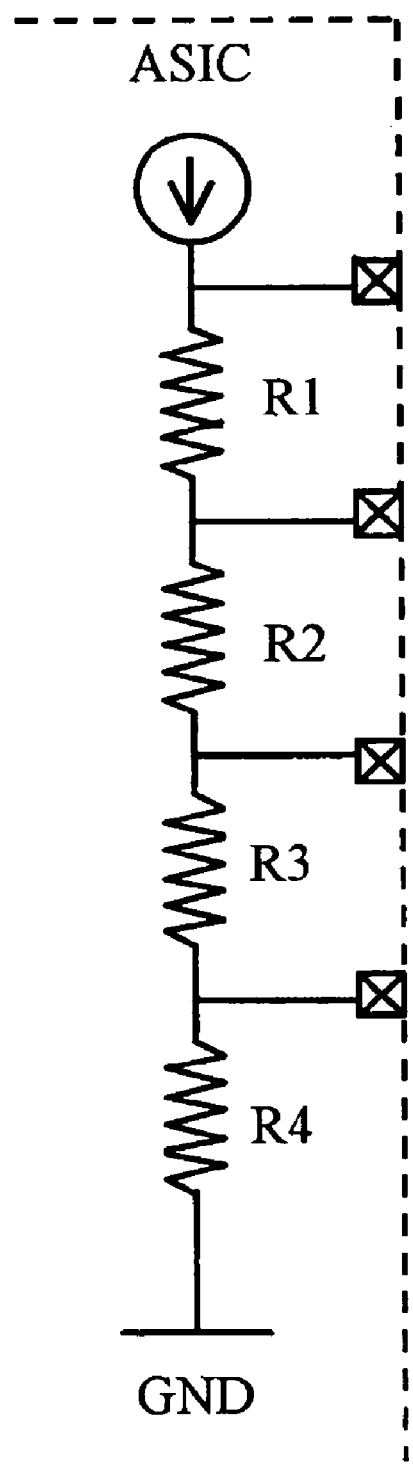
FIG. 43 is another example of a configuration of the impedance correction unit according to the present invention.

FIG. 43 is an example of the configuration of the impedance correction unit in which terminals of the respective resistors R1 to R4 are output to external pins. With this configuration, by causing a short-circuit between the external pins, the impedances are corrected to the desired values, respectively. If so, the ON resistance of the transistors, which is generated when the transistors are employed as switches as shown in FIGS. 41 and 42, can be eliminated.

Figure 44:
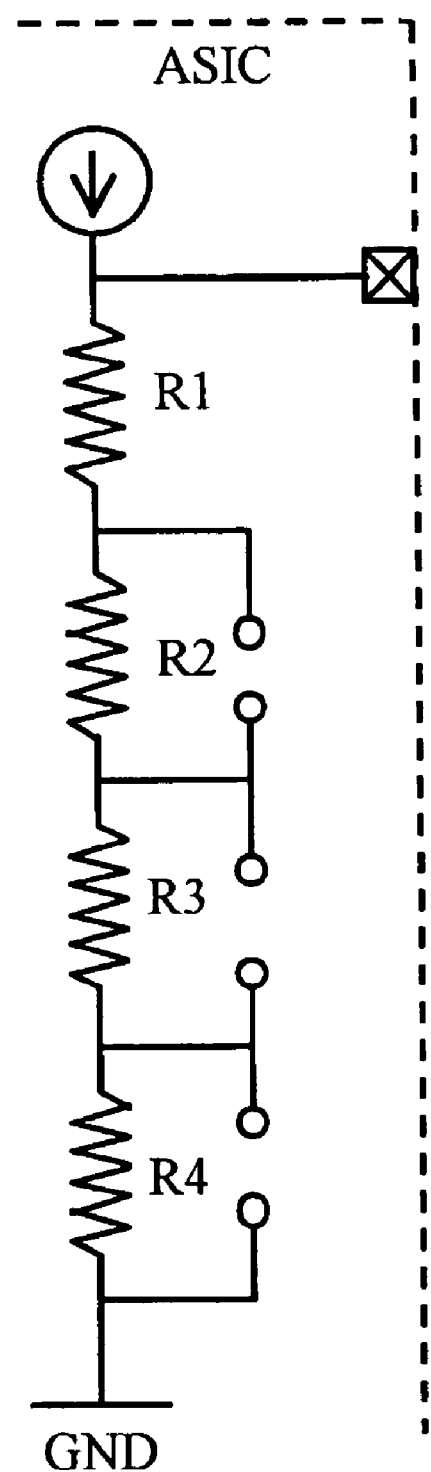
FIG. 44 is another example of a configuration of the impedance correction unit according to the present invention.

FIG. 44 is an example of a configuration of the impedance correction unit in which the terminals of the respective resistors R1 to R4 can be short-circuited by laser emission. If a temperature characteristic of each of the resistors R1 to R4 included in the integrated circuit is good (less dependent on temperature), the terminals of the respective resistors R1 to R4 are subjected to a laser short machining to obtain the desired resistances while detecting the resistances during shipping. The laser shorting enables the respective impedances to be corrected to the desired values without any ON resistance and without an increase in the number of external pins.

Figure 45:
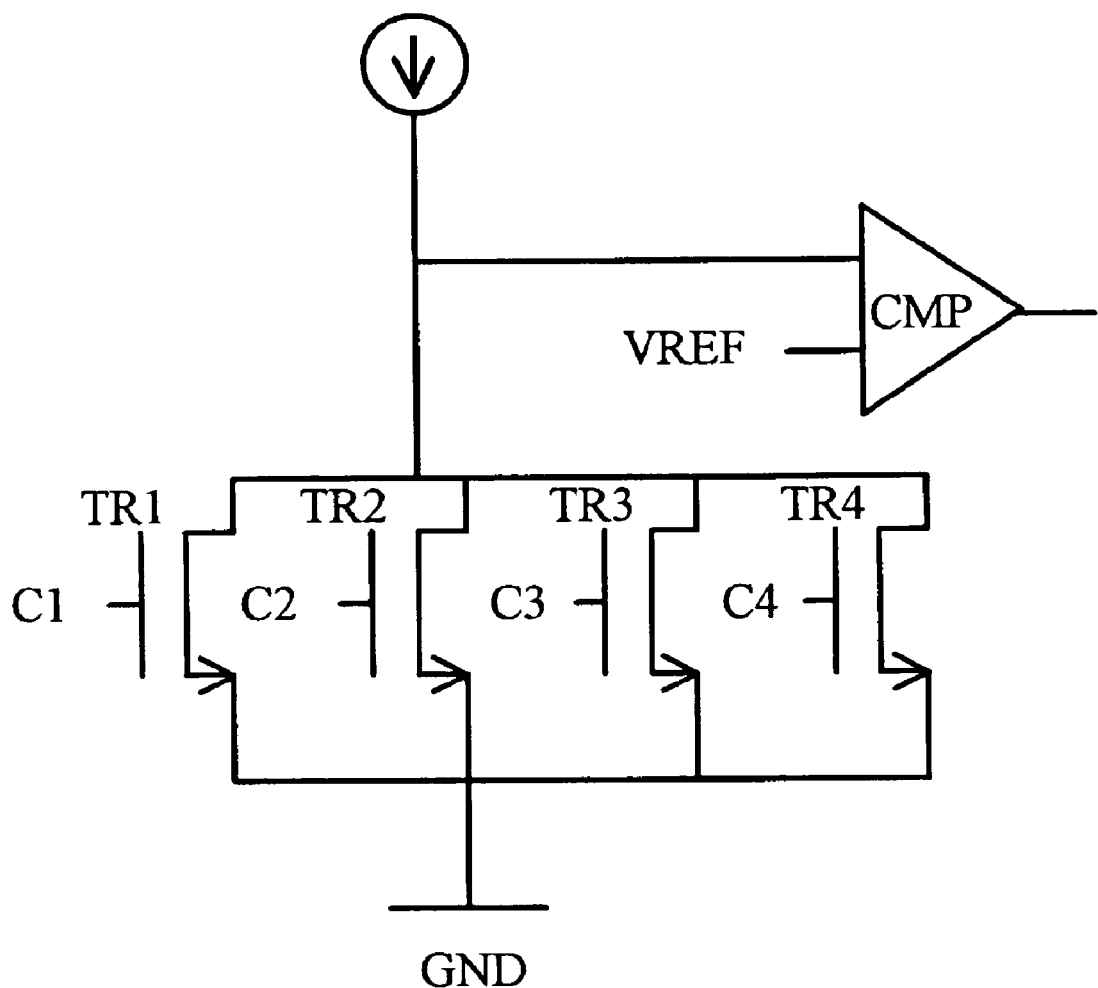
FIG. 45 is another example of a configuration of the impedance correction unit according to the present invention.

FIG. 45 is an example of a configuration of the impedance correction unit in which the transistors TR1 to TR4 are connected in parallel in place of the resistors R1 to R4 shown in FIGS. 41 to 44. In FIG. 45, by applying the constant current from above, and comparing the output voltage at that time with the reference voltage, the respective impedances are corrected. When the control signals C1, C2, C3, and C4 are high, the corresponding transistors TR1 to TR4 are turned on, and ON resistances thereof are generated. Similar to the above examples, by changing the control signals C1, C2, C3, and C4 so that the impedances are sequentially lower or higher, and setting the values of the control signals C1, C2, C3, and C4 when the output of the comparator CMP is changed in the resistor or the like, the respective impedances can be corrected to the desired values.

According to the configuration shown in FIG. 45, the accurate impedance matching can be made without the need to provide the external resistor as shown in FIG. 40, and without using the resistors having large irregularities and included within the integrated circuit as shown in FIGS. 41 to 44. Further, by setting sizes of the respective transistors TR1 to TR4 at appropriate values, the impedances can be adjusted more finely.

Figure 46:
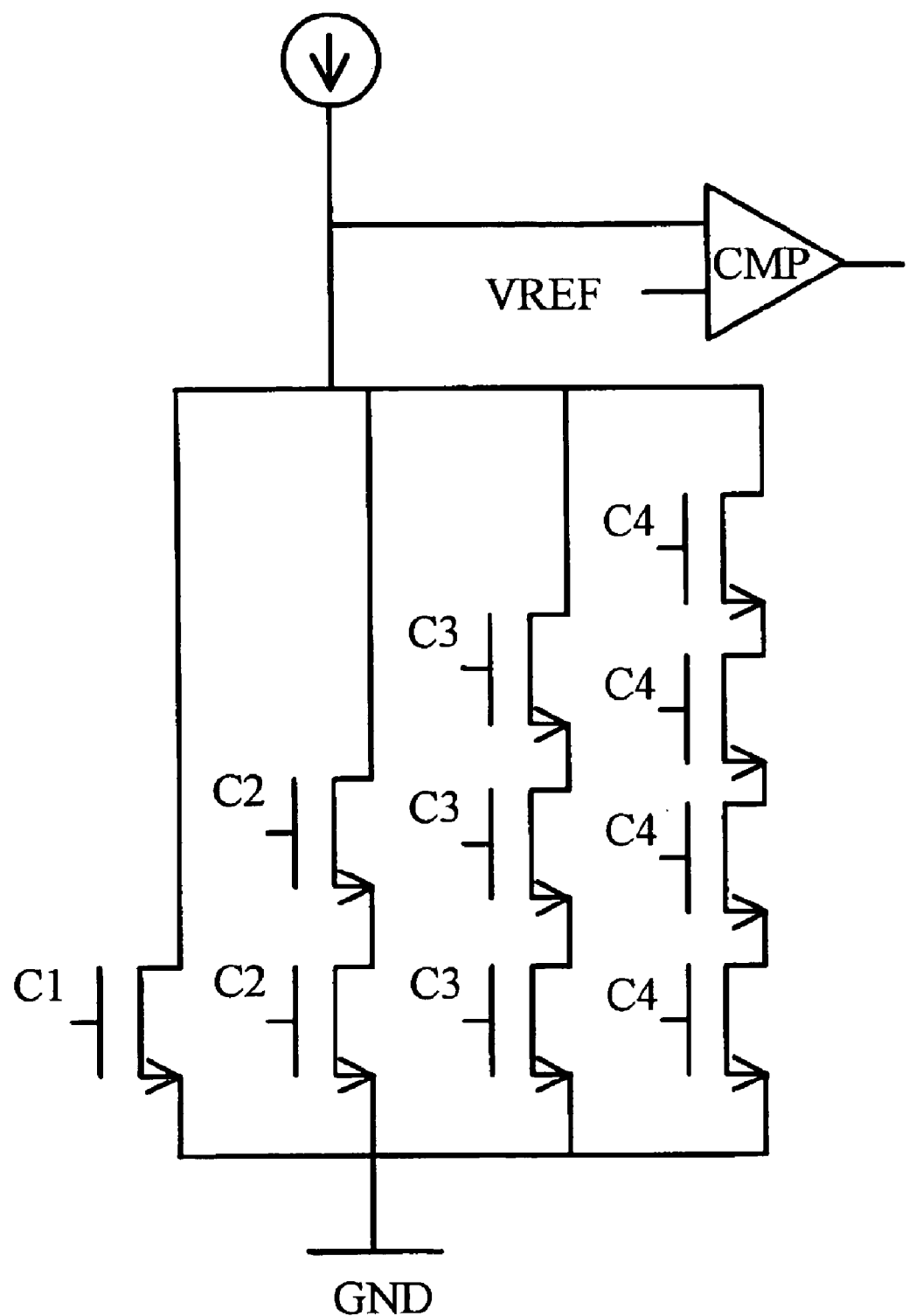
FIG. 46 is another example of a configuration of the impedance correction unit according to the present invention.

FIG. 46 is an example of a configuration of the impedance correction unit in which each of four stages of transistors are connected in series. Thus, even if transistors equal in size are employed, then different ON resistances can be generated, the respective impedances can be finely corrected, and a layout can be simplified.

Figure 47:
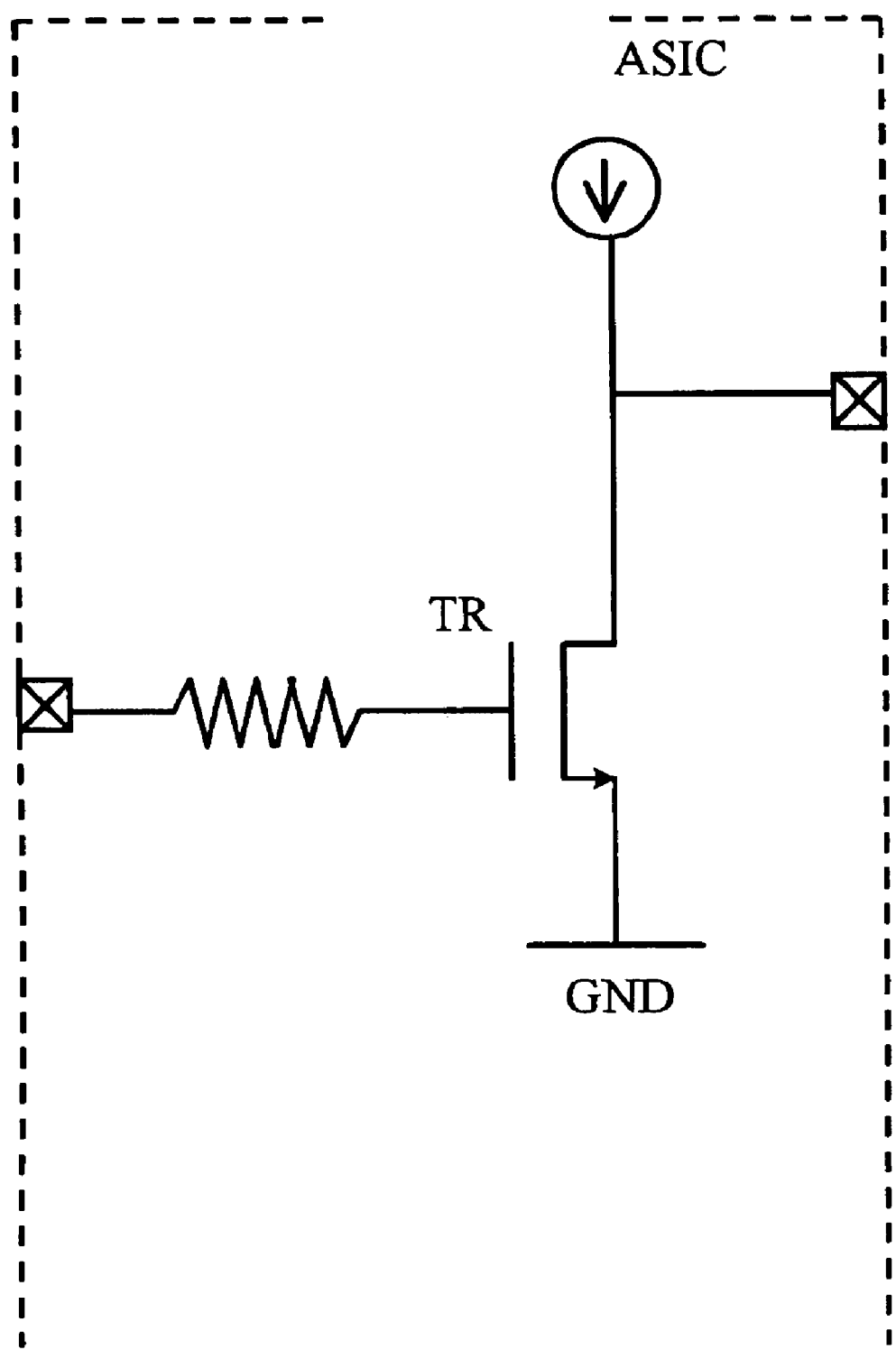
FIG. 47 is another example of a configuration of the impedance correction unit according to the present invention.

FIG. 47 is an example of a configuration of the impedance correction unit in which a gate of a transistor TR is output to an external terminal (external pin), and a gate voltage of the transistor TR is adjusted from outside, thereby making an ON resistance of the transistor TR to have a desired impedance. In this example, because the impedance correction unit can include one transistor, the impedance correction unit can be realized by a simple configuration.

Figure 48:
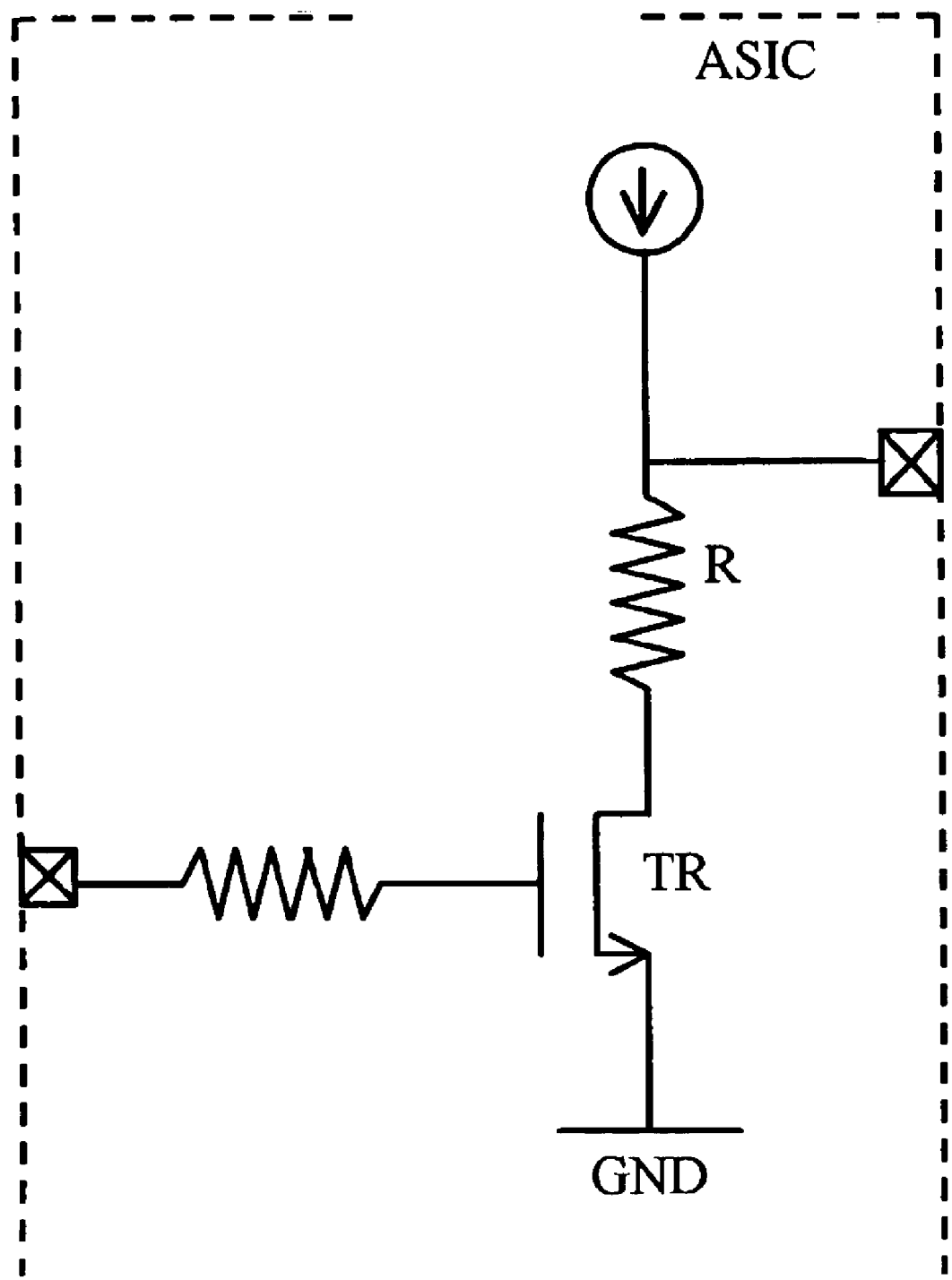
FIG. 48 is another example of a configuration of the impedance correction unit according to the present invention.

FIG. 48 is an example of the configuration of the impedance matching unit in which a resistor R is additionally provided in the configuration shown in FIG. 47. By so constituting, the impedance correction unit is capable of absorbing irregularities, suppressing irregularity of the transistor, and strongly resisting a temperature change.

Figure 49:
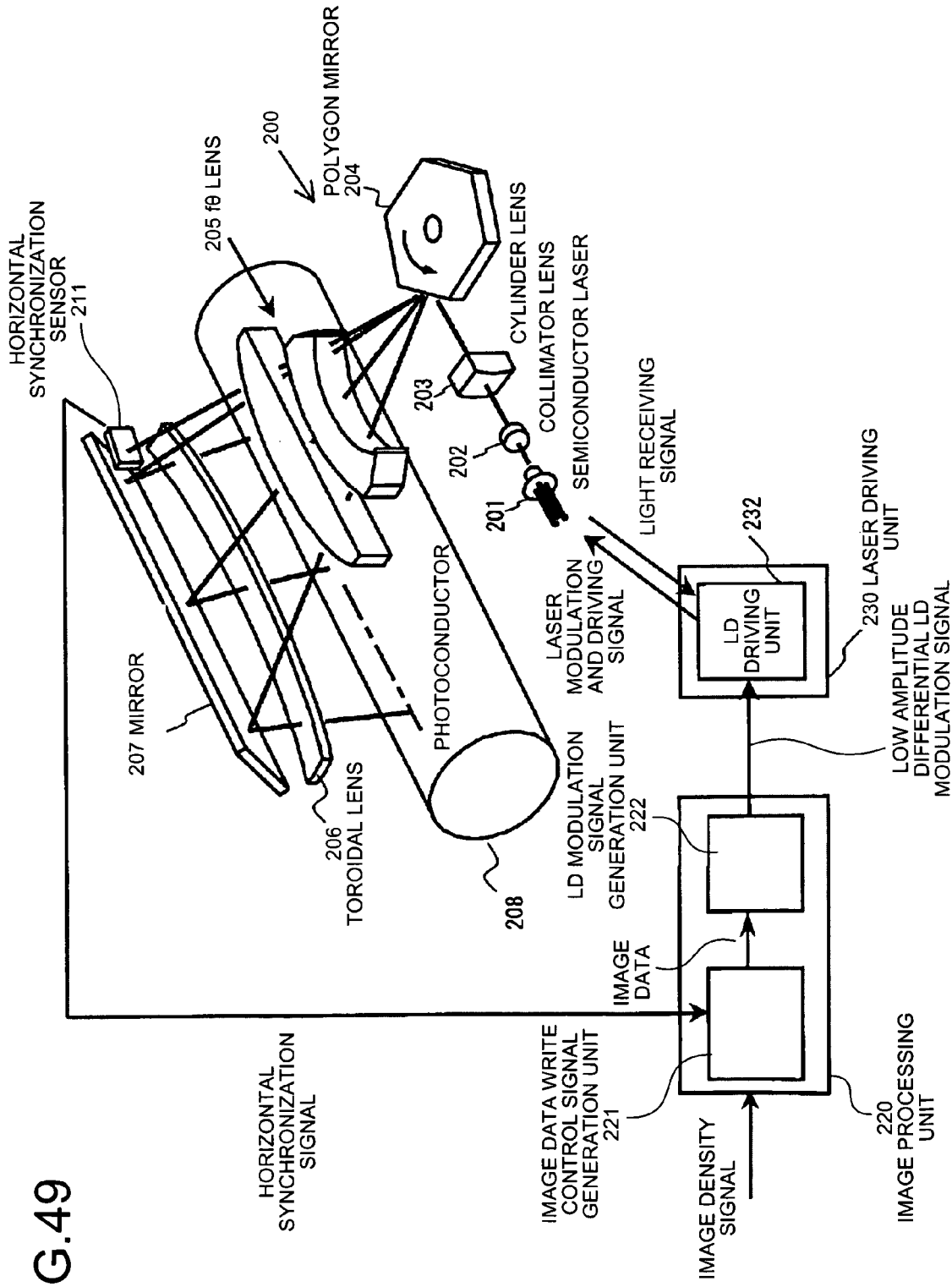
FIG. 49 is an overall block diagram of a single beam scanning image forming apparatus, to which the semiconductor laser modulation driving apparatus according to the present invention is applied, according to one embodiment of the present invention.

FIG. 49 is an overall block diagram of an image forming apparatus, to which the semiconductor laser modulation driving apparatus according to the present invention is applied, according to one embodiment of the present invention. In FIG. 49, a laser scanning optical system 200 is a single-beam scanning optical system. An image processing unit 220 (PCB1/ASIC1) basically includes an image data write control signal generation unit 221 and an LD modulation signal generation unit 222. A laser driving unit 230 (PCB2/ASIC2) mainly includes an LD driving unit 232.

In the image processing unit 220, the image data write control signal generation unit 221 generically represents a combination of the image data generation unit 110, a high frequency clock generation unit 140, an image clock generation unit 150, and the like, which are shown in FIGS. 8 and 10. Specifically, the LD modulation signal generation unit 222 includes the LD modulation signal generation unit 120 and the low amplitude differential signal output unit 130. In addition, the LD driving unit 232 in the laser driving unit 230 includes the low amplitude differential signal input unit 160 and the LD driving unit 170.

A modulated laser light emitted from a semiconductor laser (LD) 201 passes through a collimator lens 202 and a cylinder lens 203, and is scanned by a polygon mirror 204. Further, the modulated laser light passes through an fθ lens 205 and a toroidal lens 206, is reflected by a mirror 207, and is incident on a photoconductor 208, thereby forming an image (electrostatic latent image) on the photoconductor 208. A write starting position is detected by a horizontal synchronization sensor 211 during each scan, and applied to the image data write control signal generation unit 221 included in the image processing unit 220, as a horizontal synchronization signal. The image data write control signal generation unit 221 generates a pixel clock synchronized with the horizontal synchronization signal, inputs an image read by an image input apparatus (not shown) such as a scanner, and generates image data synchronized with the horizontal synchronization signal and the pixel clock. This image data is normally generated in view of a photosensitive characteristic of the photoconductor. The image data write control signal generation unit 221 also includes functions such as a counter for a main scan direction and a counter for a sub scan direction. The unit 221, therefore, generates not only the image data, but also a necessary write control signal and the like. The LD modulation signal generation unit 222 generates the low amplitude differential LD modulation signals, i.e., the low amplitude non-inverted signal and the low amplitude inverted signal as already explained above, and transmits the signals to the laser driving unit 230. The constituent elements including input and output units and transmission lines undergo impedance matching. The LD driving unit 232 in the laser driving unit 230 generates a necessary laser modulation and driving signal using the low amplitude differential LD modulation signals input thereto as explained so far, and controls driving of the semiconductor laser 201. The LD driving unit 232 thereby modulates a light output by the semiconductor laser 201. Further, the laser driving unit 230 controls a current supplied to the semiconductor laser 201 or the like, so that an output of the semiconductor laser is a predetermined value.

If the laser modulation driving apparatus according to the present invention is to be applied to a multi-beam scanning apparatus (explained later), then the image processing unit 220 may include a plurality of LD modulation signal generation units 222 so as to process pieces of image data that correspond to a plurality of scan lines and that are transmitted from the image data write control signal generation unit 221 in parallel, and to output a plurality of low amplitude modulation signals. Likewise, the laser driving unit 230 may include a plurality of LD driving units 232.

Figure 51:
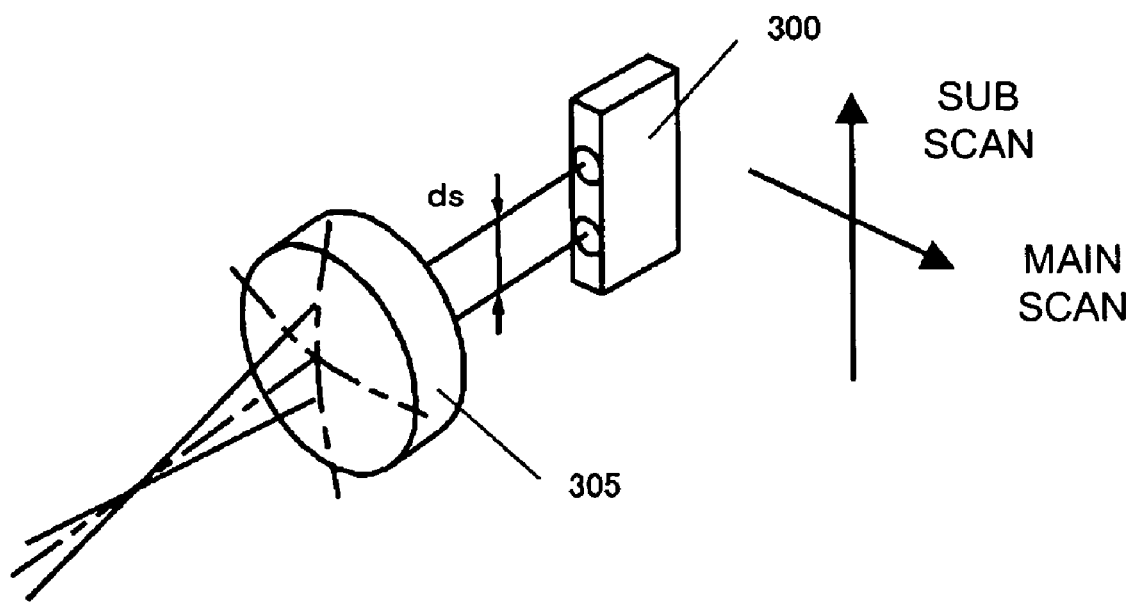
FIG. 51 is a block diagram of a semiconductor laser ray including two light emission channels.

FIG. 50 is an overall block diagram of the multi-beam scanning apparatus (multi-beam optical system), to which the laser modulation driving apparatus according to the present invention is applied, according to one embodiment of the present invention. In this embodiment, two semiconductor laser rays 300 are employed. As shown in FIG. 51, each semiconductor laser ray 300 includes two light emission sources arranged at a distance ds of, for example, 25 micrometers monolithically and arranged symmetrically in the sub-scan direction, about a light axis C of the collimator lens 305. The image processing unit 220 and the laser driving unit 230 shown in FIG. 49 are not shown in FIG. 50. However, the image processing unit 220 and the laser driving unit 230 respectively include, for example, two LD modulation signal generation units 222 and the two LD driving units 232.

With reference to FIG. 50, semiconductor laser rays 301 and 302 are arranged so as to align light axes of collimator lenses 303 and 304, and to cross emission axes thereof at a reflection point of a polygon mirror 307. A plurality of beams emitted from the respective semiconductor laser rays 301 and 302 are passed through a cylinder lens 308, and collectively scanned by the polygon mirror 307, thereby forming an image on a photoconductor 313 by an fθ lens 310, a toroidal lens 311, and a mirror 312. Each image data write control signal generation unit 221 in the image processing unit 220 includes, for example, a buffer memory (not shown). Print data (image data) corresponding to one line is stored in the buffer memory for each light emission source, and read for each face of the polygon mirror 307, thereby simultaneously recording pieces of print data (image data) corresponding to four lines through each LD modulation signal generation unit 222 in the image processing unit 220, and each LD driving unit 232 in the laser driving unit 230.

Figure 52:
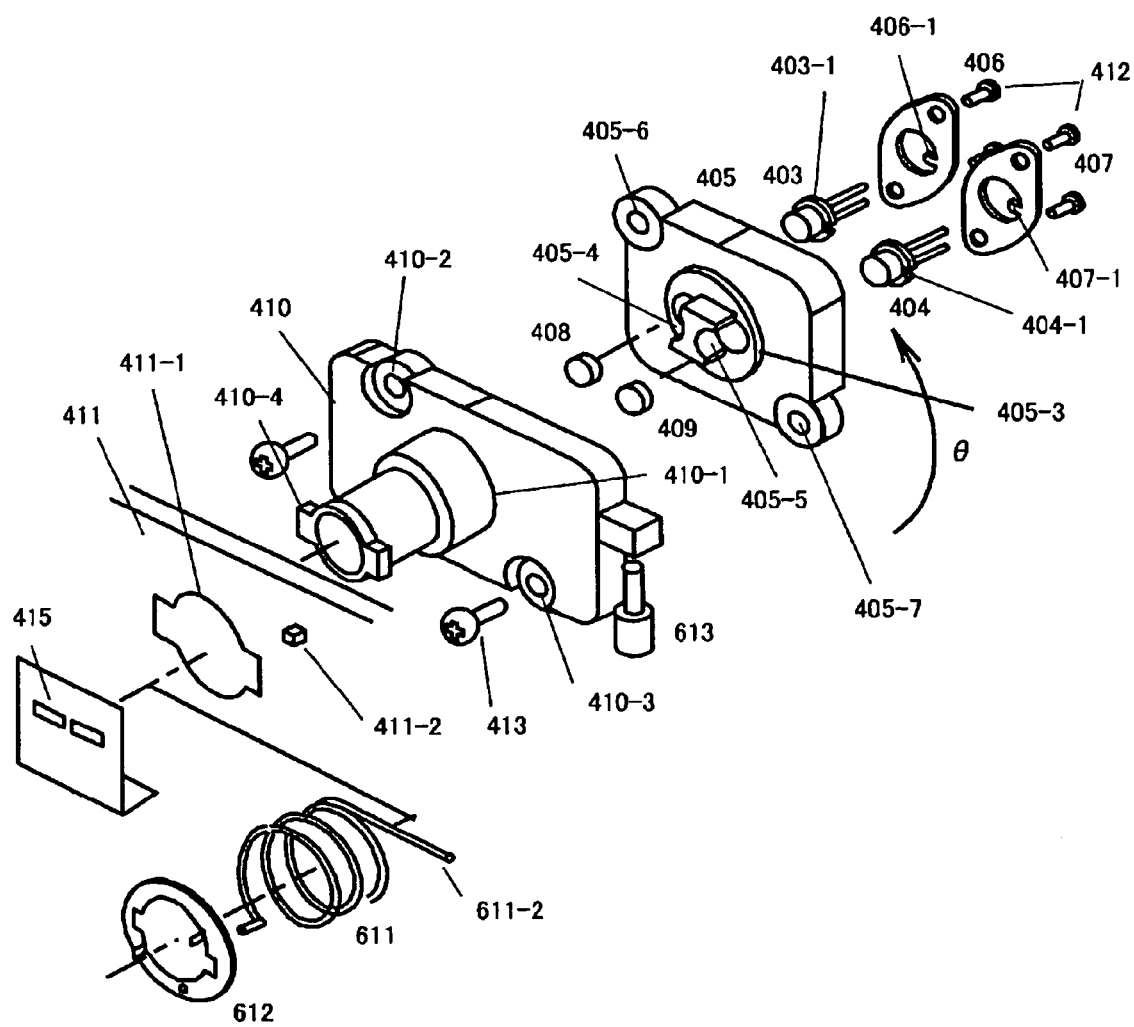
FIG. 52 is an block diagram of a light source unit of the multi-beam scanning apparatus.

FIG. 52 is a block diagram of a light source unit included in the multi-beam scanning apparatus. Cylindrical heat sink portions 403-1 and 404-1 of respective semiconductor laser rays 403 and 404 are fitted into fitting holes 405-1 and 405-2 (not shown) formed on a rear surface of a base member 405 and each slightly inclined at a predetermined angle (about 1.5 degrees in this embodiment) in the main scan direction, respectively. Protrusions 406-1 and 407-1 of pressing members 406 and 407 are aligned to notches of the heat sink portions 403-1 and 404-1, to thereby align arrangement directions of respective light sources, and fixed to the notches by screws 412 from rear surfaces of the pressing members 406 and 407. Further, collimator lenses 408 and 409 are positioned and adhesively bonded to the base member 405 by arranging outer peripheries of the respective collimator lenses 408 and 409 along semicircular attachment guide surfaces 405-4 and 405-5 of the base member 405, to thereby adjust light axis directions, so that beams emitted from emission points are transformed into parallel light fluxes.

In this embodiment, the light source unit is formed with the fitting holes 405-1 and 405-2 and the semicircular attachment guide surfaces 405-4 and 405-5 inclined so that the beams from the respective semiconductor laser rays 403 and 404 cross each other in a main scan plane.

A cylindrical engagement unit 405-3 in the base member 405 is engaged with a holder member 410, and screws 413 are fixedly screwed with screw holes 405-6 and 405-7 of the base member 405 through penetrating holes 410-2 and 410-3 of the holder member 410. The light source unit is thereby constituted.

In the light source unit, the holder member 410 is held while being closely attached to a rear side of an attachment wall 411 of an optical housing by fitting a cylindrical portion 410-1 of the holder member 410 into a reference hole 411-1 formed in the attachment wall 411, and by inserting a spring 611 into the reference hole 411-1 from a front side of the attachment wall 411 to thereby engage a stopper member 612 with a cylindrical protrusion 410-4 of the holder member 410. At this time, by hooking one end of the spring 611 on a protrusion 411-2, a rotation force about a cylindrical center that serves as a rotation axis is generated. The entire light source unit is rotated around the optical axis at angle θ by an adjustment screw 613 provided to stop the rotation force. An aperture 415 has slits formed therein to correspond to the respective semiconductor laser rays 403 and 404. The aperture 415 is attached to the optical housing so as to prescribe an emission diameter of each optical beam.

Figure 53:
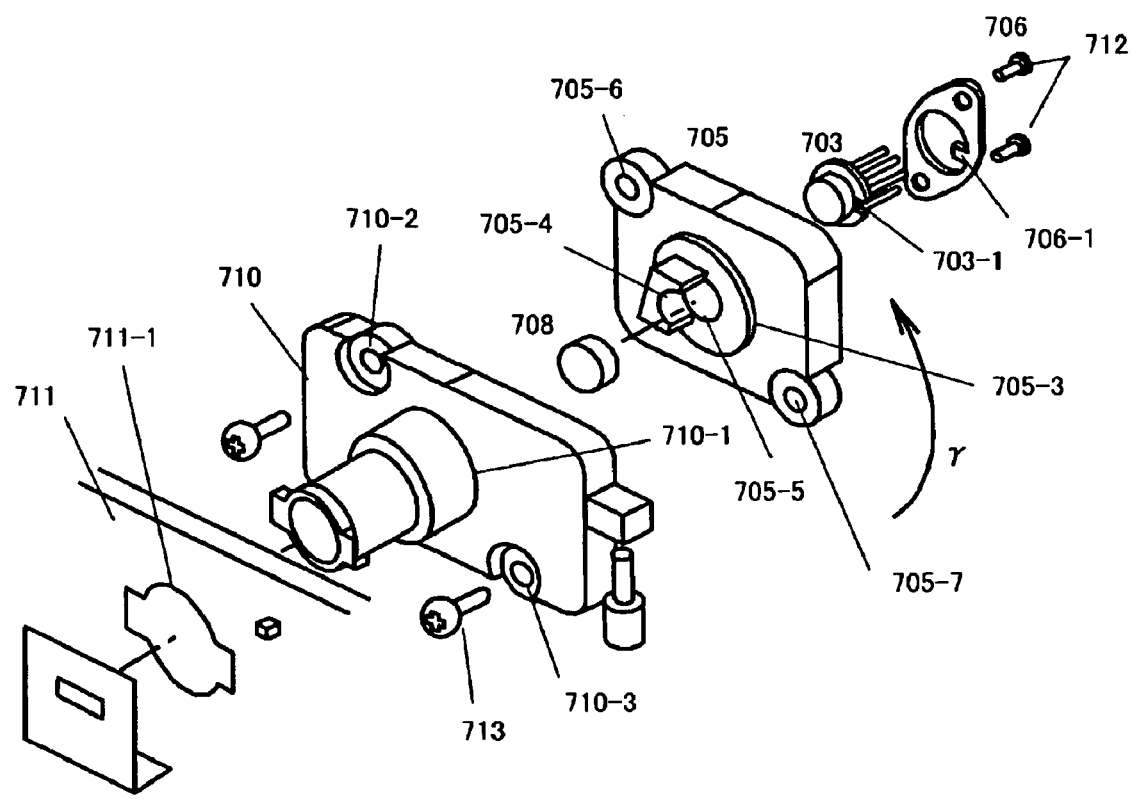
FIG. 53 is an exploded block diagram of another light source unit of the multi-beam scanning apparatus.
Figure 54:
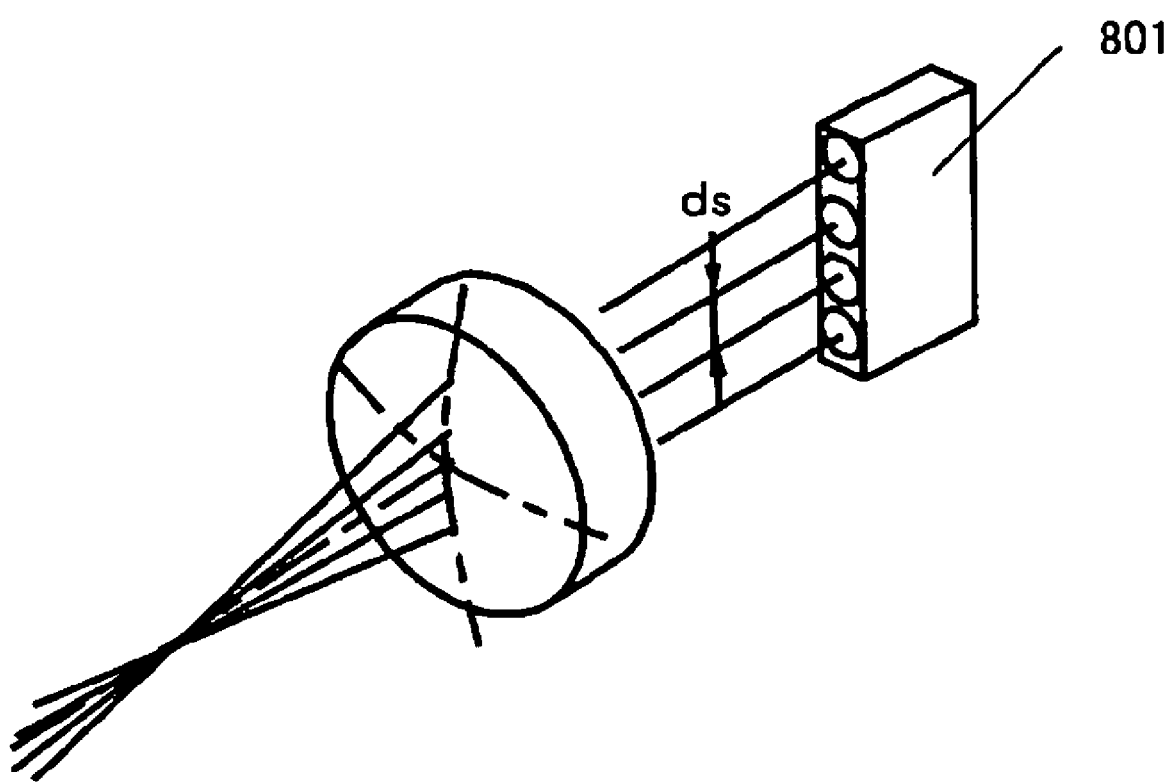
FIG. 54 is a block diagram of a semiconductor laser ray including four light emission channels.

FIG. 53 is an exploded block diagram of the light source, unit of the multi-beam scanning apparatus if a semiconductor laser ray 801 having four light emission sources (four channels) as shown in FIG. 54 is employed. Because the light source unit shown in FIG. 53 is identical in configuration to that shown in FIG. 52, the configuration will not be explained herein.

Figure 55:
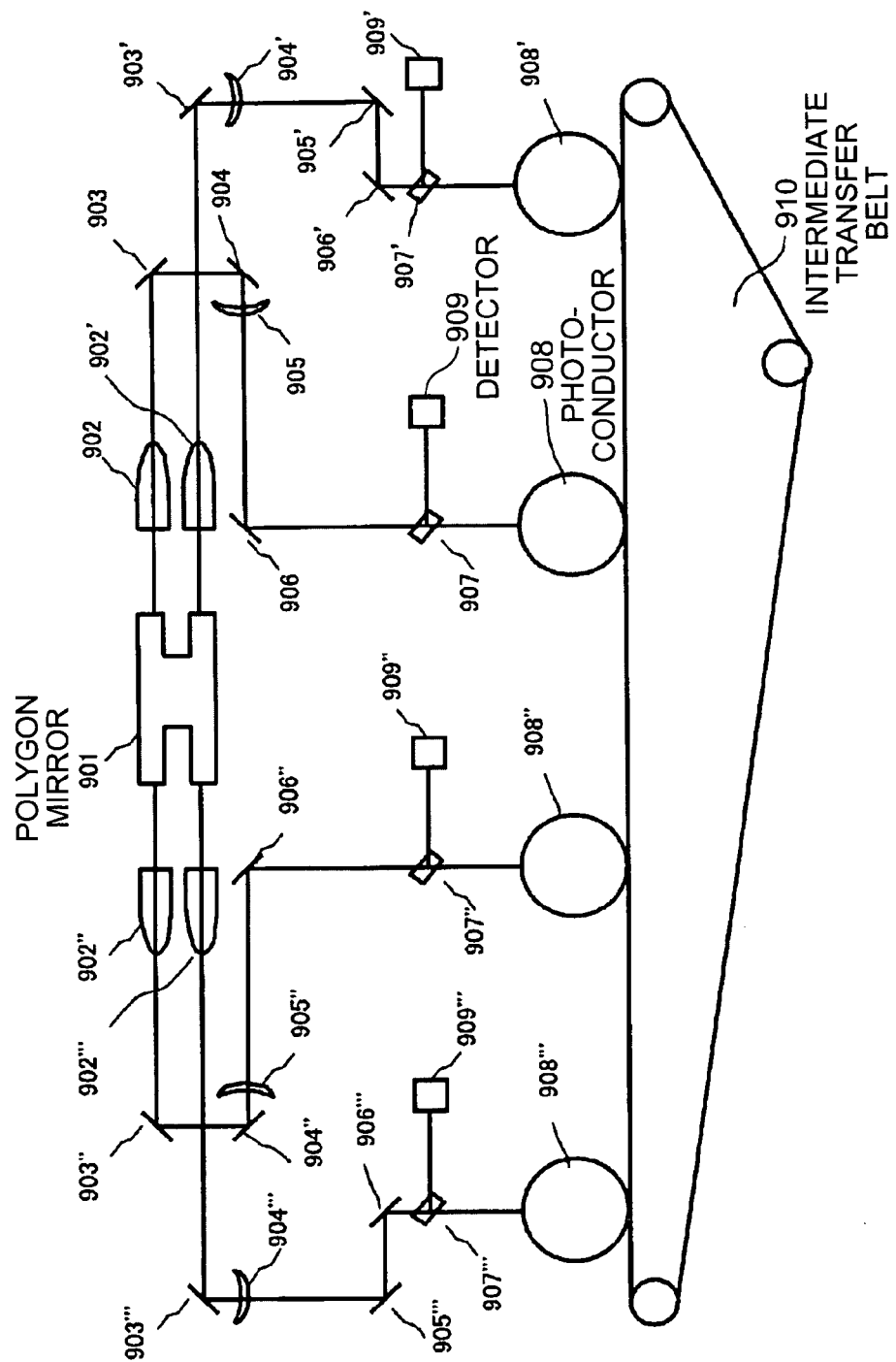
FIG. 55 is an example of a configuration of main constituent elements of a tandem color machine.

FIG. 55 is an embodiment of applying the optical scanning apparatus or the image forming apparatus explained so far to a tandem color machine, that is, a multicolor image forming apparatus including a plurality of photosensitive bodies. It is noted, however, that FIG. 55 is an example of a configuration of only a cross section of the tandem color machine in the sub scan direction related to the present invention. In FIG. 55 includes a polygon mirror 901, a scanning lens 1 902, folding mirrors 903 and 904, a scanning lens 2 905, a folding lens 906, a translucent member 907, a photoconductor 908, and a detector 909. The other optical systems include similar elements. An intermediate transfer belt 910 is also provided.

In FIG. 55, the polygon mirror 901 is formed to have two stages, and scanning optical systems are arranged vertically relative to the two stages. Further, the scanning optical systems are arranged to face each other across a deflection unit, thereby arranging the respective scanning optical systems to correspond to four scanned surfaces, respectively. Beams are guided to the respective detectors 909, 909', 909'', and 909''', by mirror provided on both sides outside of an effective angle of view. A measurement pattern image is formed on the intermediate transfer belt 910, and dot positions for respective colors are measured by a plurality of sensors arranged per scanning optical system. At this time, by performing the correction as explained so far, the dot positions can be corrected with high accuracy to correspond to a change with time.

The tandem color machine requires different photosensitive bodies corresponding to respective colors of cyan, magenta, yellow, and black. The scanning optical systems form latent images through different optical paths to correspond to the respective photosensitive bodies. Due to this, offsets of the dot positions in the main scan direction generated on the respective photosensitive bodies often exhibit different characteristics. Considering this, the optical scanning apparatus (multi-beam scanning apparatus) explained so far is applied to the tandem color machine. It is thereby possible to obtain a high-quality image in which the dot offsets have been satisfactorily corrected. Particularly in terms of the image quality, the image in which a color offset between stations is effectively reduced and which has good color reproducibility can be obtained.

For example, if a color offset of about several tens of micrometers between the stations occurs to the tandem color machine, phase shifting is performed on each pixel clock, an offset amount of which in the main scan direction exceeds ⅛ dot, to correct the offset in the main scan direction. By doing so, the dot offset can be reduced to about 2.6 micrometers (21.2 µm/8) corresponding to the ⅛ dot at a resolution of 1200 dpi (dots per inch).

According to the present invention, the semiconductor laser modulation driving apparatus is capable of accelerating the operating rate, improving the EMI characteristic, improving the noise resisting characteristic, and improving an efficiency of the LD modulation signal, and the image forming apparatus that includes the semiconductor laser modulation driving apparatus can be realized. By providing the impedance correction unit that corrects the output impedance of the LD modulation signal generation unit and the input impedance of the LD driving unit, in particular, the semiconductor laser modulation driving apparatus that can dispense with providing an external resistor and that includes an input unit and an output unit suited for a high-rate operation can be realized. Further, by constituting the impedance correction unit so that a plurality of resistors are connected in series, the semiconductor laser modulation driving apparatus that can maintain a highly accurate impedance matching while employing the resistors having large irregularities and included within the integrated circuit, and that includes the input and output units suited for the high-rate operation can be realized. Besides, by providing the impedance correction unit that includes one or a plurality of transistors as the impedance correction unit, the semiconductor laser modulation driving apparatus that can maintain the highly accurate impedance matching without the need of employing the resistors having large irregularities and included within the integrated circuit, and that includes the input and output units suited for the high-rate operation can be realized.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser modulation driving apparatus comprising:
   a semiconductor laser;
   an image generating unit that generates an image data signal including a plurality of parallel signals;
   a semiconductor laser modulation signal generating unit that receives the image data signal and generates a semiconductor laser modulation signal for modulating the semiconductor laser;
   a semiconductor laser driving unit that receives the semiconductor laser modulation signal and drives the semiconductor laser based on the semiconductor laser modulation signal; and
   an impedance correction unit that adjusts an output impedance of the semiconductor laser modulation signal generating unit to match an input impedance of the semiconductor laser driving unit, wherein
   the semiconductor laser modulation signal generating unit transmits the semiconductor laser modulation signal as a pair of small swing differential signals, to the semiconductor laser driving unit,
   the semiconductor laser modulation signal generation unit and the image generating unit are formed on a single board or an ASIC,
   the semiconductor laser driving unit is formed on a different board that is different from said single board or on a different ASIC that is different from said ASIC on which the semiconductor laser modulation signal generation unit and the image generating unit are formed,
   the semiconductor laser driving unit is arranged to be proximate to the semiconductor laser, and
   the semiconductor laser modulation signal generating unit has a first supply voltage, and the semiconductor laser driving unit has a second supply voltage higher than the first supply voltage.

2. The semiconductor laser modulation driving apparatus according to claim 1, wherein
   the impedance correction unit includes a plurality of resistors connected in series.

3. The semiconductor laser modulation driving apparatus according to claim 2, further comprising:
   a switch corresponding to each of the resistors, the switch being connected in parallel to the corresponding resistor.

4. The semiconductor laser modulation driving apparatus according to claim 2, wherein
   the resistors have different resistances.

5. The semiconductor laser modulation driving apparatus according to claim 2, further comprising:
   a switch corresponding to each of the resistors, wherein a first end of the switch is connected to the corresponding resistor, and a second end of the switch is connected to any one of a ground, a power supply, and an input output terminal.

6. The semiconductor laser modulation driving apparatus according to claim 2, wherein
   both ends of each of the resistors are provided as external pins, outside of an integrated circuit of the impedance correction unit.

7. The semiconductor laser modulation driving apparatus according to claim 2, wherein both ends of each of the resistors are short-circuited by laser shorting.

8. The semiconductor laser modulation driving apparatus according to claim 1, wherein
the impedance correction unit includes at least one transistor.

9. The semiconductor laser modulation driving apparatus according to claim 1, wherein
the impedance correction unit includes a plurality of transistors connected in parallel, and executes impedance correction by turning on a selected transistor.

10. The semiconductor laser modulation driving apparatus according to claim 9, wherein
each of the transistors differs in size.

11. The semiconductor laser modulation driving apparatus according to claim 1, wherein
the impedance correction unit includes a plurality of transistors connected in parallel and in series, and executes impedance correction by turning on a selected transistor.

12. The semiconductor laser modulation driving apparatus according to claim 1, wherein
the impedance correction unit includes one transistor,
a gate of the transistor is provided as an external pin,
a voltage on an outside of the impedance correction unit is adjusted to change an ON resistance of the transistor, and
the impedance correction unit executes impedance correction based on the ON resistance of the transistor.

13. The semiconductor laser modulation driving apparatus according to claim 1, wherein
the impedance correction unit includes a resistor and a transistor connected in series,
a gate of the transistor is provided as an external pin,
a voltage on an outside of the impedance correction unit is adjusted to change an ON resistance of the transistor; and
the impedance correction unit executes impedance correction based on a combined resistance of the ON resistance of the transistor and a resistance of the resistor.

14. An image forming apparatus for forming an image on a scan target medium by scanning the scan target medium, comprising:
at least one semiconductor laser light source;
a deflecting unit that deflects a light flux emitted from the light source;
a light guiding unit that guides the light flux deflected, to the scan target medium; and
a semiconductor laser modulation driving apparatus that includes
a semiconductor laser;
an image generating unit that generates an image receives image data signal including a plurality of parallel signals,
a semiconductor laser modulation signal generating unit that receives the image data signal and generates a semiconductor laser modulation signal for modulating the semiconductor laser;
a semiconductor laser driving unit that drives the semiconductor laser based on the semiconductor laser modulation signal; and
an impedance correction unit that adjusts an output impedance of the semiconductor laser modulation signal generating unit to match an input impedance of the semiconductor laser driving unit, wherein
the semiconductor laser modulation signal generating unit transmits the semiconductor laser modulation signal as a pair of small swing differential signals, to the semiconductor laser driving unit,
the semiconductor laser modulation signal generation unit and the image generating unit are formed on a single board or an ASIC,
the semiconductor laser driving unit is formed on a different board that is different from said single board or on a different ASIC that is different from said ASIC on which the semiconductor laser modulation signal generation unit and the image generating unit are formed,
the semiconductor laser driving unit is arranged to be proximate to the semiconductor laser, and
the semiconductor laser modulation signal generating unit has a first supply voltage, and the semiconductor laser driving unit has a second supply voltage higher than the first supply voltage.

15. The image forming apparatus according to claim 14, wherein
the image forming apparatus is a tandem color image forming apparatus including a plurality of scan target media.

16. The semiconductor laser modulation driving apparatus according to claim 1, wherein
the semiconductor laser modulation signal generating unit has a small swing differential signal output circuit configured to output said pair of small swing differential signals,
the semiconductor laser driving unit has a small swing differential signal input circuit configured to receive said pair of small swing differential signals,
the pair of small swing differential signals swinging between a predetermined high voltage and a predetermined low voltage, wherein
the predetermined high voltage is less than the first supply voltage, and
the predetermined low voltage is more than a ground voltage and less than the predetermined high voltage.

17. The semiconductor laser modulation driving apparatus according to claim 16, wherein the small swing differential signal output circuit has an output-stage circuit configured by a first logic, and the small swing differential signal input circuit is configured by a second logic different from the first logic.

18. The semiconductor laser modulation driving apparatus according to claim 17, wherein the first logic comprises at least one of a current mode logic or an emitter coupled logic.

19. The semiconductor laser modulation driving apparatus according to claim 17, wherein the second logic utilizes differential signaling by way of a pair of transistors.

* * * * *